(12) United States Patent
Yamazaki et al.

(10) Patent No.: US 7,947,981 B2
(45) Date of Patent: May 24, 2011

(54) DISPLAY DEVICE

(75) Inventors: Shunpei Yamazaki, Tokyo (JP); Ikuko Kawamata, Kanagawa (JP); Yasuyuki Arai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 494 days.

(21) Appl. No.: 12/013,796

(22) Filed: Jan. 14, 2008

(65) Prior Publication Data

US 2008/0179597 A1 Jul. 31, 2008

(30) Foreign Application Priority Data

Jan. 30, 2007 (JP) ................................. 2007-019344

(51) Int. Cl.
*H01L 29/04* (2006.01)
(52) U.S. Cl. ...... 257/59; 257/72; 257/258; 257/E51.005
(58) Field of Classification Search .................. 257/59, 257/72, 258, E51.005
See application file for complete search history.

(56) References Cited

U.S. PATENT DOCUMENTS

| | | | |
|---|---|---|---|
| 5,574,292 A | 11/1996 | Takahashi et al. |
| 5,652,453 A | 7/1997 | Iwamatsu et al. |
| 5,905,286 A | 5/1999 | Iwamatsu et al. |
| 6,030,873 A | 2/2000 | Iwamatsu et al. |
| 6,144,082 A | 11/2000 | Yamazaki et al. |
| 6,222,234 B1 | 4/2001 | Imai |
| 6,278,131 B1 | 8/2001 | Yamazaki et al. |
| 6,316,787 B1 | 11/2001 | Ohtani |
| 6,337,232 B1 | 1/2002 | Kusumoto et al. |
| 6,472,684 B1 | 10/2002 | Yamazaki et al. |
| 6,555,422 B1 | 4/2003 | Yamazaki et al. |
| 6,593,592 B1 | 7/2003 | Yamazaki et al. |
| 6,709,901 B1 | 3/2004 | Yamazaki et al. |
| 6,900,464 B2 | 5/2005 | Doi et al. |
| 7,038,283 B2 | 5/2006 | Yanai et al. |
| 7,045,398 B2 | 5/2006 | Yasukawa |
| 7,189,636 B2 | 3/2007 | Ichinose et al. |
| 7,652,321 B2 | 1/2010 | Yamaguchi et al. |
| 7,692,194 B2 | 4/2010 | Yamazaki et al. |
| 2002/0113268 A1 | 8/2002 | Koyama et al. |
| 2008/0128808 A1 | 6/2008 | Yamazaki et al. |

FOREIGN PATENT DOCUMENTS

| | | |
|---|---|---|
| JP | 61-048975 | 3/1986 |
| JP | 09-027624 | 1/1997 |
| JP | 2003-289079 | 10/2003 |

*Primary Examiner* — Tan N Tran
(74) *Attorney, Agent, or Firm* — Nixon Peabody LLP; Jeffrey L. Costellia

(57) ABSTRACT

It is an object to provide a display device including a thin film transistor which can operate at high speed and is driven at a low voltage in a drive circuit region, and a thin film transistor having high voltage-resistance and high reliability in a pixel region. Accordingly, it is an object to provide a high reliable display device which consumes less power. A display device including a pixel region and a drive circuit region over a substrate having an insulating surface is provided. A thin film transistor is provided in each of the pixel region and the drive circuit region. A channel formation region in a semiconductor layer of the thin film transistor provided in the drive circuit region is formed to be locally thin, and the thickness of the channel formation region is smaller than that in the pixel region.

40 Claims, 30 Drawing Sheets

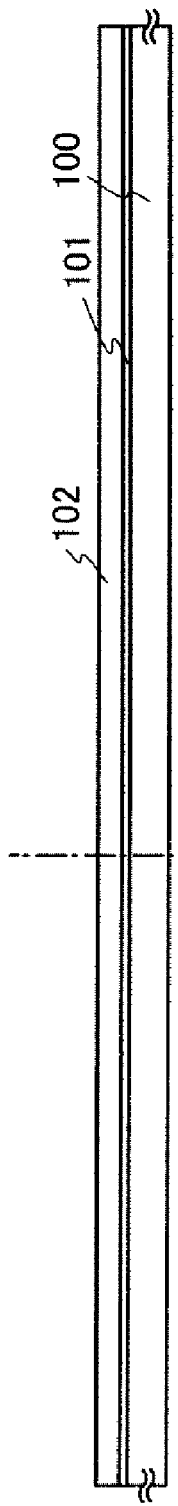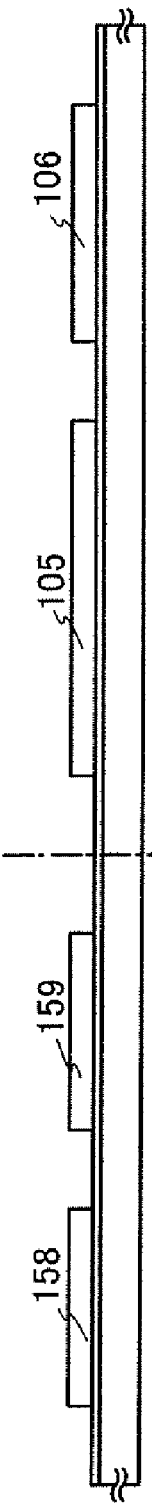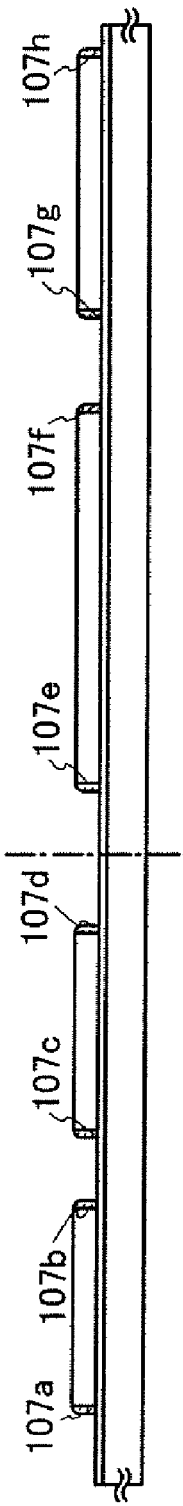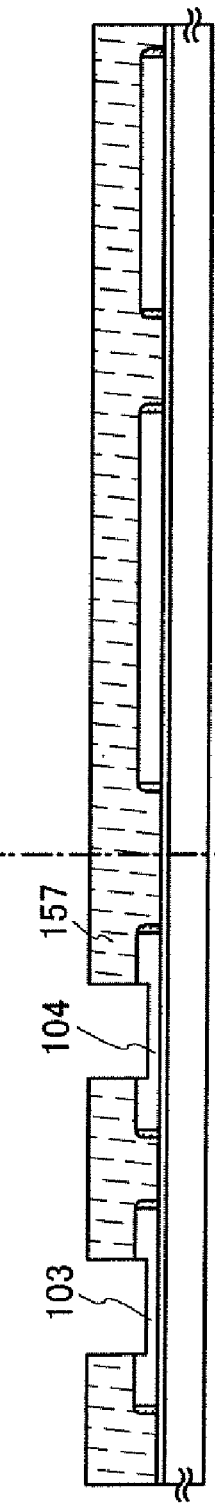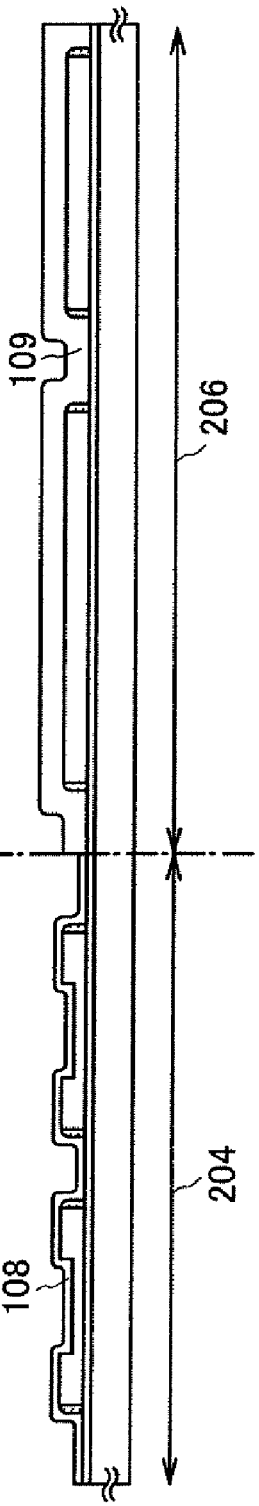

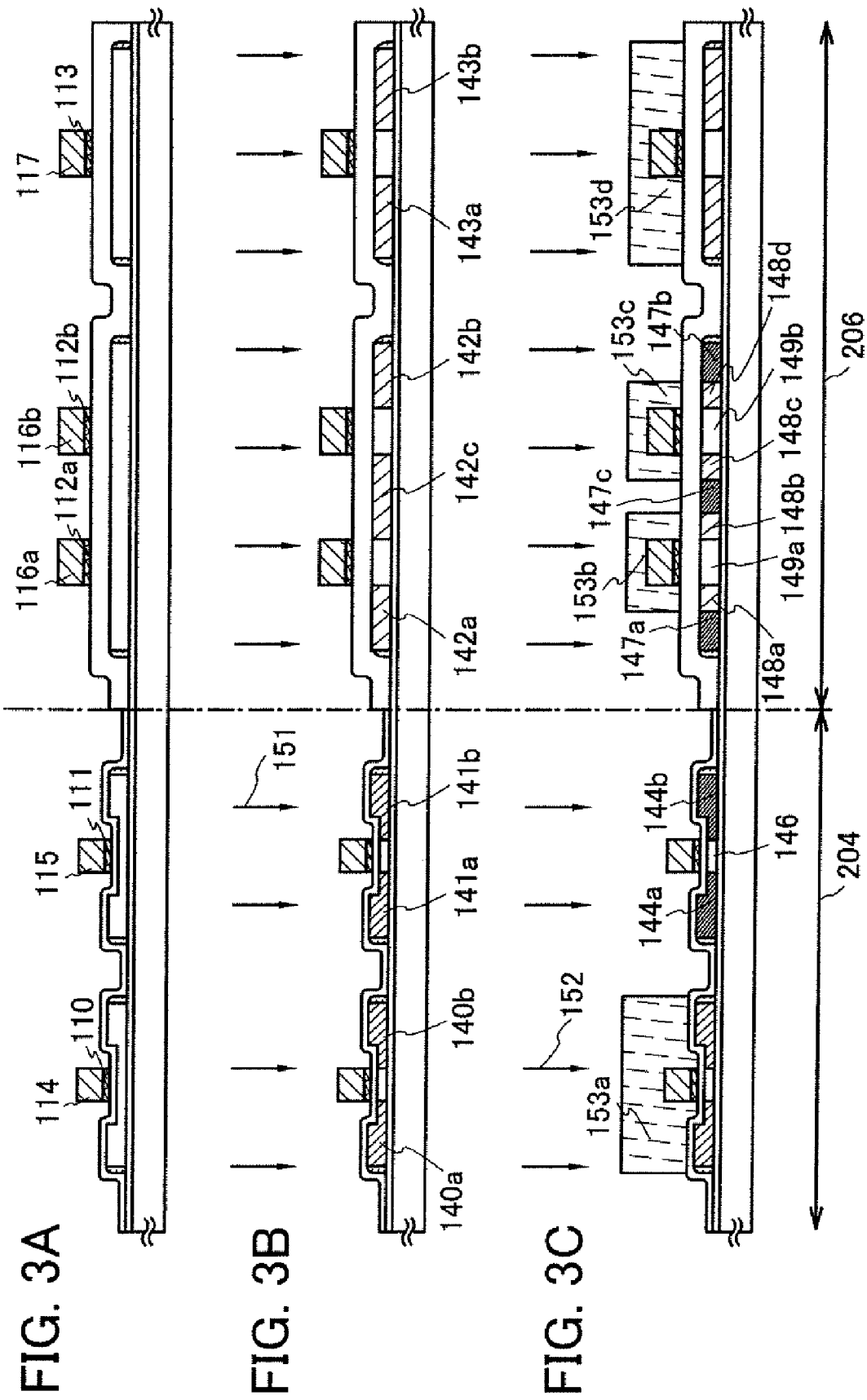

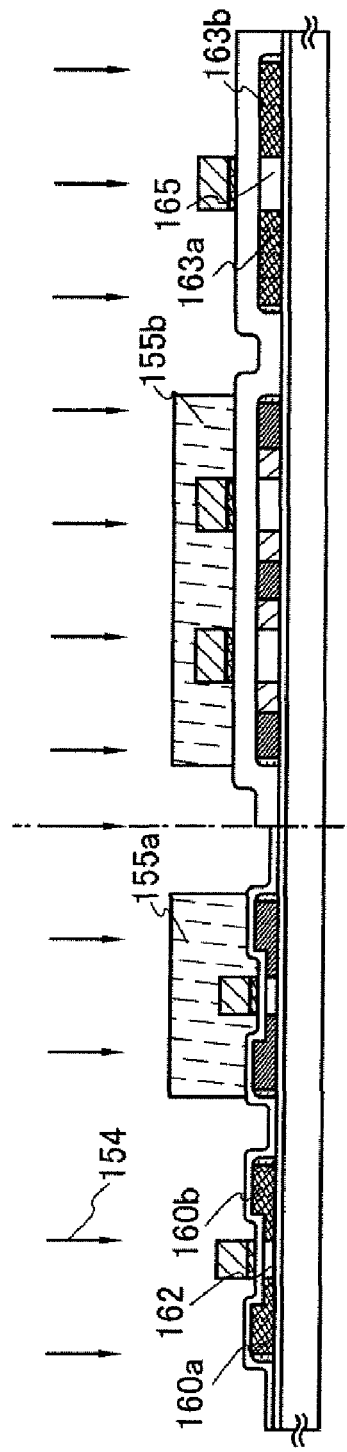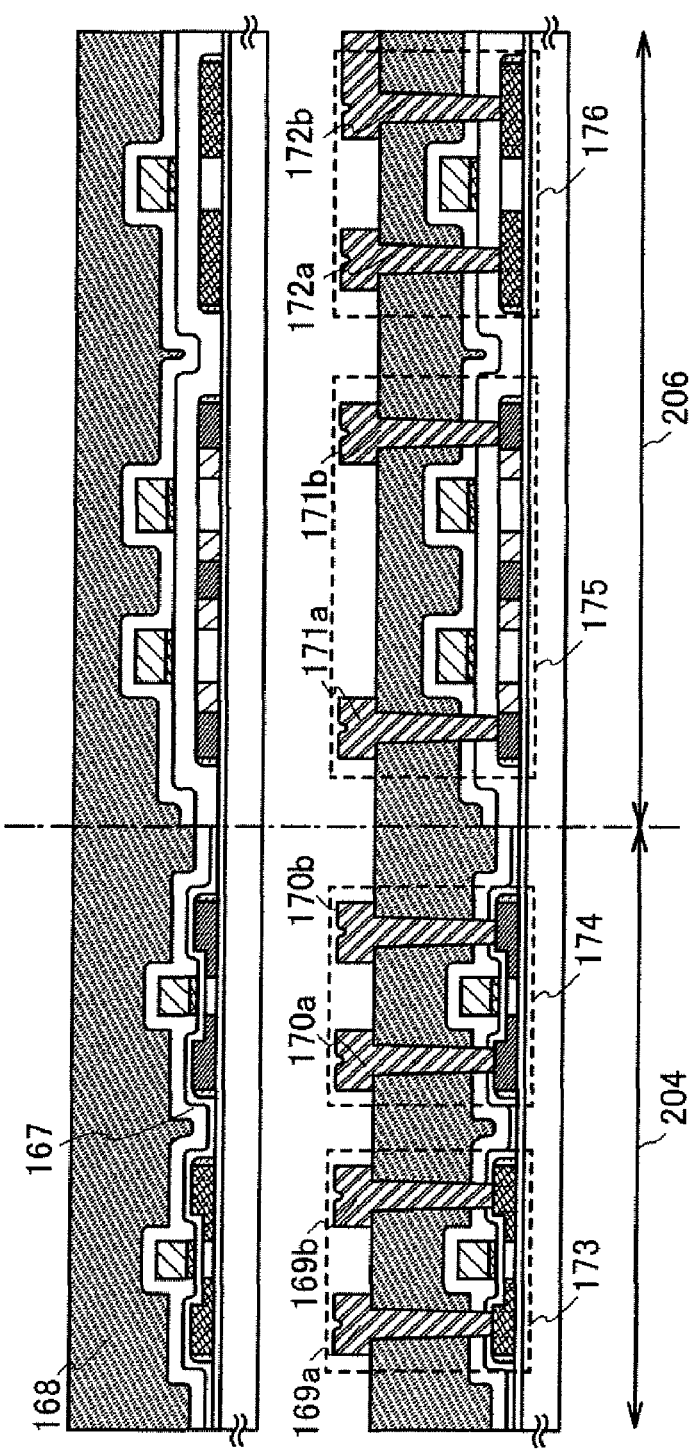

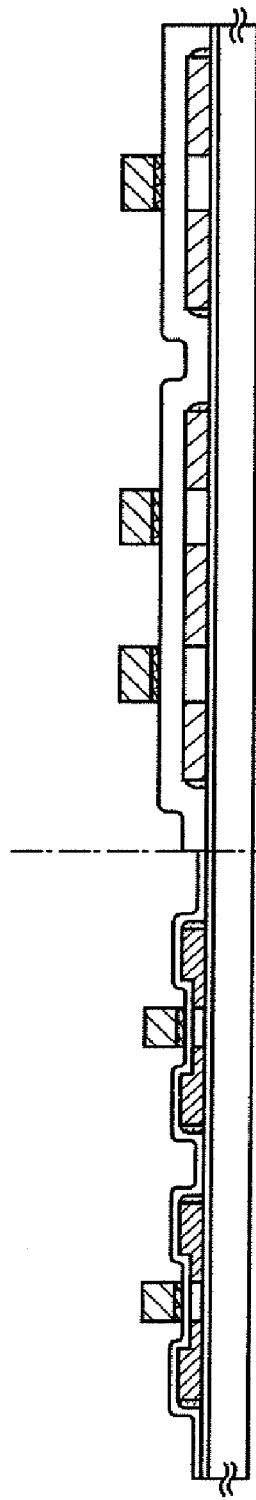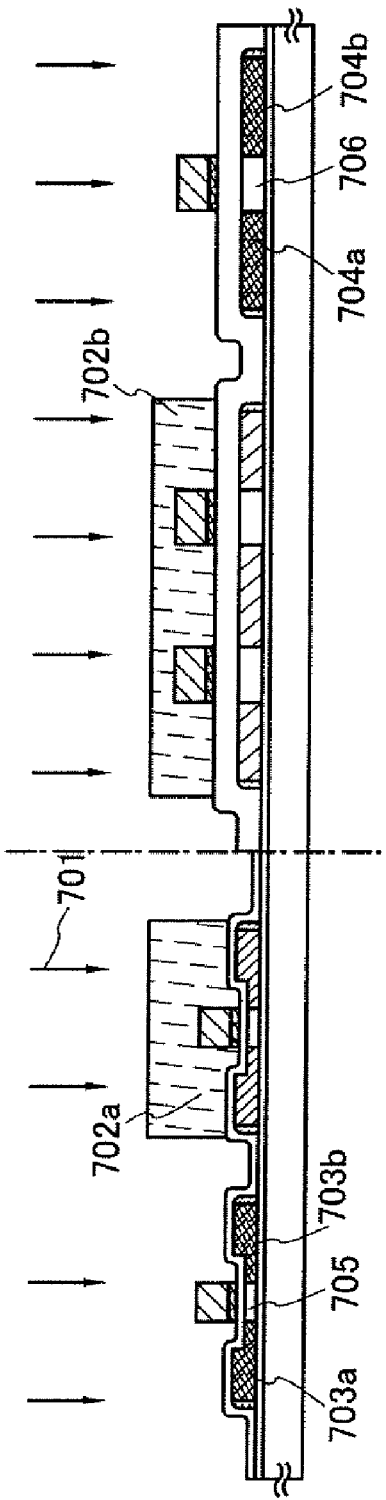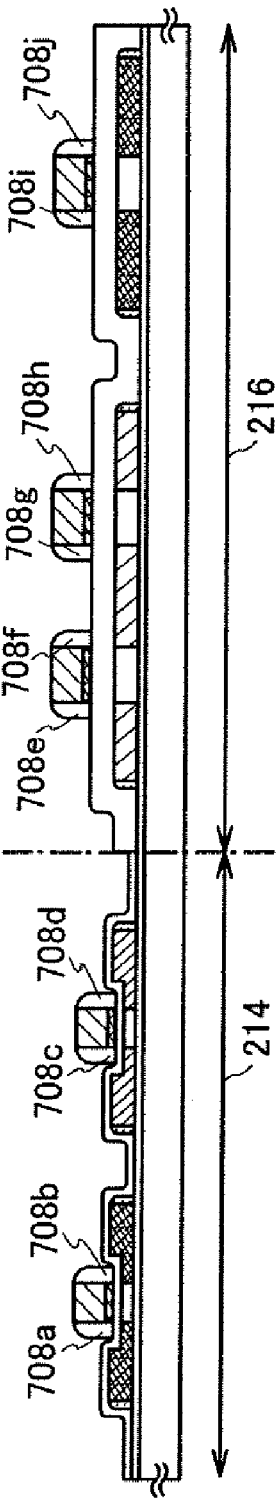

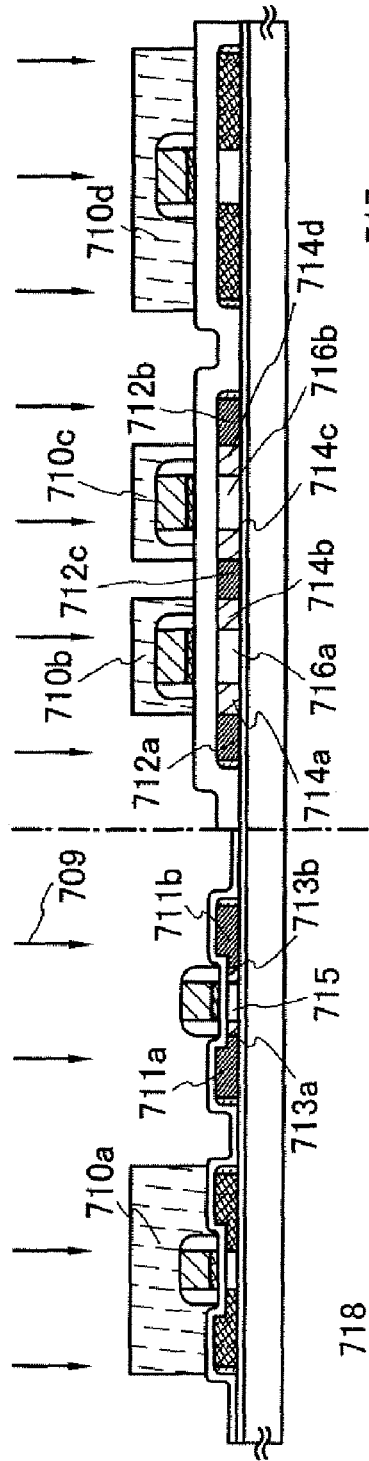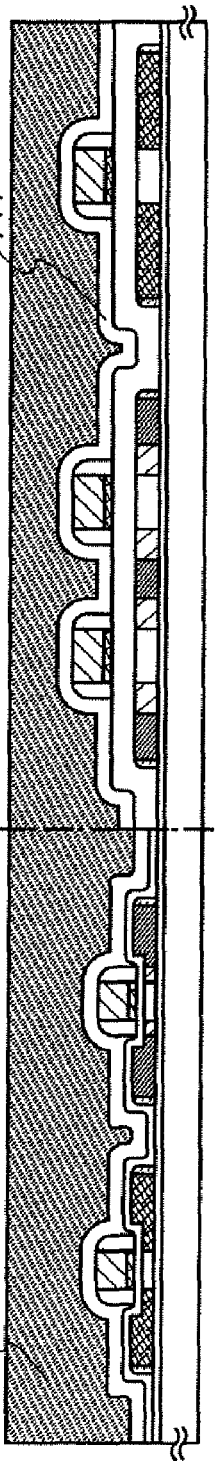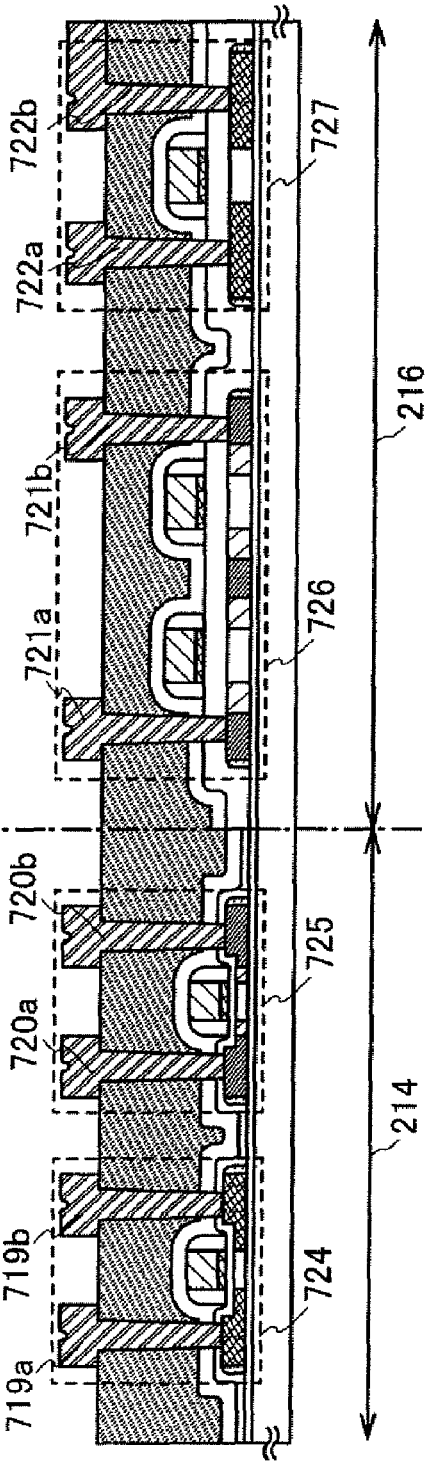

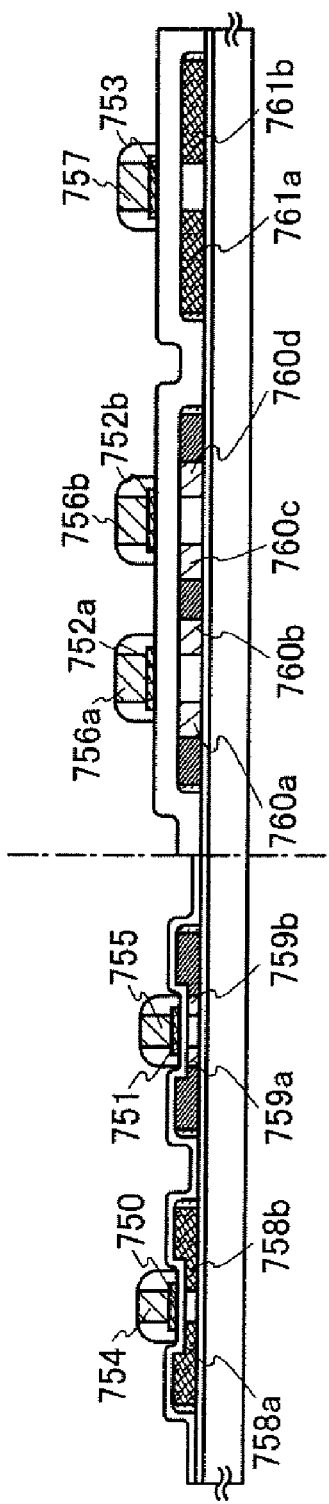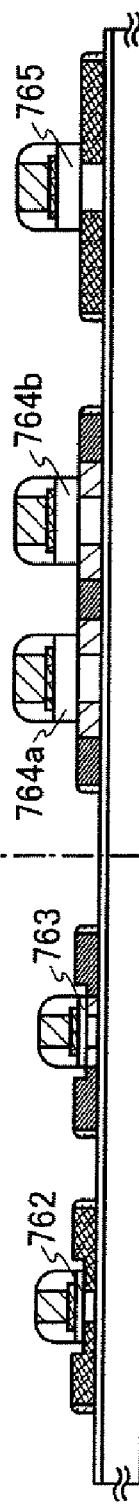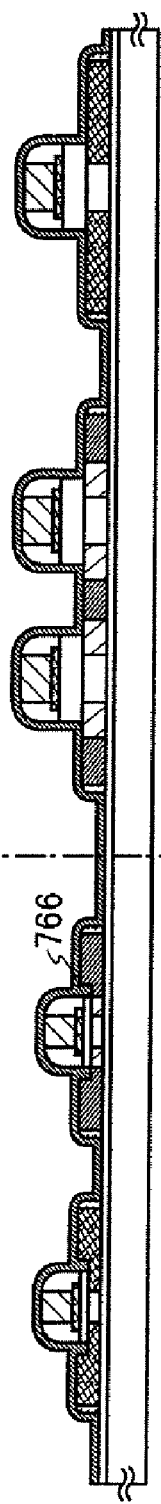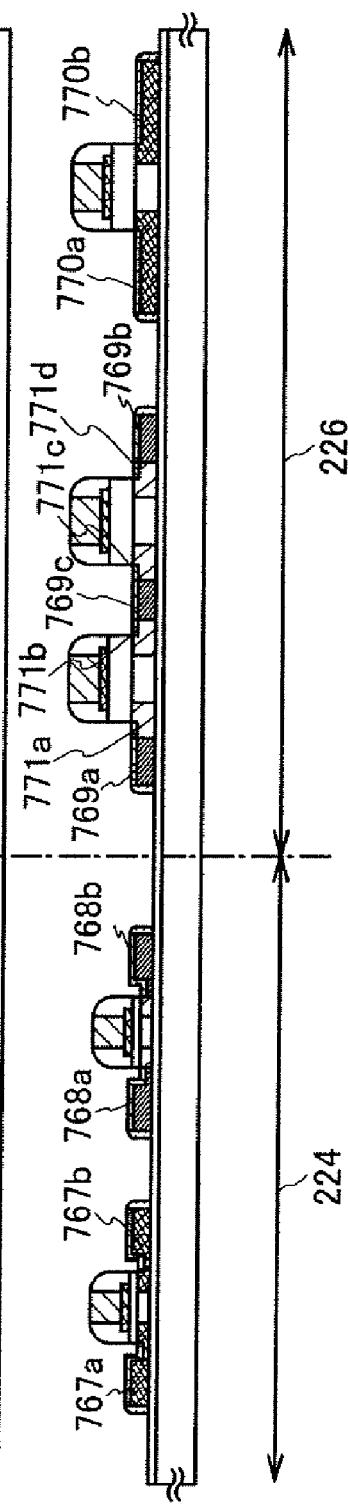

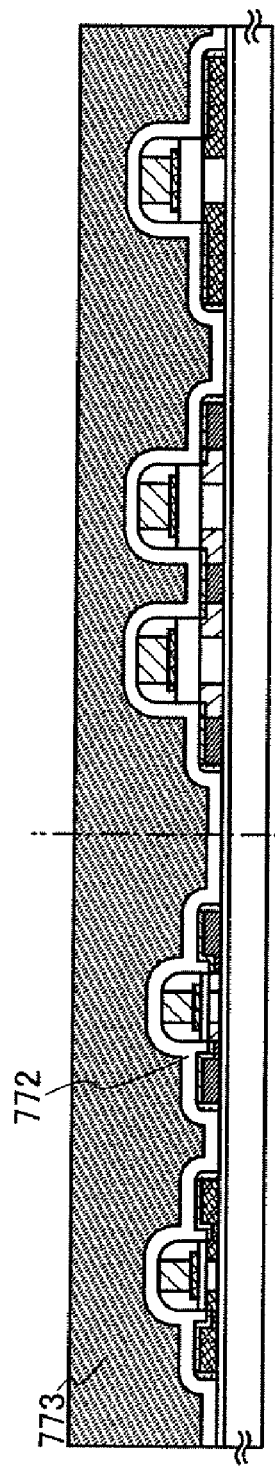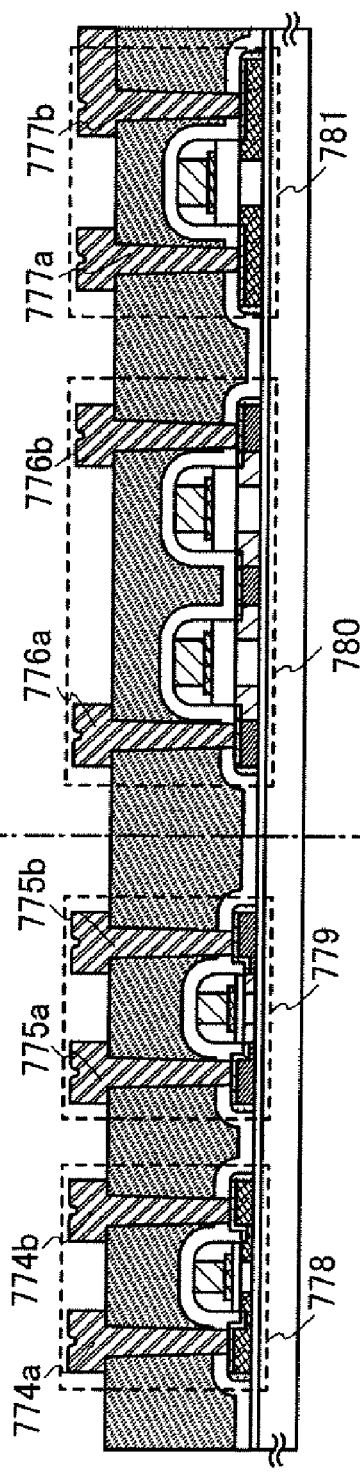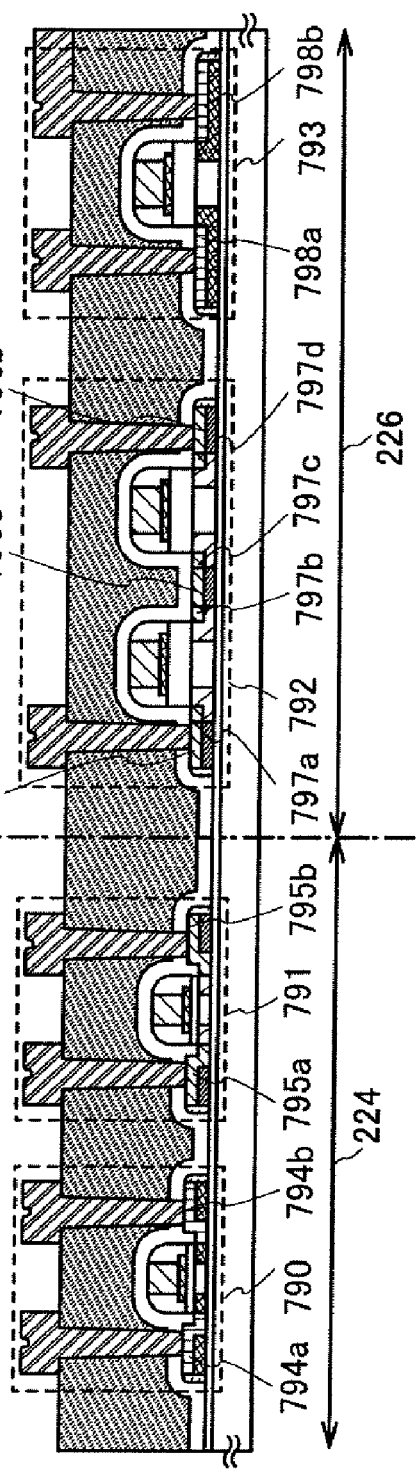

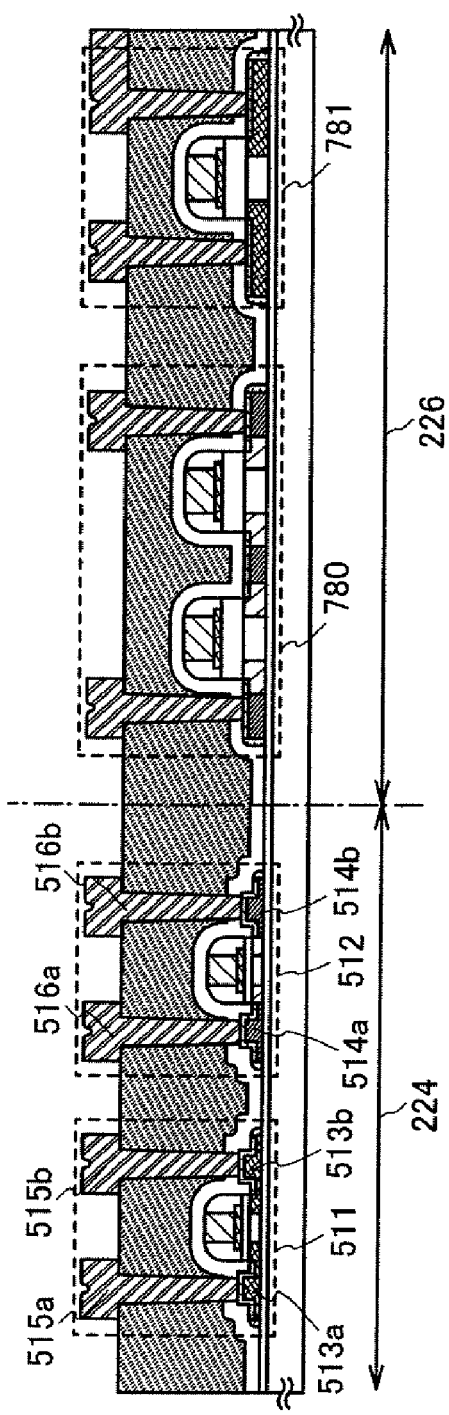
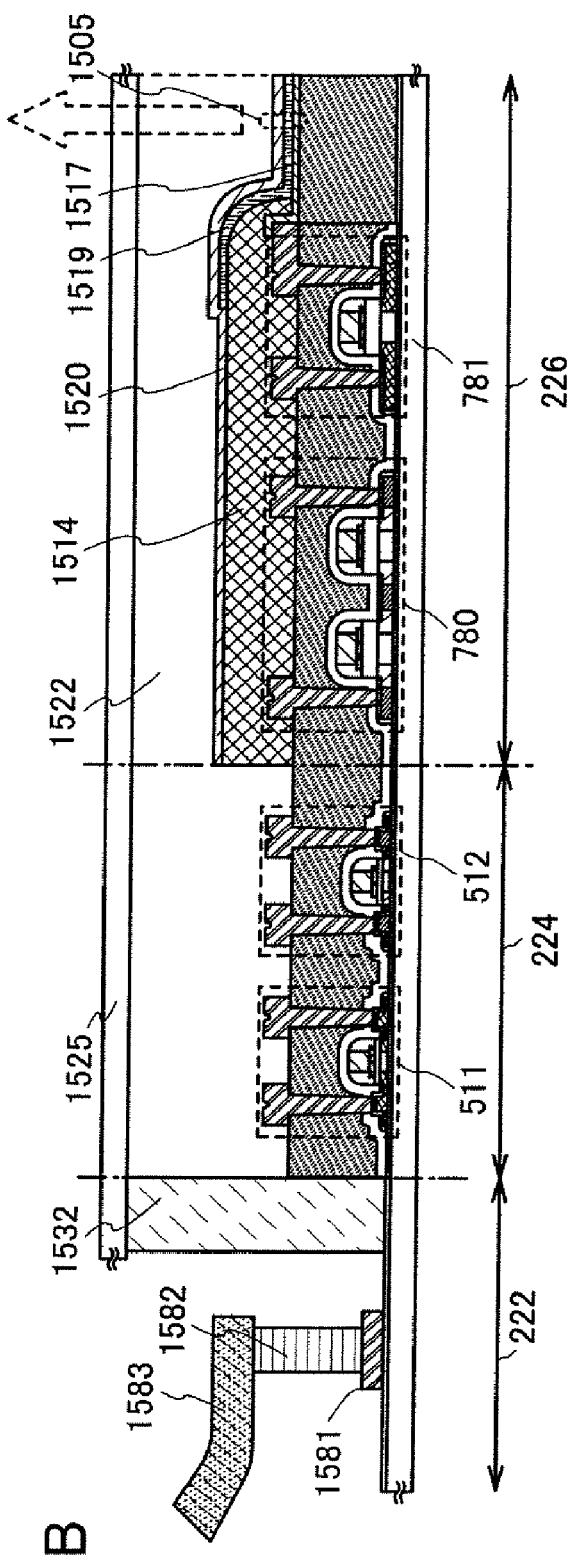
FIG. 28A
FIG. 28B

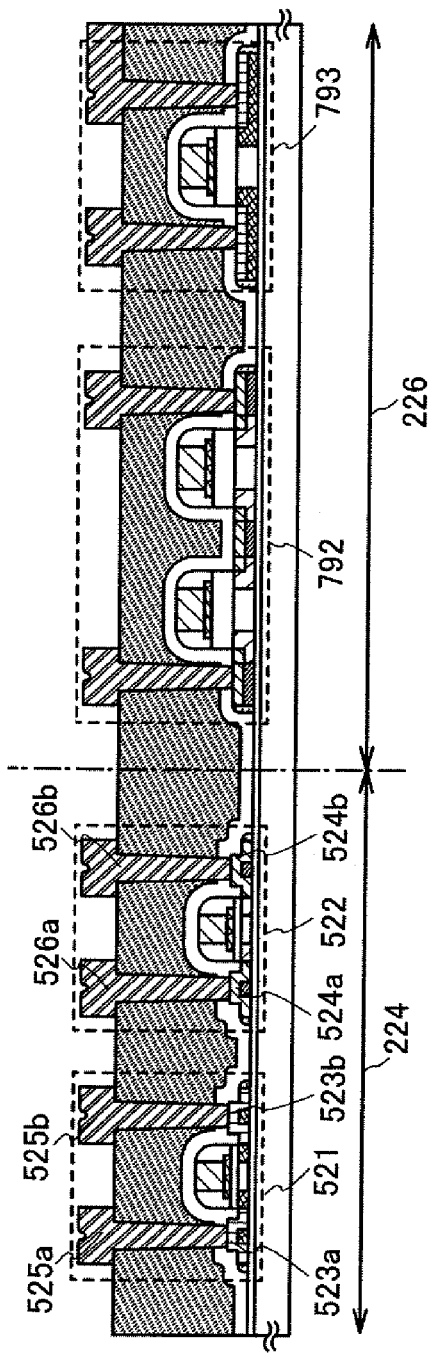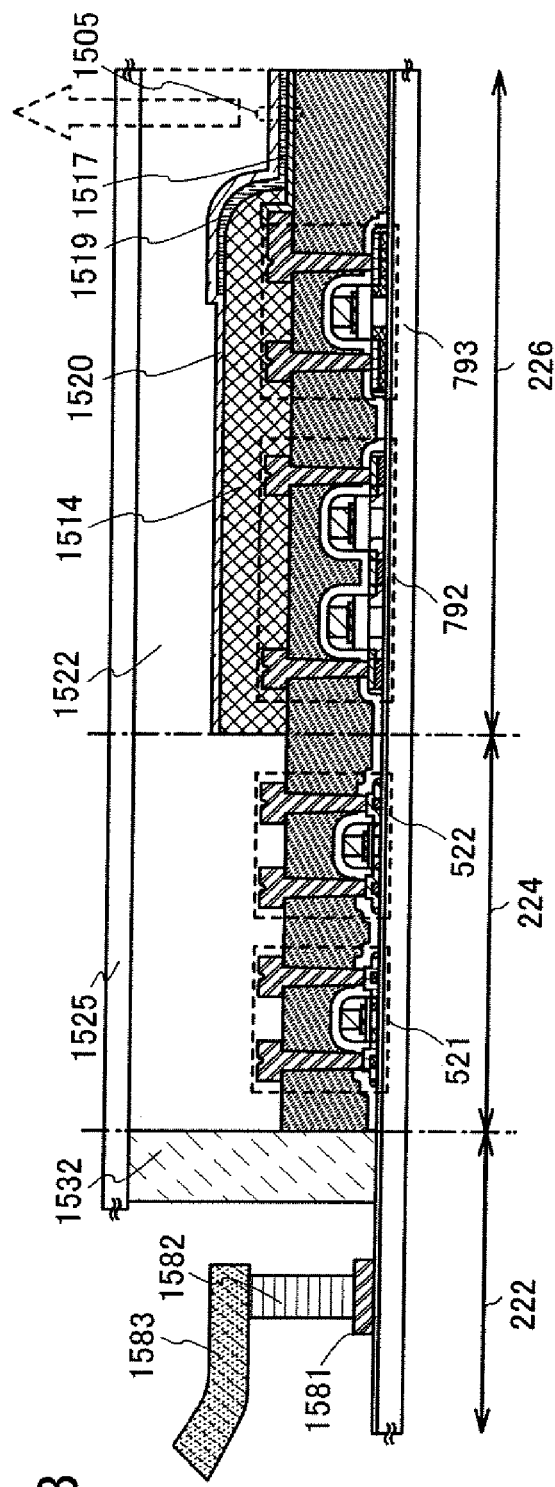

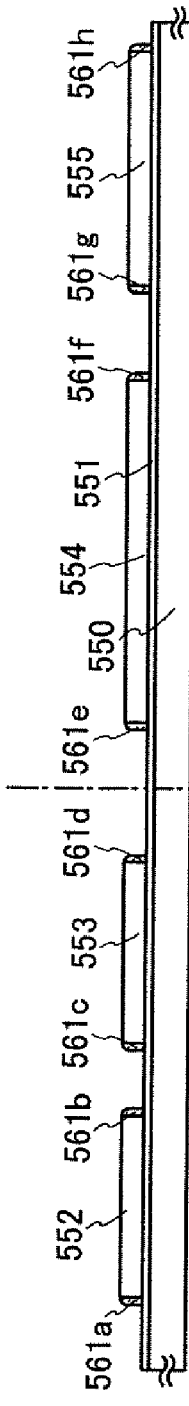
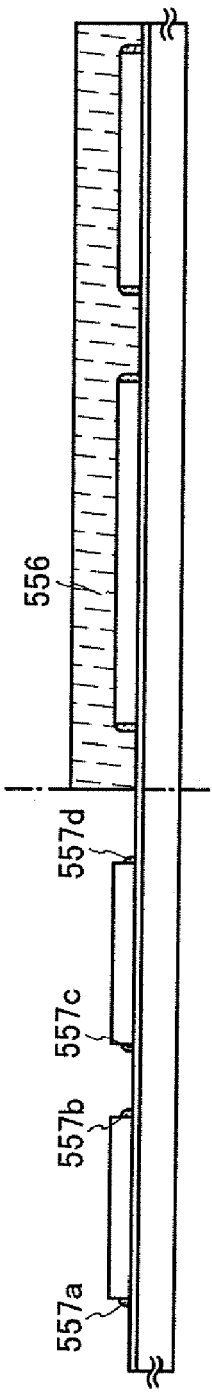
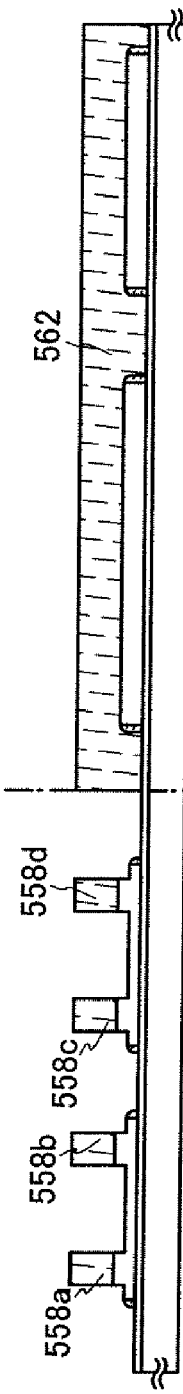
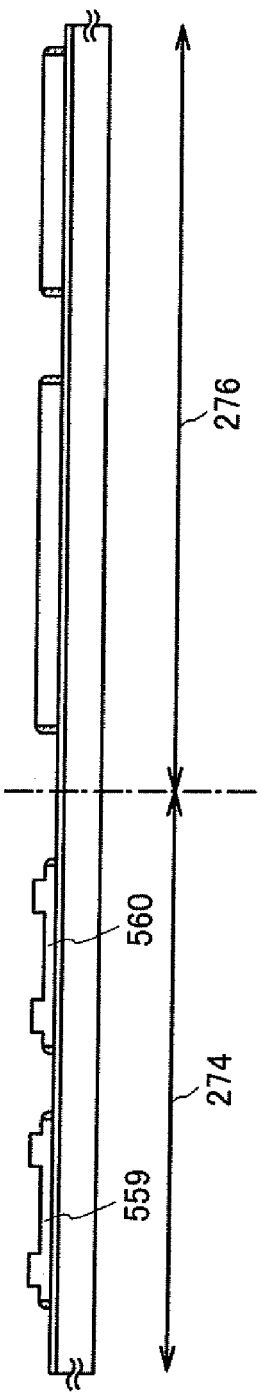

DISPLAY DEVICE

BACKGROUND OF THE INVENTION

1. Field of the Invention

The present invention relates to a display device including a transistor.

2. Description of the Related Art

Required characteristics of a thin film transistor used for a display device vary according to an object or function of the display device. It is important to control the characteristics of the thin film transistor so as to meet the requirement, and a technology for manufacturing thin film transistors to have characteristics meeting an intended purpose has been researched (for example, refer to Reference 1: Japanese Published Patent Application No. H9-27624).

In Reference 1, a thin film transistor including an impurity region with an LDD (lightly doped drain) structure is formed using a sidewall to decrease leakage current when the thin film transistor is in an off-state.

SUMMARY OF THE INVENTION

In particular, in a display device in which a pixel region and a drive circuit region are provided over one substrate, with regard to thin film transistors which are provided in the pixel region and the drive circuit region, required electric characteristics or functions vary according to an intended purpose. Therefore, it is necessary to make a thin film transistor having a required function or electric characteristic.

An object of the present invention is to provide a display device including a thin film transistor which can operate at high speed and is driven at a low voltage in a drive circuit region, and a thin film transistor having high voltage-resistance and high reliability in a pixel region. Accordingly, it is an object of the present invention to provide a highly reliable display device which consumes less power.

The display device of the present invention is characterized in that: it includes thin film transistors in each of the pixel region and the drive circuit region; a channel formation region in a semiconductor layer of the thin film transistor provided in the drive circuit region is formed to be locally thin; and the thickness of the channel formation region which is formed to be thin is smaller than that of a channel formation region in a semiconductor layer of the thin film transistor provided in the pixel region. In the thin film transistor in the drive circuit region, because the channel formation region is formed to be locally thin, regions of source and drain regions which are in contact with source and drain electrode layers are not formed to be thin and thus are thicker than the channel formation region. Therefore, it is preferable that the thickness of a gate insulating layer of the thin film transistor provided in the drive circuit region also be smaller than that of a gate insulating layer of the thin film transistor provided in the pixel region.

In the display device of the present invention, the thickness of the channel formation region in the semiconductor layer of the thin film transistor provided in the drive circuit region may be 5 to 30 nm, inclusive, more preferably, 10 to 20 mm, inclusive. Meanwhile, the thickness of the source region and drain region of the semiconductor layer of the thin film transistor provided in the drive circuit region and the semiconductor layer (including the source region, drain region, and channel formation region) of the thin film transistor provided in the pixel region may be 25 to 100 nm, inclusive, more preferably, 50 to 60 nm, inclusive.

A feature of the present invention is that in the semiconductor layer of the thin film transistor provided in the drive circuit region, the channel formation region is formed to be locally thin (the thickness is preferably 5 to 30 nm, inclusive, more preferably, 10 to 20 nm, inclusive), and the region of the source region connected to the source electrode layer and the region of the drain region connected to the drain electrode layer are not formed to be thin (the thickness is preferably 25 to 100 nm, inclusive, more preferably, 50 to 60 nm, inclusive). Accordingly, in the semiconductor layer, part of the source region and drain region, a low-concentration impurity region which can be provided between the channel formation region and the source and drain regions, or the like, which are not included in the channel formation region, may also be formed to be thin.

With regard to the display device of the present invention, the thickness of the gate insulating layer of the thin film transistor provided in the drive circuit region may be 1 to 10 nm, inclusive, more preferably, about 5 nm. Meanwhile, the thickness of the gate insulating layer of the thin film transistor provided in the pixel region may be 50 to 150 nm, inclusive, more preferably, 60 to 80 nm, inclusive.

It is preferable to use a crystalline semiconductor layer for the semiconductor layer, and a crystalline semiconductor layer which is formed by crystallizing an amorphous semiconductor layer by heat or light, or a single crystalline semiconductor layer may be used. For the semiconductor layer, silicon can be used.

By forming the channel formation region in the semiconductor layer (or further, also the gate insulating layer) to be locally thin, the thin film transistor provided in the drive circuit region can be miniaturized, so that the area of the drive circuit region can be reduced; consequently, a narrow frame, a high-speed operation, and a low-drive voltage can be achieved. Accordingly, the display device can achieve low power consumption.

Further, in the thin film transistor provided in the drive circuit region, because the channel formation region is formed to be locally thin, the regions of the source and drain regions which are in contact with the source and drain electrode layers are not formed to be thin and thus are thicker than the channel formation region. Accordingly, in forming openings (contact holes) which expose the source and drain regions, entire removal of the semiconductor layer around the openings can be prevented, and increase in contact resistance (between the semiconductor layer and electrode layers) can also be prevented. Consequently, decrease in yield can be prevented in a manufacturing process, and high performance can be realized in a semiconductor device to be completed.

Meanwhile, the thin film transistor provided in the pixel region can be high voltage-resistant and highly reliable by keeping the semiconductor layer (or further, also the gate insulating layer) thicker than the semiconductor layer (and the gate insulating layer) of the thin film transistor provided in the drive circuit region.

Consequently, the display device of the present invention can achieve low power consumption and high reliability.

The present invention can be utilized for a display device having a display function: examples of the display device utilizing the present invention include a light-emitting display device in which a TFT and a light-emitting element including a layer containing organic matter, inorganic matter, or a mixture of organic matter and inorganic matter capable of light emission called "electroluminescence" (hereinafter also referred to as "EL") between electrodes are connected to each other; a liquid crystal display device in which a liquid crystal element having a liquid crystal material is used for a display element; and the like. In the present invention, a display device means a device having a display element (e.g., a liquid crystal element or a light-emitting element). Further, the display device may also mean a display panel itself where a plurality of pixels including display elements such as liquid crystal elements or EL elements and a peripheral drive circuit for driving the pixels are formed over a substrate. Furthermore, the display device may include a display panel to which a flexible printed circuit (FPC) or a printed wiring board (PWB) (e.g., having an IC, a resistor, a capacitor, an inductor, or a transistor) is attached. Such a display device may further include an optical sheet such as a polarizing plate or a retardation plate. Further, it may include a backlight unit (which may include a light guide plate, a prism sheet, a diffusion sheet, a reflective sheet, and a light source (e.g., an LED or a cold-cathode tube)).

The display element and the display device can employ various types and can include various elements. For example, a display medium whose contrast changes by an electromagnetic action, such as an EL element (e.g. an organic EL element, an inorganic EL element, or an EL element including both organic and inorganic matter), an electron emitter, a liquid crystal element, electronic ink, a grating light valve (GLV), a plasma display panel (PDP), a digital micromirror device (DMD), a piezoelectric ceramic display, or a carbon nanotube, can be employed. Examples of a display device utilizing an EL element include an EL display; examples of a display device utilizing an electron emitter include a field emission display (FED) and an SED-type flat panel display (SED: surface-conduction electron-emitter display); examples of a display device utilizing a liquid crystal element include a liquid crystal display, a transmissive liquid crystal display, a semi-transmissive liquid crystal display, and a reflective liquid crystal display; and examples of a display device utilizing electronic ink include electronic paper.

According to an aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; and a second thin film transistor including a second gate electrode layer, a second semiconductor layer including a second source region, a second drain region, and a second channel formation region that is thinner than the first channel formation region, and a second gate insulating layer is provided in the drive circuit region.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer is provided in the drive circuit region; and the second channel formation region is a region which is formed to be locally thin in the second semiconductor layer.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer that is thinner than the first gate insulating layer is provided in the drive circuit region; and the second channel formation region is a region which is formed to be locally thin in the second semiconductor layer.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer is provided in the drive circuit region; the second channel formation region is a region which is formed to be locally thin in the second semiconductor layer; and insulating layers with a sidewall structure are provided for side surfaces of the first and second gate electrode layers.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer that is thinner than the first gate insulating layer is provided in the drive circuit region; the second channel formation region is a region which is formed to be locally thin in the second semiconductor layer; and insulating layers with a sidewall structure are provided for side surfaces of the first and second gate electrode layers.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer is provided in the drive circuit region; the second channel formation region is a region which is formed to be locally thin in the second semiconductor layer; insulating layers with a sidewall structure are provided for side surfaces of the first and second gate electrode layers; and silicide is provided for surfaces of the first and second source regions and first and second drain regions.

According to another aspect of the display device of the present invention, a pixel region and a drive circuit region are provided over a substrate having an insulating surface; a thin film transistor including a first gate electrode layer, a first semiconductor layer including a first source region, a first drain region, and a first channel formation region, and a first gate insulating layer is provided in the pixel region; a second thin film transistor including a second gate electrode layer, a second semiconductor layer including a second source region, a second drain region, and a second channel formation region that is thinner than the first channel formation region, and a second gate insulating layer that is thinner than the first gate insulating layer is provided in the drive circuit region; the second channel formation region is a region which is formed to be locally thin in the second semiconductor layer; insulating layers with a sidewall structure are provided for side surfaces of the first and second gate electrode layers; and silicide is provided for surfaces of the first and second source regions and first and second drain regions.

In the above structure, the first and second semiconductor layers may be provided with the insulating layers with a sidewall structure at the side surfaces thereof. Further, one or both of the first semiconductor layer and the second semiconductor layer may include an impurity region that contains an impurity element imparting one conductivity type at a lower concentration than the source and drain regions.

The display device of the present invention includes thin film transistors in the pixel region and in the drive circuit region, and the thickness of the channel formation region in the semiconductor layer of the thin film transistor provided in the drive circuit region is smaller than that of the channel formation region in the semiconductor layer of the thin film transistor provided in the pixel region.

By forming the channel formation region in the semiconductor layer (or further, also the gate insulating layer) to be locally thin, the thin film transistor provided in the drive circuit region can be miniaturized, so that the area of the drive circuit region can be reduced; consequently, a narrow frame, a high-speed operation and a low-drive voltage can be achieved. By forming the channel formation region in the semiconductor layer to be thin, the entire channel formation region is depleted. Accordingly, the display device can achieve low power consumption.

Meanwhile, the thin film transistor provided in the pixel region can be high voltage-resistant and highly reliable by keeping the semiconductor layer (or further, also the gate insulating layer) thicker than the semiconductor layer (and the gate insulating layer) of the thin film transistor provided in the drive circuit region.

Further, in the thin film transistor provided in the drive circuit region, because the channel formation region is formed to be locally thin, the regions of the source and drain regions which are in contact with the source and drain electrode layers are not formed to be thin and thus are thicker than the channel formation region. Accordingly, in forming openings (contact holes) which expose the source and drain regions, entire removal of the semiconductor layer around the openings can be prevented, and increase in contact resistance (between the semiconductor layer and electrode layers) can also be prevented. Consequently, decrease in yield can be prevented in a manufacturing process, and high performance can be realized in a semiconductor device to be completed.

Therefore, the display device of the present invention can achieve low power consumption and high reliability.

BRIEF DESCRIPTION OF DRAWINGS

In the accompanying drawings:

FIGS. 2A to 2E are diagrams to illustrate a method for manufacturing a display device of the present invention;

FIGS. 3A to 3C are diagrams to illustrate a method for manufacturing a display device of the present invention;

FIGS. 4A to 4C are diagrams to illustrate a method for manufacturing a display device of the present invention;

FIGS. 5A to 5C are diagrams to illustrate a method for manufacturing a display device of the present invention;

FIGS. 6A to 6C are diagrams to illustrate a method for manufacturing a display device of the present invention;

FIGS. 7A to 7D are diagrams to illustrate a method for manufacturing a display device of the present invention;

FIGS. 5A to 8C are diagrams to illustrate a method for manufacturing a display device of the present invention;

FIGS. 28A and 28B are diagrams to illustrate a method for manufacturing a display device of the present invention;

FIGS. 29A and 29B are diagrams to illustrate a method for manufacturing a display device of the present invention; and FIGS. 30A to 30D are diagrams to illustrate a method for manufacturing a display device of the present invention.

DETAILED DESCRIPTION OF THE INVENTION

Embodiment Modes

Figure 1A:
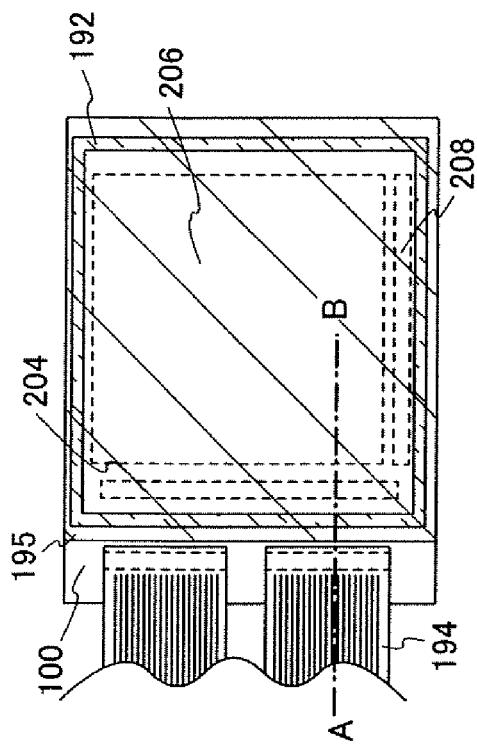
FIGS. 1A and 1B are diagrams to illustrate a display device of the present invention.

Hereinafter, embodiment modes of the present invention are described in detail with reference to the drawings. Note that the present invention is not limited to the following explanation, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be explained hereinafter, same parts or parts having similar functions are denoted by same reference numerals in different drawings, and repeated explanation thereof is omitted.

Embodiment Mode 1

This embodiment mode explains a display device for achieving low power consumption and high reliability and a method for manufacturing such a display device in detail with reference to FIGS. 1A to 4C, 10A to 10D, 14, 15A, and 15B.

Figure 15A:
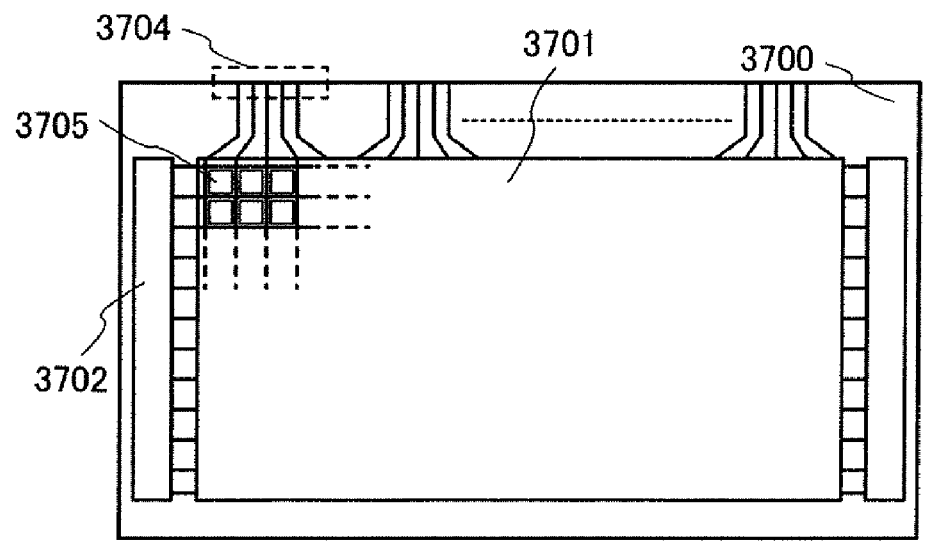
FIGS. 15A and 15B are top views of display devices of the present invention.

FIG. 15A is a top view illustrating a structure of a display panel of the present invention. A pixel region 3701 in which pixels 3705 are arranged in matrix and signal line input terminals 3704 are formed over a substrate 3700 having an insulating surface. The number of pixels may be decided according to various standards: if the standard is XGA, the number of pixels may be 1024×768×3 (RGB); if the standard is UXGA, the number of pixels may be 1600×1200×3 (RGB); and if the display panel is for full-spec high vision, the number of pixels may be 1920×1080×3 (RGB).

A scanning line extended from a scanning line drive circuit 3702 and a signal line extended from the signal line input terminal 3704 intersect each other, whereby the pixels 3705 are arranged in matrix. Each of the pixels 3705 has a switching element and a pixel electrode layer connected thereto. A typical example of the switching element is a TFT. Connecting the scanning line to a gate electrode layer side of a TFT and the signal line to a source or drain side of the TFT enables separate control of each pixel by a signal that is input from the outside.

As main components of a TFT, a semiconductor layer, a gate insulating layer, and a gate electrode layer can be given. In addition, the TFT includes a wiring layer connected to source and drain regions formed in the semiconductor layer. The TFT may have a top-gate structure in which the semiconductor layer, the gate insulating layer, and the gate electrode layer are sequentially stacked over a substrate.

FIG. 15A shows a structure of the display panel which controls a signal to be input into the signal line by the external drive circuit. To provide the external drive circuit, a driver IC may be provided on the substrate 3700 by a COG (chip on glass) method or a TAB (tape automated bonding) method. The driver IC may be formed over a single crystalline semiconductor substrate, or may be formed using TFTs over a glass substrate.

Figure 15B:
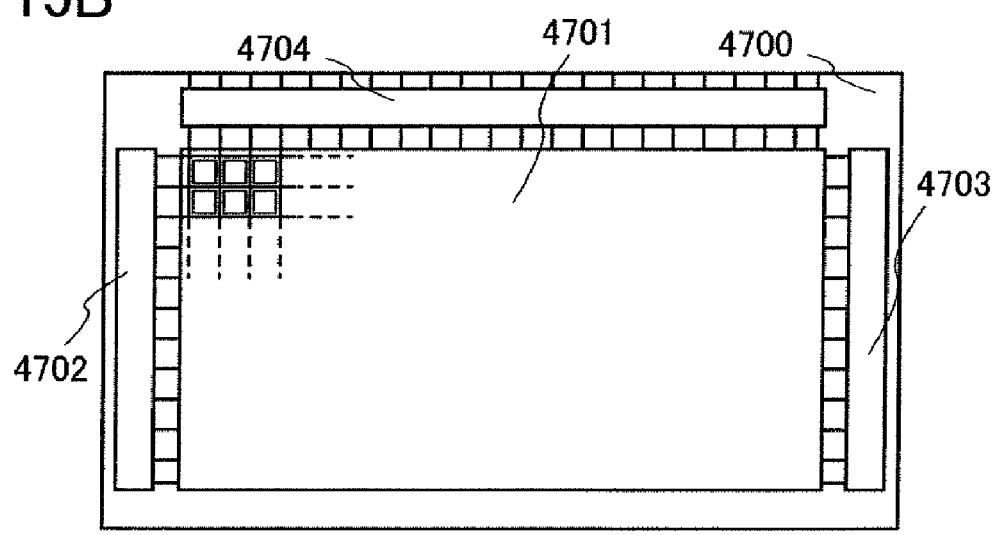

Further, as in FIG. 15B, a pixel region 4701, scanning line drive circuits 4702 and 4703, and a signal line drive circuit 4704 can be formed over the same substrate 4700.

In the present invention, the thin film transistor provided in the pixel region and the thin film transistor provided in the drive circuit region are formed so as to have different structures having respective required functions. In the thin film transistor provided in the drive circuit region, the channel formation region in the semiconductor layer (or further, also the gate insulating layer) is formed to be locally thin since it is required to be driven at high speed. Meanwhile, in the thin film transistor provided in the pixel region, the semiconductor layer (including the channel formation region) (or further, also the gate insulating layer) is formed to be thicker than the thin film transistor provided in the drive circuit region since it is required to have high reliability such as high voltage resistance. Accordingly, in the display device of the present invention, the thin film transistor provided in the drive circuit region and the thin film transistor provided in the pixel region have channel formation regions with different thicknesses: the thickness of the channel formation region in the semiconductor layer of the thin film transistor provided in the drive circuit region is smaller than that of the channel formation region in the semiconductor layer of the thin film transistor provided in the pixel region. Further, it is preferable that the thickness of the gate insulating layer of the thin film transistor provided in the drive circuit region also be smaller than that of the gate insulating layer of the thin film transistor provided in the pixel region.

A feature of the present invention is that in the semiconductor layer of the thin film transistor provided in the drive circuit region, the channel formation region is formed to be locally thin (the thickness is preferably 5 to 30 nm, inclusive, more preferably, 10 to 20 nm, inclusive), and the regions of the source and drain regions which are in contact with the source and drain electrode layers are not formed to be thin (the thickness is preferably 25 to 100 nm, inclusive, more preferably, 50 to 60 nm, inclusive). Accordingly, in the semiconductor layer, part of the source region and drain region, a low-concentration impurity region which can be provided between the channel formation region and the source and drain regions, or the like, which are not included in the channel formation region, may be formed to be thin.

In FIG. 15A, a channel formation region in a semiconductor layer (or further, also a gate insulating layer) of a thin film transistor included in the scanning line drive circuit 3702 is formed to be thinner than a channel formation region (or further, also a gate insulating layer) of a semiconductor layer of a thin film transistor included in the pixel region 3701. Further, it is preferable that the thickness of the gate insulating layer of the thin film transistor provided in the scanning line drive circuit 3702 be smaller than that of the gate insulating layer of the thin film transistor provided in the pixel region 3701.

In FIG. 15B, semiconductor layers (or further, also gate insulating layers) of the thin film transistors included in the scanning line drive circuits 4702 and 4703 and the signal line drive circuit 4704 are formed to be thinner than semiconductor layers (and gate insulating layers) of the thin film transistors included in the pixel region 4701. The thickness of the channel formation region in the semiconductor layer of the thin film transistor may be reduced in both the scanning line drive circuits 4702 and 4703 and the signal line drive circuit 4704, or in either the scanning line drive circuits 4702 and 4703 or the signal line drive circuit 4704. It is acceptable as long as a thin film transistor having a semiconductor layer (or further, also a gate insulating layer) which is thinner than that of a thin film transistor in the pixel region is included in a plurality of transistors included in the scanning line drive circuits 4702 and 4703 and the signal line drive circuit 4704, which are the drive circuit regions. Further, it is preferable that the gate insulating layers of the thin film transistors provided in the scanning line drive circuits 4702 and 4703 and the signal line drive circuit 4704 be thinner than those of the thin film transistors provided in the pixel region 4701.

In a thin film transistor in a drive circuit region, high speed operation can be achieved by reducing a channel length, which is represented as a distance between source and drain regions of a gate electrode, thereby reducing a travel distance of carriers which flow through the channel formation region of the thin film transistor.

However, if the channel length is reduced for high performance of a thin film transistor, a phenomenon which is so-called "short channel effect", such as a change in threshold voltage or an increase in leakage current between the source and drain regions in a weak inversion state, becomes prominent.

By forming a channel formation region in a semiconductor layer to be thin, the entire channel formation region is depleted and the short channel effect can be suppressed. In addition, threshold voltage of the thin film transistor can be lowered. Accordingly, miniaturization and high performance can be realized in the thin film transistor provided in the drive circuit region. Consequently, the display device can be driven at a low voltage and low power consumption can be realized. Further, because forming the semiconductor layer (or further, also the gate insulating layer) to be thin can miniaturize the thin film transistor, the area of the drive circuit region can be reduced, whereby the display device can have a narrower frame. Accordingly, the display device can be further downsized.

Further, in the thin film transistor provided in the drive circuit region, because the channel formation region is formed to be locally thin, the regions of the source and drain regions which are in contact with the source and drain electrode layers are not formed to be thin and thus are thicker than the channel formation region. Accordingly, in forming openings (contact holes) which expose the source and drain regions, entire removal of the semiconductor layer around the openings can be prevented, and increase in contact resistance (between the semiconductor layer and electrode layers) can also be prevented. Consequently, decrease in yield can be prevented in a manufacturing process, and high performance can be realized in a semiconductor device to be completed.

An insulating layer 101 is formed as a base film over a substrate 100 having an insulating surface (see FIG. 2A). In this embodiment mode, the insulating layer 101 has a stacked-layer structure: a silicon nitride oxide film is formed to have a thickness of 10 to 200 nm (preferably, 50 to 150 nm) and a silicon oxynitride film is formed to have a thickness of 50 to 200 nm (preferably, 10 to 150 nm). In this embodiment mode, the insulating layer 101 is formed by a plasma CVD method. The base film may have a single layer structure or a stacked-layer structure including two layers or three layers.

The base film may be formed using an inorganic material such as silicon oxide, silicon nitride, silicon oxynitride, or silicon nitride oxide; acrylic acid, methacrylic acid, or a derivative thereof; a heat-resistant high molecular compound such as polyimide, aromatic polyamide, or polybenzimidazole; or a siloxane resin. A resin material such as a vinyl resin, e.g., polyvinyl alcohol or polyvinylbutyral, an epoxy resin, a phenol resin, a novolac resin, an acrylic resin, a melamine resin, or a urethane resin may also be used. Further, an organic material such as benzocyclobutene, parylene, fluorinated arylene ether, or polyimide; a composition material containing a water-soluble homopolymer and a water-soluble copolymer; or the like may also be used. Furthermore, an oxazole resin, e.g., photo-curing polybenzoxazole, may also be used.

The base film can be formed by a sputtering method, a PVD (physical evaporation) method, a CVD (chemical evaporation) method such as a low pressure CVD method (LPCVD method) or a plasma CVD method, or the like. A droplet discharging method, a printing method (a method by which a pattern is formed, such as screen printing or offset printing), a coating method such as a spin coating method, a dipping method, a dispenser method, or the like can also be used.

A glass substrate or a quartz substrate can be used as the substrate 100. Further, a plastic substrate with a heat resistance sufficient to withstand the process temperature of this embodiment mode, or a flexible substrate such as a film can also be used. As the plastic substrate, a substrate formed of PET (polyethylene terephthalate), PEN (polyethylene naphthalate), or PES (polyethersulfone); as the flexible substrate, a substrate formed of synthetic resin such as acrylic can be used. Because the display device formed in this embodiment mode has a structure in which light from a light-emitting element is extracted through the substrate 100, the substrate 100 needs to transmit light.

Next, a semiconductor film is formed over the base film. The semiconductor film may be formed by a sputtering method, an LPCVD method, a plasma CVD method, or the like to have a thickness of 25 to 200 nm (preferably, 30 to 150 nm). In the present invention, it is preferable to crystallize an amorphous semiconductor film with a laser and to use an obtained crystalline semiconductor film.

The semiconductor film can be formed using a polycrystalline semiconductor formed by crystallizing an amorphous semiconductor (hereinafter also referred to as an "AS") which is formed by an evaporation method or a sputtering method using a semiconductor material gas typified by silane or germane utilizing light energy or heat energy; a single crystalline semiconductor; or the like.

Hydrogenated amorphous silicon may be typically given as an example of the amorphous semiconductor, while polysilicon or the like may be typically given as an example of the crystalline semiconductor. Polysilicon (polycrystalline silicon) includes so-called high-temperature polysilicon, which is formed using polysilicon formed at process temperatures of 800° C. or higher as a main material; so-called low-temperature polysilicon, which is formed using polysilicon formed at process temperatures of 600° C. or lower as a main material; polysilicon which is formed by crystallizing amorphous silicon by using, for example, an element to promote crystallization; and the like. Instead of such a thin film process, an SOI substrate, whose insulating surface is provided with a single crystalline semiconductor layer, may be used. The SOI substrate can be formed by a SIMOX (separation by implanted oxygen) method or a smart-cut method. In the SIMOX method, after oxygen ions are injected into a single crystalline silicon substrate to form a layer containing oxygen in a given depth, heat treatment is carried out to form an embedded insulating layer in a given depth from a surface, and then a single crystalline silicon layer is formed on the embedded insulating layer. In the smart-cut method, hydrogen ions are injected into an oxidized single crystalline silicon substrate to form a layer containing hydrogen in a desired depth, the oxidized single crystalline silicon substrate is attached to another supporting substrate (e.g., a single crystalline silicon substrate having a silicon oxide film for attachment at a surface), and heat treatment is carried out, whereby the silicon crystalline silicon substrate is separated at the layer containing hydrogen to form stacked layers of the silicon oxide film and the single crystalline silicon layer over the supporting substrate.

The crystalline semiconductor layer may be formed by various methods (e.g., a laser crystallization method, a thermal crystallization method, or a thermal crystallization method in which an element to promote crystallization such as nickel is used). Further, a microcrystalline semiconductor may be crystallized by laser irradiation to enhance crystallinity. If the element to promote crystallization is not introduced, heating is carried out under a nitrogen atmosphere at 500° C. for one hour before laser irradiation of an amorphous semiconductor layer, so that the concentration of hydrogen contained in the amorphous semiconductor layer is reduced to less than or equal to $1 \times 10^{20}$ atoms/cm$^3$. This is because an amorphous semiconductor layer is destroyed if the amorphous semiconductor layer containing much hydrogen is irradiated with a laser beam. For the thermal treatment for crystallization, it is possible to use a heating furnace, laser irradiation, irradiation with light emitted from a lamp (also referred to as "lamp annealing"), or the like. Examples of a heating method include an RTA method such as a GRTA (gas rapid thermal annealing) method or an LRTA (lamp rapid thermal annealing) method. GRTA is a method for performing heat treatment using a high-temperature gas, and LRTA is a method for performing heat treatment by lamp light.

In the crystallization step for forming the crystalline semiconductor layer by crystallizing the amorphous semiconductor layer, the crystallization may also be carried out by adding an element which promotes crystallization (also referred to as a "catalytic element" or a "metal element") to the amorphous semiconductor layer and carrying out thermal treatment (550 to 750° C. for 3 minutes to 24 hours) thereto. The element which promotes crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

As a method for introducing a metal element into the amorphous semiconductor layer, any method by which the metal element can be present on the surface or inside the amorphous semiconductor layer can be used. For example, a sputtering method, a CVD method, a plasma treatment method (including a plasma CVD method), an adsorption method, or a method of coating a metal salt solution can be used. Above all, the method using a solution is easy and advantageous in that the concentration of the metal element can be easily controlled. In addition, in order to improve the wettability of the surface of the amorphous semiconductor layer and spread the aqueous solution over the entire surface of the amorphous semiconductor layer, it is desirable to form an oxide film by UV irradiation under an oxygen atmosphere, a thermal oxidation method, treatment with ozone water containing hydroxyl radical or with hydrogen peroxide, or the like.

In order to remove or reduce the element which promotes crystallization from the crystalline semiconductor layer, a semiconductor layer containing an impurity element is formed in contact with the crystalline semiconductor layer so that it can function as a gettering sink. As the impurity element, an n-type impurity element, a p-type impurity element, a rare gas element, or the like can be used. For example, one or more elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing the element which promotes crystallization, and heat treatment (550 to 750° C. for 3 minutes to 24 hours) is carried out. The element which promotes crystallization and is contained in the crystalline semiconductor layer moves into the semiconductor layer containing the rare gas element, so that the element which promotes crystallization in the crystalline semiconductor layer is removed or reduced. After that, the semiconductor layer which contains the rare gas element and functions as the gettering sink is removed.

Laser irradiation can be carried out by scanning the semiconductor layer with laser beam relatively. In addition, a marker may be formed in order to overlap beams with high accuracy or to control the laser irradiation starting position and the laser irradiation termination position in the laser irradiation. The marker may be formed on the substrate at the same time as the formation of the amorphous semiconductor layer.

When laser irradiation is utilized, a continuous wave (CW) laser beam or a pulsed laser beam can be used. For a laser beam herein, a laser beam emitted from one or more of the following can be used: gas lasers such as an Ar laser, a Kr laser, and an excimer laser; a laser which utilizes, for a medium, single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more dopants such as Nd, Yb, Cr, Ti, Ho, Er, Tm, and Ta; a glass laser; a ruby laser; an alexandrite laser; a Ti:sapphire laser; a copper vapor laser; and a metal vapor laser. By irradiation with such a laser beam with a fundamental wave or the second to fourth harmonics of the fundamental wave, crystals with large grain sizes can be obtained. For example, the second harmonic (532 nm) or the third harmonic (355 nm) of an Nd:YVO$_4$ laser (the fundamental wave of 1064 nm) can be used. This laser can emit a laser beam with either CW oscillation or pulsed oscillation. When the laser beam is emitted with CW oscillation, a laser power density of about 0.01 to 100 MW/cm$^2$ (preferably, 0.1 to 10 MW/cm$^2$) is necessary and irradiation is carried out at a scanning rate of about 10 to 2000 cm/sec.

With regard to a laser which utilizes, for a medium, single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more dopants such as Nd, Yb, Cr, Ti, Ho, Er, Tm, and Ta; an Ar ion laser; and a Ti:sapphire laser; continuous oscillation is possible. In addition, pulsed oscillation can also be performed at a repetition rate of greater than or equal to 10 MHz by performing a Q-switch operation or mode locking. A pulsed laser having a pulse width in the picosecond or femtosecond ($10^{-15}$ second) range may also be used. When a laser beam with a repetition rate of greater than or equal to 10 MHz is used, the semiconductor layer is irradiated with the laser beam of a next pulse after it is melted by the laser beam of a previous pulse and before it becomes solidified. Therefore, unlike a pulsed laser with a low repetition rate, it is possible to move a solid-liquid interface continuously in the semiconductor layer. Thus, crystal grains which have grown continuously in the scanning direction can be obtained.

When ceramic (polycrystals) is used for the medium, the medium can be formed into a desired shape in a short time at low cost. When a single crystal is used, a medium with a columnar shape having a diameter of several millimeters and a length of several tens of millimeters is usually used. However, when ceramic is used, a larger medium can be formed.

In both cases of using single crystals and using polycrystals, the concentration of the dopant such as Nd or Yb in the medium, which directly contributes to light emission, cannot be changed largely. Therefore, there are limitations to improving the output of the laser by increasing the concentration of the dopant. However, in the case of using ceramic, a drastic improvement in output can be achieved because the size of the medium can be significantly increased compared to that of single crystals.

Further, in the case of using ceramic, a medium with a parallelepiped shape or a rectangular parallelepiped shape can be easily formed. When such a medium is used and oscillated light is made to travel inside the medium in a zigzag manner, the oscillation path can be made long. Therefore, large amplification and high output can be achieved. In addition, since a laser beam emitted from the medium with such a shape has a quadrangular cross section when it is emitted, it can advantageously be shaped into a linear beam with more ease than a circular beam. Shaping the laser beam emitted in this manner with an optical system enables obtaining a linear beam with a short side of less than or equal to 1 mm and a long side of several millimeters to several meters easily. In addition, irradiating the medium uniformly with excitation light evens up the energy distribution of the linear beam in the long-side direction. Further, it is preferable that the laser beam be emitted on the semiconductor layer at an incident angle of $\theta$ ($0<\theta<90°$) in order to prevent interference of the laser beam.

By irradiating the semiconductor layer with such a linear beam, the entire surface of the semiconductor layer can be annealed more uniformly. If uniform annealing is necessary from one end to the other end of the linear laser beam, it is necessary to exercise ingenuity such as providing slits at the end portions so as to block light at a portion where energy is attenuated.

It is also possible to irradiate the semiconductor layer with a laser beam under an inert gas atmosphere such as a rare gas or nitrogen. Accordingly, roughness of the surface of the semiconductor layer due to laser irradiation can be suppressed, and variations in the threshold voltage caused by variations in interface state density can be suppressed.

Crystallization of the amorphous semiconductor layer may be carried out by combining heat treatment and laser beam irradiation, or by several times of either heat treatment or laser beam irradiation.

In this embodiment mode, an amorphous semiconductor film is formed over the insulating layer 101 and crystallized by a laser to form a crystalline semiconductor film.

The semiconductor film obtained in this manner is selectively doped with a slight amount of impurity element (boron or phosphorus) to control a threshold voltage of a thin film transistor. This doping with an impurity element may be carried out to the amorphous semiconductor film before the crystallization step. When the doping with an impurity element is carried out to the amorphous semiconductor film, activation of the impurity element can also be carried out by subsequent heat treatment for crystallization. In addition, defects and the like caused by doping can be repaired.

Next, a semiconductor film 102 is shaped into a desired form using a mask. In this embodiment mode, after an oxide film formed on the semiconductor film 102 is removed, another oxide film is formed. Then a photomask is made, and semiconductor layers 158, 159, 105, and 106 are formed by a process using a photolithography method (see FIG. 2B).

For end portions of the semiconductor layers, inclination angles (taper angles) may be provided. It is preferable that the angles thereof be 45 to 95°. In order to avoid an influence of formation of a parasitic transistor having a property different from that of a central portion of the semiconductor layer in this region, it is preferable that the inclination angles be close to vertical.

In this specification, the "end portions" of the semiconductor layers denote edge portions of the semiconductor layers formed into an island shape. A "side surface" of the semiconductor layer denotes a plane of an edge portion of the semiconductor layer.

The etching may be carried out by either plasma etching (dry etching) or wet etching. For treating a large-sized substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be appropriately added thereto. If the etching is carried out utilizing atmospheric pressure discharge, electric discharge machining can be carried out locally and a mask does not need to be formed over the entire surface of the substrate.

In the present invention, a conductive layer to form a wiring layer or an electrode layer, a mask used for forming a predetermined pattern, and the like may be formed by a method by which a pattern can be formed selectively, such as a droplet discharging method. A droplet discharging (ejecting) method (also referred to as an "ink-jet method" depending on its system) can form a predetermined pattern (of a conductive layer, an insulating layer, or the like) by selectively discharging (ejecting) droplets of a composition mixed for a specific purpose. In using the droplet discharging (ejecting) method, treatment for controlling wettability or adhesiveness may be carried out to a region on which the pattern is formed. A method by which a pattern can be transferred or drawn, e.g., a printing method (a method by which a pattern is formed, such as screen printing or offset printing), can also be used.

In this embodiment mode, for a mask, a resin material such as an epoxy resin, an acrylic resin, a phenol resin, a novolac resin, a melamine resin, or a urethane resin is used. An organic material such as benzocyclobutene, parylene, fluorinated arylene ether, or polyimide; a compound material formed by polymerization of siloxane-based polymers or the like; a composition material containing a water-soluble homopolymer and a water-soluble copolymer; or the like can also be used. Further, a commercially available resist material containing a photosensitizer may also be used: for example, a novolac resin and a naphthoquinonediazide compound that is a photosensitizer, which are typical positive resists; a base resin, diphenylsilanediol, and an acid generation agent, which are negative resists; or the like may be used. If the droplet discharging method is used with any material, the surface tension and viscosity of the material are appropriately adjusted by, for example, adjusting the concentration of a solvent or adding a surfactant or the like.

Insulating layers 107a to 107h in contact with the side surfaces of the semiconductor layers 158, 159, 105, and 106 are formed (see FIG. 2C). Forming the insulating layers 107a to 107h in contact with the side surfaces of the semiconductor layers 158, 159, 105, and 106 can improve coverage of the end portions of the semiconductor layers 158, 159, 105, and 106 with gate insulating layers. Accordingly, defects due to insufficient coverage of the end portion of the semiconductor layer 158, 159, 105, or 106 with the gate insulating layer, e.g., a short circuit between the semiconductor layer and a gate electrode layer, occurrence of leakage current, or an electrostatic discharge, can be prevented.

The insulating layers 107a to 107h can be formed in a self-aligned manner by forming the semiconductor layers 158, 159, 105, and 106, then depositing a silicon oxide film or a silicon nitride film thereover, and processing the silicon oxide film or silicon nitride film by anisotropic etching.

The insulating layers 107a to 107h can also be formed by selectively insulating the end portions of the semiconductor layers 158, 159, 105, and 106 by oxidation thereof. The oxidation can be carried out by plasma treatment under an atmosphere containing oxygen. Further, the surfaces of the semiconductor layers 158, 159, 105, and 106 may be oxidized using an aqueous solution (this oxidation is also referred to as "wet oxidation"). The plasma treatment may be carried out after introducing halogen such as fluorine or chlorine into the side end portions of the semiconductor layers. Addition of halogen promotes preferential oxidation because of high oxidation rate, and enables formation of thick insulating layers on the side end portions of the semiconductor layers.

By sufficiently covering the end portions of the semiconductor layers 158, 159, 105, and 106 with the gate insulating layers, preferably, forming regions in contact with the side surfaces of the semiconductor layers 158, 159, 105, and 106 to have large thicknesses, an electric field applied to the end portions of the semiconductor layers 158, 159, 105, and 106 can be eased, whereby occurrence of leakage current or the like can be prevented.

Further, it is preferable to make the dielectric constant of the insulating layers 107a to 107h smaller than that of gate insulating layers 108 and 109 to be formed in later steps. By making the dielectric constant of the insulating layers 107a to 107h smaller than that of the gate insulating layers 108 and 109, concentration of electric field on the end portions, in particular, on the corner portions of the semiconductor layers can be eased. For example, the insulating layers 107a to 107h may be formed using a low dielectric constant material having relative dielectric constants of 2.5 or lower. As the low dielectric constant material, porous silicon oxide manufactured by a CVD method, silicon oxide which contains carbon or fluorine and manufactured by a CVD method, or the like can be used. By forming the insulating layers 107a to 107h using the low dielectric constant material, the similar effect to the case of increasing the thicknesses can be obtained: local excessive application of electric field on the gate insulating layers can be prevented, whereby insufficient insulation of the gate insulating layers can be prevented. Therefore, thin film transistors can be manufactured in a high yield, and a display device to be completed can be improved in reliability.

A mask 157 to cover the semiconductor layers 105, 106, 158, and 159 selectively is formed. The mask 157 is formed so as to have openings over regions to be channel formation regions in the semiconductor layers 158 and 159, and covers regions to be source and drain regions in the semiconductor layers 158 and 159 and a pixel region 206 where thin film transistors connected to a display element electrically are provided. The semiconductor layers 158 and 159 are selectively etched using the mask 157 to be formed to be thin locally, whereby semiconductor layers 103 and 104 are formed in a drive circuit region 204. Therefore, the semiconductor layers 103 and 104 in the drive circuit region 204, which have thinner channel formation regions than those of the semiconductor layers 105 and 106 in the pixel region 206, are formed (see FIG. 2D). After etching, the formed semiconductor layers 103 and 104 have recessed portions, and the recessed portions are the regions which are formed to be thin.

The semiconductor layers 158 and 159 can be formed to be thin by dry etching or wet etching. For example, if dry etching is performed, a chlorine-based gas such as $Cl_2$, $BCl_3$, or $SiCl_4$; a fluorine-based gas such as $CF_4$, $NF_3$, or $SF_6$; or a HBr gas can be used as an etching gas. Further, an inert gas such as He, Ar, or Xe can be added appropriately. Further, an $O_2$ gas may be added to the fluorine-based gas.

In forming the semiconductor layers 158 and 159 to be thin, it is preferable to etch the insulating layers 107a to 107h in regions which are not covered with the mask 157 as well so as to have almost the same height. Etching may be performed under a condition that the etching rates of the semiconductor layers 158 and 159 and the insulating layers 107a to 107h are almost the same, that is, the etching selectivity is close to 1. This condition can be set by, for example, adding an $O_2$ gas appropriately to the fluorine-based gas. Further, instead of the etching gas in which the $O_2$ gas is added to the fluorine-based gas, a HBr gas or a mixed gas of HBr and $Cl_2$ may be used. At this time, an inert gas such as He or Ar may be added to the etching gas.

Figure 10A:
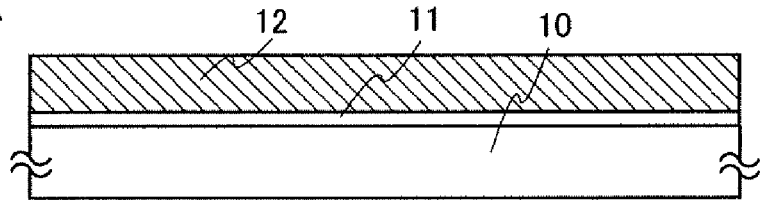
FIGS. 10A to 10D are diagrams to illustrate a method for manufacturing a display device of the present invention.
Figure 10B:
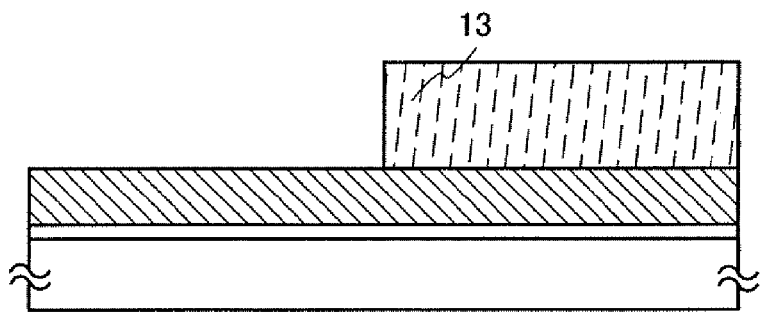
Figure 10C:
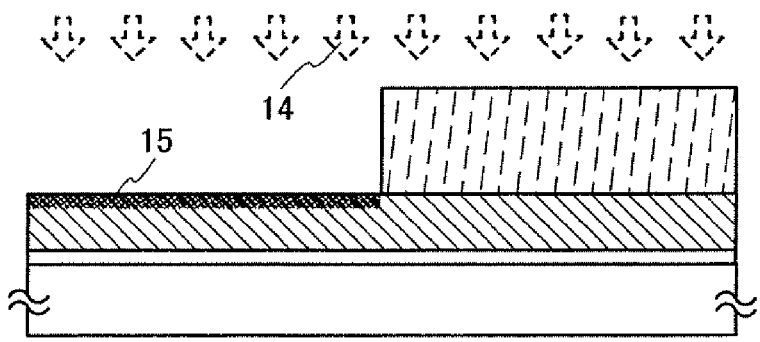
Figure 10D:
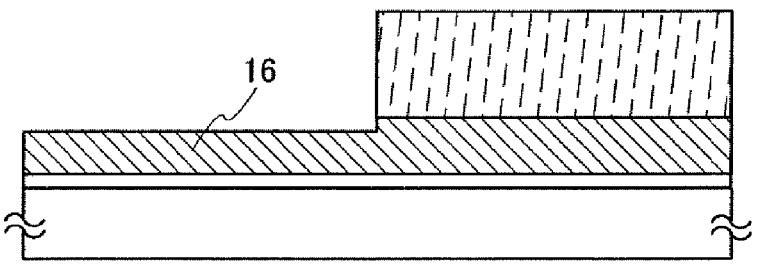

The semiconductor layers may be formed to be thin by one-time etching process or a plurality of etching processes. Further, the semiconductor layers may be etched directly with an etching gas (or an etchant), or surfaces of the semiconductor layers may be partly processed to be modified and only modified regions may be selectively removed. FIGS. 10A to 10D illustrate an example of forming a semiconductor layer to be thin through a plurality of steps. In FIG. 10A, a base film 11 is formed over a substrate 10, and a semiconductor layer 12 is formed thereover. Over the semiconductor layer 12 is formed a mask 13 selectively (see FIG. 10B). The semiconductor layer 12 is modified selectively by plasma treatment 14 (oxidation in this embodiment mode), whereby a modified (oxidized in this embodiment mode) region 15 is formed (see FIG. 10C). The modified region 15 is removed under an etching condition (e.g., an etching gas or an etchant) under which only the modified region 15 can be removed and the semiconductor layer 12 is not etched, whereby a semiconductor layer 16 which is formed to be partly thin is formed (see FIG. 10D). By repeating the steps illustrated in FIGS. 10C and 10D, the semiconductor layer can be formed to be thin to have a desired thickness.

The thickness of the channel formation regions in the semiconductor layers 103 and 104 provided in the drive circuit region 204 may be 5 to 30 nm, inclusive, preferably, 10 to 20 nm, inclusive to be smaller than that of the channel formation regions in the semiconductor layers 105 and 106 provided in the pixel region 206. Meanwhile, the thickness of the source regions and drain regions of the semiconductor layers provided in the drive circuit region 204 and that of the semiconductor layers 105 and 106 (including the source regions, drain regions, and channel formation regions) provided in the pixel region 206 may be 25 to 100 nm, inclusive, preferably, 50 to 60 nm, inclusive to be larger than that of the channel formation regions in the semiconductor layers 103 and 104 provided in the drive circuit region 204.

A feature of this embodiment mode is that in the semiconductor layer of the thin film transistor provided in the drive circuit region, the channel formation region is formed to be locally thin (the thickness is preferably 5 to 30 nm, inclusive, more preferably, 10 to 20 nm, inclusive), and the regions of the source and drain regions which are in contact with the source and drain electrode layers are not formed to be thin (the thickness is preferably 25 to 100 nm, inclusive, more preferably, 50 to 60 nm, inclusive). Accordingly, in the semiconductor layer, part of the source and drain regions, a low-concentration impurity region which can be provided between the channel formation region and the source and drain regions, or the like, which are not included in the channel formation region, may be formed to be thin.

When the channel formation region in the semiconductor layer is formed to be locally thin, the short channel effect can be suppressed. Further, threshold voltage of a transistor can be lowered and the transistor can be driven at a low voltage.

The oxide film on the semiconductor layers is removed, and a gate insulating layer 108 covering the semiconductor layers 103 and 104 and the insulating layers 107a to 107d, and a gate insulating layer 109 covering the semiconductor layers 105 and 106 and the insulating layers 107e to 107h are formed (see FIG. 2E). An insulating film is formed by a plasma CVD method or a sputtering method and the insulating layer only in the drive circuit region 204 is selectively etched to be thin, whereby the gate insulating layers 108 and 109 having different thicknesses are formed. Forming the gate insulating layer 108 to be thin has an effect of operating the transistor at a low voltage and high speed in the drive circuit region 204. Further, large thickness of the gate insulating layer 109 in the pixel region 206 enhances the resistance to high voltage in the thin film transistor, which can enhance the reliability.

With regard to the display device of the present invention, the thickness of the gate insulating layer 108 of the thin film transistor provided in the drive circuit region 204 may be 1 to 10 nm, inclusive, more preferably, about 5 nm. Meanwhile, the thickness of the gate insulating layer 109 of the thin film transistor provided in the pixel region 206 may be 50 to 150 nm, inclusive, more preferably, 60 to 80 nm, inclusive.

The gate insulating layers 108 and 109 may be formed using silicon oxide, or with a stacked structure of silicon oxide and silicon nitride. The gate insulating layers 108 and 109 may be formed by depositing an insulating film by a plasma CVD method or a low-pressure CVD method, preferably, through solid phase oxidation or solid phase nitridation by plasma treatment. This is because a gate insulating layer formed by oxidizing or nitriding a semiconductor layer by plasma treatment is dense, and has high dielectric strength and excellent reliability.

In the solid phase oxidation treatment or solid phase nitridation treatment by the plasma treatment, it is preferable to utilize plasma which is excited by microwaves (typically, 2.45 GHz) and has electron densities of $1\times10^{11}$ to $1\times10^{13}$ cm$^{-3}$, inclusive, and electron temperatures of 0.5 to 1.5 eV, inclusive so as to form a dense insulating film and obtain a practical reaction speed at temperatures of 500° C. or lower in the solid phase oxidation treatment or the solid phase nitridation treatment.

If the surfaces of the semiconductor layers are oxidized by this plasma treatment, the plasma treatment is performed under an oxygen atmosphere (e.g., an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). If the surfaces of the semiconductor layers are nitrided by the plasma treatment, the plasma treatment is performed under a nitrogen atmosphere (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. A mixed gas of Ar and Kr may also be used.

The plasma treatment includes oxidation treatment, nitridation treatment, oxynitridation treatment, hydrogenation treatment, and surface modification treatment to the semiconductor layers, the insulating layers, and the conductive layer A gas to be supplied may be selected according to a purpose of the treatment.

The oxidation treatment or the nitridation treatment may be performed to the semiconductor layers as follows: first, the inside of a process chamber is vacuumized and a gas for plasma treatment containing oxygen or nitrogen is introduced from a gas supplying portion. The substrate is heated at room temperature or at temperatures of 100 to 550° C. by a temperature controlling portion.

Next, microwaves are supplied from a microwave supplying portion to an antenna. And then, the microwaves are introduced from the antenna into the processing chamber through a dielectric plate, whereby plasma is generated. When the plasma is excited by introducing the microwaves, plasma having low electron temperatures (3 eV or lower, preferably 1.5 eV or lower) and high electron densities (greater than or equal to $1\times10^{11}$ cm$^{-1}$) can be generated. With oxygen radicals (containing OH radicals in some cases) and/or nitrogen radicals (containing NH radicals in some cases) generated by this high-density plasma, the surfaces of the semiconductor layers can be oxidized or nitrided. A plasma treatment gas mixed with a rare gas such as argon enables oxygen radicals or nitrogen radicals to be generated efficiently due to excited species of a rare gas. In this method, by the effective use of active radicals excited by plasma, oxidation, nitridation, or oxynitridation by a solid phase reaction can be performed at low temperatures of 500° C. or lower.

A preferable example of the gate insulating layer formed by the plasma treatment is a stacked structure in which a silicon oxide layer is formed on a semiconductor layer with a thickness of 3 to 6 nm by the plasma treatment under an oxygen atmosphere, and then a surface of the silicon oxide layer is nitrided under a nitrogen atmosphere to form a silicon nitride layer. By oxidizing a surface of a silicon layer as a typical example of the semiconductor layer by plasma treatment, a dense oxide film without distortions at an interface can be formed. In addition, if the oxide film is nitrided by plasma treatment to substitute oxygen at the surface for nitrogen, thereby forming a nitride film, further densification is possible. Accordingly, an insulating film having high dielectric strength can be formed.

In any case, with the use of solid phase oxidation treatment or solid phase nitridation treatment by the plasma treatment as described above, an insulating layer equal to a thermal oxide film formed at 950 to 1050° C. can be obtained even if a glass substrate having an upper temperature limit of 700° C. or lower is used. In other words, an insulating film which is highly reliable as a gate insulating layer of a transistor can be formed.

Further, for the gate insulating layers 108 and 109, a material with a high dielectric constant may also be used. Using a material with a high dielectric constant for the gate insulating layers 108 and 109 can reduce gate leakage current. As the material with a high dielectric constant, zirconium dioxide, hafnium oxide, titanium dioxide, tantalum pentoxide, or the like can be used. Further, a silicon oxide layer may be formed by solid phase oxidation by plasma treatment.

Further, a thin silicon oxide film can also be formed by oxidizing the surface of the semiconductor region by a GRTA method, an LRTA method, or the like, thereby forming a thermal oxide film. In order to form a dense insulating film with little gate leakage current at a low film formation temperature, it is preferable to mix a rare gas element such as argon into a reactive gas so that the rare gas element can be mixed into the insulating film to be formed.

Next, a first conductive film and a second conductive film to function as gate electrode layers are stacked over the gate insulating layers 108 and 109 to have thicknesses of 20 to 100 nm and 100 to 400 nm, respectively. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), Chromium (Cr), and neodymium (Nd), or an alloy or compound material containing the above material as a main component. Further, for the first and second conductive films, a semiconductor film typified by a polycrystalline silicon film doped with an impurity element such as phosphorus; or a AgPdCu alloy may be used. Furthermore, the structure is not limited to the two-layer structure, and for example, a three-layer structure may be employed in which a tungsten film having a thickness of 50 nm, an aluminum-silicon (Al—Si) alloy film having a thickness of 500 nm, and a titanium nitride film having a thickness of 30 nm are stacked in this order as a first conductive film, a second conductive film, and a third conductive film, respectively. When the three-layer structure is employed, the tungsten used for the first conductive film may be replaced with tungsten nitride, the aluminum-silicon (Al—Si) alloy film used as the second conductive film may be replaced with an aluminum-titanium (Al—Ti) alloy film, and the titanium nitride film used as the third conductive film may be replaced with a titanium film. Still furthermore, a single layer structure may be employed. In this embodiment mode, tantalum nitride is formed to have a thickness of 30 nm for the first conductive film, and tungsten (W) is formed to have a thickness of 370 nm for the second conductive film.

Next, a resist mask is formed by a photolithography method, and the first and second conductive films are processed into desired shapes to form first gate electrode layers 110, 111, 112a, 112b, and 113, and second gate electrodes 114, 115, 116a, 116b, and 117 (see FIG. 3A). The first gate electrode layers 110 and 111 and the second gate electrode layers 114 and 115 are formed over the regions which are formed to be locally thin in the semiconductor layers 103 and 104, with the gate insulating layer 108 interposed therebetween. The first and second gate electrode layers can be etched into desired tapered shapes by an ICP (inductively coupled plasma) etching method with appropriate control of the etching conditions (e.g., the amount of electric energy applied to a coil-shaped electrode layer, the amount of electric energy applied to an electrode layer on the substrate side, and the electrode temperature on the substrate side). In addition, an angle and the like of the tapered shape may also be controlled by the shape of the mask. As an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ can be appropriately used.

Although this embodiment mode shows an example in which the first and second gate electrode layers are formed to have vertical side surfaces, the present invention is not limited thereto: both the first and second gate electrode layers may have a tapered shape; or only the first or the second gate electrode layers may have a tapered shape and the other gate electrode layers may have vertical side surfaces by anisotropic etching. Further, the taper angles of the stacked gate electrode layers may be different or the same. The tapered shape improves coverage with a film to be stacked thereover and reduces defects, so that the reliability is improved.

Through the etching process to form the gate electrode layers, the gate insulating layers 108 and 109 can be slightly etched to have a reduced thickness (so-called film reduction).

In this embodiment mode, the gate electrode layers are formed to have a small width in the channel direction in order to enable the thin film transistor provided in the drive circuit region 204 to operate at high speed.

Two methods for forming the gate electrode layers to have a reduced width in the channel direction are described hereinafter.

A first method is as follows: after a mask for the gate electrode layers is formed, the width of the mask is reduced by etching, ashing, or the like to form a mask having a smaller width. Use of the mask formed to have a small width in advance allows forming the gate electrode layers into a narrow shape in width.

A second method is as follows: an ordinary mask is formed and gate electrode layers are formed using the mask; next, the gate electrode layers obtained are further side-etched to be reduced in width; accordingly, gate electrode layers having a small width can be formed ultimately. Through the above steps, it is possible to form thin film transistors that have a small channel length and can operate at high speed. In this embodiment mode, it is preferable that the thin film transistor provided in the drive circuit region have shorter channel length than the thin film transistor provided in the pixel region. It is preferable that the thin film transistor provided in the drive circuit region in this embodiment mode have a channel length of 0.1 to 1 μm. Further, it is preferable that the thin film transistor provided in the pixel region have a channel length of 1 to 5 μm (more preferably, 1 to 3 μm).

Next, using the first gate electrode layers 110, 111, 112a, 112b, and 113, and the second gate electrode layers 114, 115, 116a, 116b, and 117 as masks, doping with an n-type impurity element 151 is carried out to form first n-type impurity regions 140a, 140b, 141a, 141b, 142a, 142b, 142c, 143a, and 143b (see FIG. 3B). In this embodiment mode, doping is carried out using phosphine ($PH_3$) as a doping gas containing an impurity element (the doping gas is obtained by diluting $PH_3$ with hydrogen ($H_2$), and the percentage of $PH_3$ in the gas is 5%) under such conditions that the gas flow rate is 80 sccm, the beam current is 54 μA/cm, the acceleration voltage is 50 kV and the dosage is $7.0\times10^{13}$ ions/cm². Here, the doping is carried out so that the first n-type impurity regions 140a, 140b, 141a, 141b, 142a, 142b, 142c, 143a, and 143b contain the n-type impurity element at a concentration of about $1\times10^{17}$ to $5\times10^{18}$/cm³. In this embodiment mode, phosphorus (P) is used as the n-type impurity element.

In this specification, the impurity region which overlaps with the gate electrode layer with the gate insulating layer interposed therebetween is designated as a "Lov" region, while the impurity region which does not overlap with the gate electrode layer with the gate insulating layer interposed therebetween is designated as a "Loff" region. In FIGS. 3B and 3C, the impurity regions are designated by hatching on a white background. This does not mean that the white background portion is not doped with an impurity element, but is shown so that it will be intuitively understood that the concentration distribution of the impurity element in the region reflects mask or doping conditions. This also applies to the other drawings in this specification.

Next, masks 153a, 153b, 153c, and 153d that cover the semiconductor layer 103, part of the semiconductor layer 105, and the semiconductor layer 106 are formed. Using the masks 153a to 153d, the first gate electrode layer 111, and the second gate electrode layer 115 as masks, doping with an n-type impurity element 152 is carried out to form second n-type impurity regions 144a, 144b, 147a, 147b, and 147c, and third n-type impurity regions 148a, 148b, 148c, and 148d. In this embodiment mode, doping is carried out using $PH_3$ as a doping gas containing an impurity element (the doping gas is obtained by diluting $PH_3$ with hydrogen ($H_2$), and the percentage of $PH_3$ in the gas is 5%) under such conditions that the gas flow rate is 80 sccm, the beam current is 540 μA/cm, the acceleration voltage is 70 kV, and the dosage is $5.0\times10^{15}$ ions/cm². Here, the doping is carried out so that the second n-type impurity regions 144a, 144b, 147a, 147b, and 147c contain the n-type impurity element at a concentration of about $5\times10^{19}$ to $5\times10^{20}$/cm³. In addition, a channel formation region 146 is formed in the semiconductor layer 104, and channel formation regions 149a and 149b are formed in the semiconductor layer 105 (see FIG. 3C).

The second n-type impurity regions 144a, 144b, 147a, 147b, and 147c are high-concentration n-type impurity regions and function as source and drain regions. Meanwhile, the third n-type impurity regions 148a, 148b, 148c, and 148d are low-concentration n-type impurity regions and function as LDD (lightly doped drain) regions. The third n-type impurity regions 148a to 148d have an effect of lowering off-current because they are formed in the Loff regions which are not covered with the first gate electrode layers 112a and 112b, and the second gate electrode layers 116a and 116b. Accordingly, a more highly reliable display device which consumes less electric power can be manufactured. Although FIGS. 3B and 3C illustrate an example in which the low-concentration impurity regions that function as LDD regions are formed in the regions which are not formed to be thin in the semiconductor layers, the low-concentration impurity regions may be formed in the regions which are formed to be locally thin in the semiconductor layers, or may be formed so as to extend to both the regions which are formed to be thin and the regions which are not formed to be thin.

Next, the masks 153a to 153d are removed and masks 155a and 155b that cover the semiconductor layers 104 and 105, respectively, are formed. Using the masks 155a and 155b, the first gate electrode layers 110 and 113, and the second gate electrode layers 114 and 117 as masks, doping with a p-type impurity element 154 is carried out to form p-type impurity regions 160a, 160b, 163a, and 163b. In this embodiment mode, boron (B) is used as the impurity element; therefore, doping is carried out using diborane ($B_2H_6$) as a doping gas containing the impurity element (the doping gas is obtained by diluting $B_2H_6$ with hydrogen ($H_2$), and the percentage of $B_2H_6$ in the gas is 15%) under such conditions that the gas flow rate is 70 sccm, the beam current is 180 µA/cm, the acceleration voltage is 80 kV, and the dosage is $2.0 \times 10^{15}$ ions/cm$^2$. Here, the doping is carried out so that the p-type impurity regions 160a, 160b, 163a, and 163b contain the p-type impurity element at a concentration of about $1 \times 10^{20}$ to $5 \times 10^{21}$/cm$^3$. In addition, channel formation regions 162 and 165 are formed in the semiconductor layers 103 and 106, respectively (see FIG. 4A).

The p-type impurity regions 160a, 160b, 163a, and 163b are high-concentration p-type impurity regions, and function as source and drain regions.

The masks 155a and 155b are removed by $O_2$ ashing or with a resist stripper, whereby an oxide film is also removed. After that, insulating films, i.e., so-called sidewalls, may be formed so as to cover the side surfaces of the gate electrode layers. The sidewalls can be formed by a plasma CVD method or a low-pressure CVD (LPCVD) method using an insulating film containing silicon.

In order to activate the impurity element, heat treatment, strong light irradiation, or laser irradiation may further be carried out. In that case, the impurity element can be activated, while at the same time plasma damage to the gate insulating layers and the interface between the gate insulating layer and the semiconductor layer can be repaired.

Next, an interlayer insulating layer that cover the gate electrode layers and the gate insulating layers is formed. In this embodiment mode, the interlayer insulating layer has a stacked-layer structure of insulating films 167 and 168 (see FIG. 4B). The insulating films 167 and 168 each may be a silicon nitride film, a silicon nitride oxide film, a silicon oxynitride film, or a silicon oxide film formed by a sputtering method or plasma CVD. Further, another insulating film containing silicon may also be employed to have a single-layer structure or a stacked-layer structure including three or more layers.

Further, heat treatment is carried out under a nitrogen atmosphere at 300 to 550° C. for 1 to 12 hours to hydrogenate the semiconductor layers. Preferably, this step is carried out at 400 to 500° C. Through this step, dangling bonds in the semiconductor layers are terminated by hydrogen contained in the insulating film 167, which is the interlayer insulating layer. In this embodiment mode, heat treatment is carried out at 410° C. for one hour.

Furthermore, the insulating films 167 and 168 can also be formed using a material selected from aluminum nitride (AlN), aluminum oxynitride (AlON), aluminum nitride oxide (AlNO), which contains more nitrogen than oxygen, aluminum oxide, diamond-like carbon (DLC), carbon containing nitrogen (CN), and other substance containing an inorganic insulating material. Furthermore, a siloxane resin may also be used. The siloxane resin corresponds to a resin including a Si—O—Si bond. Siloxane has a skeleton structure formed of a bond of silicon (Si) and oxygen (O). As a substituent, an organic group containing at least hydrogen (e.g., an alkyl group or aromatic hydrocarbon) can be used. Further, a fluoro group may also be used. Furthermore, as a substituent, an organic group containing at least hydrogen, and a fluoro group may also be used. Still furthermore, an organic insulating material such as polyimide, acrylic, polyamide, polyimide amide, resist, benzocyclobutene, or polysilazane may also be used. A coated film which is formed by a coating method and has favorable planarity may also be used.

The insulating films 167 and 168 can be formed using dipping, spray coating, a doctor knife, a roll coater, a curtain coater, a knife coater, a CVD method, an evaporation method, or the like. The insulating films 167 and 168 may be formed by a droplet discharging method as well. If a droplet discharging method is used, a material liquid can be saved. Further, a method that enables transferring or drawing a pattern, e.g., a droplet discharging method such as a printing method (a method of forming a pattern such as screen printing or offset printing), can also be used.

Next, using a resist mask, contact holes (openings) that reach the semiconductor layers and the gate electrode layers are formed in the insulating films 167 and 168, and the gate insulating layers 108 and 109. Etching may be carried out one or more times depending on the selectivity of a material used. The insulating films 168 and 167, and the gate insulating layers 108 and 109 are removed by etching to form the openings that reach the p-type impurity regions 160a, 160b, 163a, and 163b, and the second n-type impurity regions 144a, 144b, 147a, and 147b which are source and drain regions. For the etching, wet etching, dry etching, or the both may be employed. As an etchant used in the wet etching, a hydrofluoric-acid-based solution, e.g., a mixed solution containing ammonium hydrogen fluoride and ammonium fluoride, is preferably used. As an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ can be appropriately used. In addition, an inert gas may be added to the etching gas to be used. As an inert element to be added, one or more kinds of elements selected from He, Ne, Ar, Kr, and Xe can be used.

A conductive film is formed so as to cover the openings, and the conductive film is etched to form source and drain electrode layers 169a, 169b, 170a, 170b, 171a, 171b, 172a, and 172b that are electrically connected to part of source and drain regions. The source and drain electrode layers can be formed by forming a conductive film by a PVD method, a CVD method, an evaporation method, or the like and then etching the conductive film into a desired shape. Further, the conductive layers can be selectively formed on given positions by a droplet discharging method, a printing method, an electrolytic plating method, or the like. Furthermore, a reflow method or a damascene method may be used. The source and drain electrode layers may be formed using a metal such as Ag, Au, Cu, Ni, Pt, Pd, Ir, Rh, W, Al, Ta, Mo, Cd, Zn, Fe, Ti, Zr, or Ba; Si, or Ge; or an alloy or nitride thereof. Further, a stacked structure thereof may be employed. In this embodiment mode, a titanium (Ti) film, a titanium nitride film, an aluminum film, and a titanium (Ti) film are formed to have thicknesses of 60 nm, 40 nm, 700 nm, and 200 nm, respectively, whereby a stacked-layer structure is formed; and the stacked films are processed into desired shapes.

In this embodiment mode, in the thin film transistors provided in the drive circuit region 204, because the channel formation regions 162 and 146 are formed to be locally thin, the regions of the p-type impurity regions 160a and 160b and the second n-type impurity regions 144a and 144b, which are the source and drain regions, in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

Through the above steps, an active matrix substrate that has a p-channel thin film transistor 173 having the p-type impurity regions and an n-channel thin film transistor 174 having the n-type impurity regions in the drive circuit region 204, and a multi-channel type n-channel thin film transistor 175 having the n-type impurity regions in the Loff regions and a p-channel thin film transistor 176 having the p-type impurity regions in the pixel region 206 can be manufactured (see FIG. 4C). The active matrix substrate can be used for a display device having a display element (e.g., a liquid crystal display element, or a light-emitting element).

The display device of this embodiment mode has the thin film transistors in each of the pixel region 206 and the drive circuit region 204, and is characterized in that the thickness of the channel formation regions 162 and 146 of the semiconductor layers 103 and 104 in the thin film transistors 173 and 174 provided in the drive circuit region 204 are smaller than the thickness of the channel formation regions 149a, 149b, and 165 of the semiconductor layers 105 and 106 in the thin film transistors 175 and 176 provided in the pixel region 206. Further, in the semiconductor layers 103 and 104 of the thin film transistors 173 and 174 provided in the drive circuit region 204, the channel formation regions 162 and 146 are formed to be locally thin while the regions of the source and drain regions which are in contact with the source and drain electrode layers are not formed to be thin and thus have a larger thickness than the channel formation regions.

In this embodiment mode, the gate insulating layer of the thin film transistors 173 and 174 provided in the drive circuit region 204 is also thinner than the gate insulating layer of the thin film transistors 175 and 176 provided in the pixel region 206.

In the display device of the present invention, the thickness of the channel formation regions 162 and 146 of the semiconductor layers 103 and 104 in the thin film transistors 173 and 174 provided in the drive circuit region 204 may be 5 to 30 nm, inclusive, preferably, 10 to 20 nm, inclusive. Meanwhile, the thickness of the source and drain regions of the semiconductor layers 103 and 104 in the thin film transistors 173 and 174 provided in the drive circuit region 204 and the semiconductor layers 105 and 106 (including the source regions, drain regions, and channel formation regions) in the thin film transistors 175 and 176 provided in the pixel region 206 may be 25 to 100 nm, inclusive, preferably, 50 to 60 nm, inclusive.

In the display device of the present invention, the thickness of the gate insulating layer 108 of the thin film transistors 173 and 174 provided in the drive circuit region 204 may be 1 to 10 nm, inclusive, preferably, about 5 nm. Meanwhile, the thickness of the gate insulating layer 109 of the thin film transistor 175 and 176 provided in the pixel region 206 may be 50 to 150 nm, inclusive, preferably, 60 to 80 nm, inclusive.

When the thickness of the channel formation regions 162 and 146 is large, in the case of a short channel length, current flows on the lower side in the channel formation regions 162 and 146 in a subthreshold region, where the value of the gate voltage is less than or equal to the threshold voltage, by the influence of an electric field between the source and the drain. Therefore, the subthreshold value is increased, and the threshold voltage is reduced. When the channel formation regions 162 and 146 are formed to be thin, paths where current flows on the lower sides in the channel formation regions 162 and 146 are blocked, and leakage current can be suppressed. Therefore, increase in subthreshold value can be suppressed, and reduction in threshold voltage can be suppressed. Accordingly, when the channel formation regions 162 and 146 are formed to be thin, the amount of change in threshold voltage toward negative values can be suppressed in a region where the channel length is short, and a thin film transistor whose subthreshold value is small can be manufactured. Since the subthreshold value is small, current flowing between the source and the drain at a gate voltage of 0 V can be suppressed, and the threshold voltage can be reduced.

By forming the channel formation regions in the semiconductor layers 103 and 104 in the drive circuit region 204 to be locally thin, the entire channel formation regions 162 and 146 are depleted and the short channel effect can be suppressed. In addition, threshold voltage of the thin film transistors can be lowered. Accordingly, miniaturization and high performance can be realized in the thin film transistors provided in the drive circuit region Consequently, the display device can be driven at a low voltage, and low power consumption can be realized. Further, because forming the channel formation regions in the semiconductor layers (or further, also the gate insulating layer) to be thin can miniaturize the thin film transistors, the area of the drive circuit region can be reduced, whereby the display device can have a narrower frame. Accordingly, the display device can be further downsized. In this specification, a peripheral region except for the pixel region in the display device is referred to as a "frame".

Further, in the thin film transistors provided in the drive circuit region 204, because the channel formation region is formed to be locally thin, the regions of the source and drain regions which are in contact with the source and drain electrode layers are not formed to be thin and thus are thicker than the channel formation region. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in the semiconductor device to be completed.

On the other hand, in the thin film transistors 175 and 176 provided in the pixel region 206, the semiconductor layers (or further, also the gate insulating layers) are kept thicker than those in the drive circuit regions, and thus, resistance to driving voltage can be enhanced and high reliability can be achieved.

Consequently, the display device of the present invention can achieve low power consumption and high reliability.

The thin film transistor provided in the pixel region is not limited to this embodiment mode, and may have a single gate structure, in which one channel formation region is formed, a double gate structure, in which two channel formation region are formed, or a triple gate structure, in which three channel formation regions are formed. Further, the thin film transistor in the drive circuit region may also have a single gate structure, a double gate structure, or a triple gate structure.

Without limitation to the manufacturing method of the thin film transistor described in this embodiment mode, the present invention can be applied to a top-gate structure (e.g., a planar structure), a bottom-gate structure (e.g., an inverted staggered structure), a dual-gate structure, in which two gate electrode layers are provided above and below a channel formation region each with a gate insulating film interposed therebetween, or other structures.

Figure 1B:
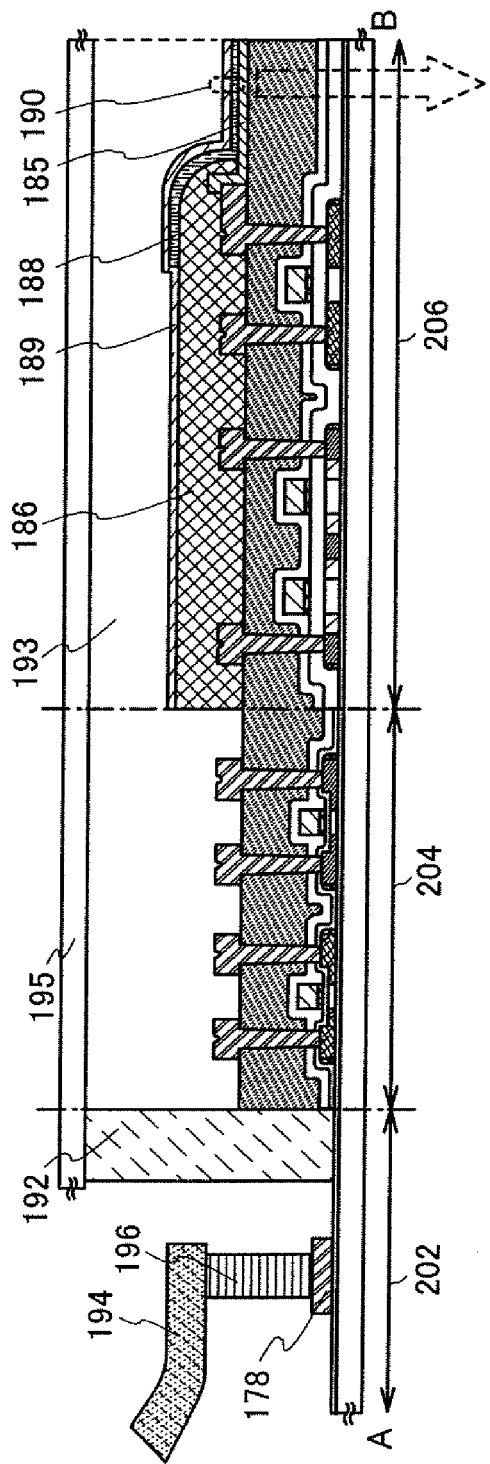

FIGS. 1A and 1B illustrate the display device of this embodiment mode, and show an external terminal connecting region 202, to which an FPC is attached, the drive circuit region 204, and the pixel region 206. A terminal electrode layer 178 to be connected to an external terminal is provided in the external terminal connecting region 202.

Next, a first electrode layer 185 (also referred to as a "pixel electrode layer") is formed so as to be in contact with the source or drain electrode layer. The first electrode layer 185 functions as an anode or a cathode, and may be formed using an element selected from Ti, Ni, W, Cr, Pt, Zn, Sn, In, and Mo; a film which contains an alloy or compound material containing the above element as a main component, such as titanium nitride, $TiSi_xN_y$, $WSi_x$, tungsten nitride, $WSi_xN_y$, or NbN; or stacked films thereof, to have a total thickness in a range of 100 to 800 nm.

In this embodiment mode, a light-emitting element is used as a display element. Further, the first electrode layer 185 has light-transmitting property because light from the light-emitting element is extracted from the first electrode layer 185 side. To form the first electrode layer 185, a transparent conductive film is formed and etched into a desired shape.

In the present invention, the first electrode layer 185 having a light-transmitting property may be formed using a transparent conductive film made of a conductive material having a light-transmitting property: indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide (ITSO) is added, or the like can also be used.

Further, even if a material such as a metal film which does not have a light-transmitting property is used, light can be emitted through the first electrode layer 185 by forming the layer to be thin (about 5 to 30 nm is preferable) so as to transmit light. Examples of the thin metal film that can be used for the first electrode layer 185 include a conductive film made of titanium, tungsten, nickel, gold, platinum, silver, aluminum, magnesium, calcium, lithium, or an alloy thereof.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. It is preferable to form the first electrode layer 185 with a total thickness in a range of 100 to 800 nm.

The first electrode layer 185 may be wiped or polished by a CMP method or using a polyvinyl-alcohol-based porous body so as to have a flat surface. Further, after the first electrode layer 185 is polished by a CMP method, ultraviolet irradiation, oxygen plasma treatment, or the like may be carried out to the surface of the first electrode layer 185.

After forming the first electrode layer 185, heat treatment may be carried out. Through this heat treatment, moisture contained in the first electrode layer 185 is discharged, so that the first electrode layer 185 is free from degasification. Accordingly, even when a light-emitting material which deteriorates easily due to moisture is used over the first electrode layer 185, the light-emitting material does not deteriorate, and thus a highly reliable display device can be manufactured.

Next, an insulating layer 186 (also referred to as a "partition", a "partition wall", or the like) that covers an end portion of the first electrode layer 185 and the source and drain electrode layers is formed. If the insulating layer 186 is formed using the same material and by the same method as those of the insulating film 168, manufacturing cost can be reduced. Further, reduction in cost can be achieved when an apparatus such as a coating film forming apparatus or an etching apparatus is used in common.

The insulating layer 186 can be formed using a material selected from silicon oxide, silicon nitride, silicon oxynitride, aluminum oxide, aluminum nitride, aluminum oxynitride, which contains more oxygen than nitrogen, aluminum nitride oxide, which contains more nitrogen than oxygen, diamond-like carbon (DLC), carbon containing nitrogen, polysilazane, and other substances containing an inorganic insulating material. A material containing siloxane may also be used. Further, an organic insulating material may be used. As the organic material, which may be either photosensitive or nonphotosensitive, polyimide, acryl, polyamide, polyimide amide, resist, or benzocyclobutene can be used. Furthermore, an oxazole resin, e.g., photo-curable polybenzoxazole, can be used. It is preferable to form the insulating layer 186 so as to have a continuously-changing radius of curvature, and thus coverage with an electroluminescent layer 188 and a second electrode layer 189 formed thereover is improved.

In addition, in order to further improve reliability, it is preferable to carry out degasification by vacuum heating before forming the electroluminescent layer 188. For example, before carrying out evaporation of an organic compound material, it is desirable to carry out heat treatment for removing a gas contained in the substrate under a reduced pressure atmosphere or an inert gas atmosphere at 200 to 400° C., preferably 250 to 350° C. Further, it is preferable to form the electroluminescent layer 188 by a vacuum deposition method or a droplet discharging method under a reduced pressure without exposure to atmospheric air. Through this heat treatment, moisture contained in or attached to the conductive film to be the first electrode layer or the insulating layer (the partition wall) can be discharged. This heat treatment can double as the prior heating step if the substrate can be transferred in a vacuum chamber without breaking the vacuum, and may be carried out for one time after forming the insulating layer (partition wall). Here, by forming the interlayer insulating film and the insulating layer (the partition wall) using a highly heat-resistant substance, a heat treatment step for improving the reliability can be sufficiently carried out.

Over the first electrode layer 185 is formed the electroluminescent layer 188. Although only one pixel is shown in FIG. 1B, electroluminescent layers corresponding to each color, R (red), G (green) and B (blue), are separately formed in this embodiment mode. The electroluminescent layer 188 may be formed as follows: by mixing an organic compound and an inorganic compound, a layer having a function of a high carrier injecting property and a high carrier transporting property, which cannot be obtained when only one of an organic compound and an inorganic compound is used, is provided over the first electrode layer 185.

Materials (a low-molecular material, a high-molecular material, or the like) which exhibit light-emission of red (R), green (G), and blue (B) can also be formed by a droplet discharging method.

Next, the second electrode layer 189 formed of a conductive film is provided over the electroluminescent layer 188. For the second electrode layer 189, a material having a low work function (e.g., Al, Ag, Li, Ca, or an alloy containing these metals, such as MgAg, MgIn, AlLi, $CaF_2$, or calcium nitride) may be used. In this manner, a light-emitting element 190 including the first electrode layer 185, the electroluminescent layer 188, and the second electrode layer 189 is formed.

Figure 14:
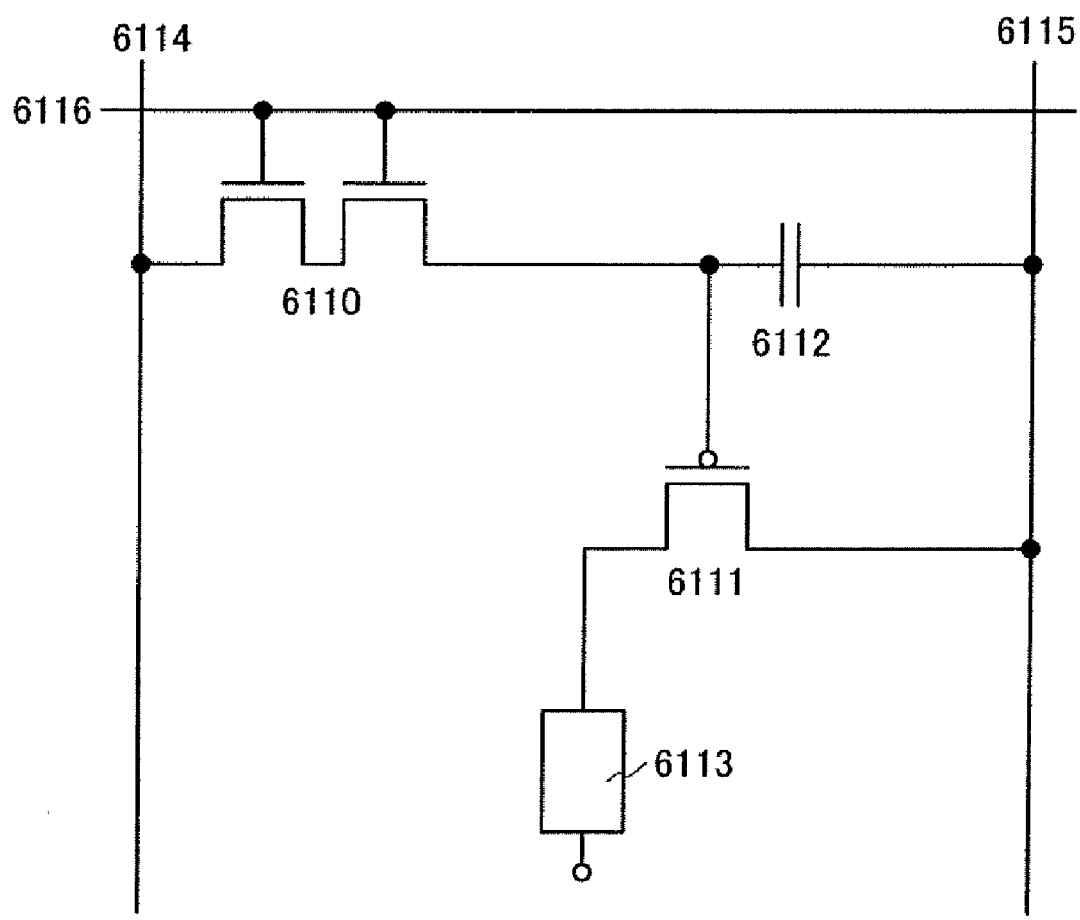
FIG. 14 is an equivalent circuit diagram of a display device of the present invention.

FIG. 14 illustrates an example of a circuit diagram of a pixel in this embodiment mode. In FIG. 14, the pixel includes transistors 6110 and 6111, a capacitor 6112, and a light-emitting element 6113. The transistor 6110, the transistor 6111, and the light-emitting element 6113 correspond to the thin film transistor 175, which is a multi-gate n-channel thin film transistor, the thin film transistor 176, which is a p-channel thin film transistor, and the light-emitting element 190, respectively, in FIG.

With regard to the transistor 6110, gates are connected to a line 6116, one of a source and drain is connected to a line 6114, and the other of the source and drain is connected to a gate of the transistor 6111 and one terminal of the capacitor 6112. With regard to the capacitor 6112, the one terminal is connected to the transistors 6110 and 6111, and the other terminal is connected to a line 6115. With regard to the transistor 6111, one of a source and drain is connected to the line 6115, and the other is connected to the light-emitting element 6113. The lines 6116, 6114, and 6115 function as a scanning (gate) line, a signal (source) line, and a power supply line, respectively. The transistor 6110 is a switching transistor, which has a switching function, and the transistor 6111 is a driving transistor.

In the display device of this embodiment mode shown in FIGS. 1A and 1B, light from the light-emitting element 190 is emitted through the first electrode layer 185 side by being transmitted in a direction of an arrow in FIG. 1B.

It is effective to provide a passivation film so as to cover the second electrode layer 189. The passivation film is formed of an insulating film containing silicon nitride, silicon oxide, silicon oxynitride (SiON), silicon nitride oxide (SiNO), aluminum nitride (AlN), aluminum oxynitride (AlON), which contains more oxygen than nitrogen, aluminum nitride oxide (AlNO), which contains more nitrogen than oxygen, aluminum oxide, diamond-like carbon (DLC), or carbon containing nitrogen. Further, the passivation film can be either a single layer or stacked layers of the insulating films. Furthermore, a siloxane resin may also be used.

As the passivation film, it is preferable to use a film with favorable coverage. For example, a carbon film, in particular, a DLC film is effective. Because a DLC film can be formed at temperatures ranging from the room temperature to 100° C., it can be easily formed even above the electroluminescent layer 188 having low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam evaporation method, a laser evaporation method, or the like. As a reactive gas used for forming the film, a hydrogen gas and a hydrocarbon-based gas (e.g., $CH_4$, $C_2H_2$, or $C_6H_6$) are used, and the reactive gas is ionized by glow discharge, and the ions are accelerated to collide with a negatively self-biased cathode, so that the film can be formed. In a case of forming a CN film, a $C_2H_4$ gas and a $N_2$ gas may be used as reactive gases. A DLC film has a high blocking effect against oxygen and can suppress oxidation of the electroluminescent layer 188. Therefore, the DLC film can prevent a problem that the electroluminescent layer 188 might be oxidized during a subsequent sealing step.

The substrate 100 over which the light-emitting element 190 is formed in the above manner and a sealing substrate 195 are bonded together using a sealant 192, thereby sealing the light-emitting element (see FIG. 1B). In the display device of the present invention, the sealant 192 and the insulating layer 186 are formed apart so as not to contact with each other. By forming the sealant 192 and the insulating layer 186 apart from each other, even when an insulating material which contains a highly hygroscopic organic material is used for the insulating layer 186, moisture does not easily enter and deterioration of the light-emitting element is prevented, thereby improving the reliability of the display device. As the sealant 192, typically, it is preferable to use a visible-light-curable resin, an ultraviolet-ray-curable resin, or a thermosetting resin. For example, an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidylamine-based resin, a heterocyclic epoxy resin, or a modified epoxy resin can be used. A region surrounded by the sealant may be filled with a filler 193, or with nitrogen or the like by sealing under a nitrogen atmosphere. Since a bottom emission type is employed in this embodiment mode, the filler 193 is not required to transmit light. However, in a case of extracting light through the filler 193, the filler 193 is required to transmit light. Typically, a visible-light curable, ultraviolet ray curable, or thermosetting epoxy resin may be used. Through the aforementioned steps, a display device having a display function using a light-emitting element of this embodiment mode is completed. Further, the filler may be dripped in a liquid state to fill the display device.

A drying agent is provided in an EL display panel in order to prevent deterioration of the element due to moisture. In this embodiment mode, a drying agent is provided on the sealing substrate 195 side so as not to block the light emitted from the light-emitting element.

Although this embodiment mode illustrates a case where the light-emitting element is sealed with a glass substrate, any of the following sealing treatment, which can protect the light-emitting element against moisture, can be used: a mechanical sealing method with a covering material, a sealing method with a thermosetting resin or an ultraviolet-ray-curable resin, or a sealing method with a thin film having a high barrier property such as metal oxide or metal nitride. As the covering material, glass, ceramics, plastics, or metal can be used. If light is to be emitted through the covering material, the covering material is required to transmit light. Further, the covering material and the substrate over which the light-emitting element is formed are bonded together with a sealant such as a thermosetting resin or an ultraviolet-ray-curable resin, and the resin is hardened through heat treatment or ultraviolet irradiation, so that an enclosed space is formed. It is also effective to provide a hygroscopic material typified by barium oxide in the enclosed space. This hygroscopic material may be provided on the sealant, or above the partition wall or in the peripheral portion so as not to block light emitted from the light-emitting element. Further, a space between the covering material and the substrate over which the light-emitting element is formed can also be filled with a thermosetting resin or an ultraviolet-ray-curable resin. In this case, it is effective to add a hygroscopic material typified by barium oxide into the thermosetting resin or the ultraviolet-ray-curable resin.

Although in the display device of this embodiment mode shown in FIGS. 1A and 1B, the source or drain electrode layer 172b and the first electrode layer 185 are in direct contact with each other to have an electrical connection, the source or drain electrode layer and the first electrode layer may be electrically connected to each other through another wiring layer. Further, an interlayer insulating layer may further be formed over the insulating film 168 so as to cover the source and drain electrode layers. Furthermore, although in FIGS. 1A and 1B, the first electrode layer 185 is formed partially over the source or drain electrode layer 172b, such a structure may also be employed: the first electrode layer 185 is formed, and then the source or drain electrode layer 172b is formed thereover so as to be in contact with the first electrode layer 185.

In this embodiment mode, in the external terminal connecting region 202, an FPC 194 is connected to the terminal electrode layer 178 through an anisotropic conductive layer 196, whereby electrical connection to the outside is obtained. Further, as shown in FIG. 1A, which is a top view of the display device, the display device manufactured in this embodiment mode is provided with a drive circuit region 208 having a scanning line drive circuit, in addition to the drive circuit region 204 having a signal line drive circuit.

Although the display device of this embodiment mode is constructed of the circuits as described above, the present invention is not limited thereto. For example, IC chips may be mounted as the drive circuits by a COG method or a TAB method as described above. Further, the number of the gate line drive circuit and source line drive circuit can be either one or plural.

Furthermore, the driving method for image display of the display device of the present invention is not particularly limited. For example, a dot sequential driving method, a line sequential driving method, a frame sequential driving method, or the like can be used. Typically, a line sequential driving method can be used, and a time division gray scale driving method or an area gray scale driving method may be combined appropriately. In addition, video signals to be input to source lines of the display device may be either analog signals or digital signals, and drive circuits and the like may be appropriately designed in accordance with the video signals.

Further, in a display device using a digital video signal, a video signal which is input into a pixel has a constant voltage (CV) or a constant current (CC). With regard to a video signal with a constant voltage (CV), voltage which is applied to a light-emitting element is constant (CVCV), or current which flows through a light-emitting element is constant (CVCC). Further, with regard to a video signal with a constant current (CC), voltage which is applied to a light-emitting element is constant (CCCV), or current which flows through a light-emitting element is constant (CCCC).

Using the present invention allows provision of a highly reliable display device which consumes less electric power.

Embodiment Mode 2

This embodiment mode illustrates other display devices that consume less electric power and are highly reliable, and manufacturing methods thereof with reference to FIGS. 5A to 5C, and 6A to 6C. This embodiment mode shows an example in which insulating layers with a sidewall structure are provided on the side surfaces of the gate electrode layers of the thin film transistors in the display device manufactured in Embodiment Mode 1. Therefore, repeated explanations of the same parts or parts with similar functions are omitted.

FIG. 5A shows a display device in a manufacturing step and corresponds to the display device in FIG. 3B shown in Embodiment Mode 1. In FIGS. 5A to 5C, thin film transistors are manufactured in a drive circuit region 214 and a pixel region 216.

Masks 702a and 702b to cover the semiconductor layers 104 and 105 are formed. Using the masks 702a and 702b, the first gate electrode layers 110 and 113, and the second gate electrode layers 114 and 117 as masks, doping with a p-type impurity element 701 is carried out to form p-type impurity regions 703a, 703b, 704a, and 704b. In this embodiment mode, boron (B) is used as the impurity element 701. Further, channel formation regions 705 and 706 are formed in the semiconductor layers 103 and 106, respectively (see FIG. 5B). The p-type impurity regions 703a, 703b, 704a, and 704b function as source and drain regions.

The masks 702a and 702b are removed, and insulating layers 708a to 708j with a sidewall structure are formed on side surfaces of the first gate electrode layers 110 to 113 and the second gate electrode layers 114 to 117 (see FIG. 5C). The insulating layers 708a to 708j may be formed as follows: after forming an insulating layer that covers the gate insulating layers 108 and 109, the first gate electrode layers 110 to 113, and the second gate electrode layers 114 to 117, the insulating layer is processed by anisotropic etching by an RIE (reactive ion etching) method, thereby forming the insulating layers 708a to 708j with a sidewall structure in a self-aligned manner on the side walls of the first gate electrode layers 110 to 113 and the second gate electrode layers 114 to 117. Here, the insulating layer is not particularly limited, but is preferably formed using silicon oxide which is formed by reacting TEOS (tetraethyl orthosilicate), silane, or the like and oxygen, nitrous oxide, or the like and has favorable step coverage. The insulating layer can be formed by a thermal CVD method, a plasma CVD method, a normal-pressure CVD method, a bias ECRCVD method, a sputtering method, or the like.

In etching the insulating layer, although the insulating layer over the second gate electrode layers is removed to expose the second gate electrode layers in this embodiment mode, the insulating layers 708a to 708j may be formed so that the insulating layer is left over the second gate electrode layers. In this embodiment mode, an insulating film 717 is formed as a protective film over the second gate electrode layers in a subsequent step. Protecting the second gate electrode layers in such a manner can prevent the thickness of the second gate electrode layers from being reduced in an etching process. Further, when silicide is formed in the source region and the drain region, a metal film deposited in formation of the silicide is not in contact with the gate electrode layers; therefore, even when the metal film and the gate electrode layers are formed of materials which easily react with each other, defects such as chemical reaction and diffusion can be prevented. The etching method may be dry or wet, and can employ various etching methods. In this embodiment mode, a dry etching method is used. As an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ may can be used appropriately.

A mask 710a covering the semiconductor layer 103, masks 710b and 710c covering parts of the semiconductor layer 105, and a mask 710d covering the semiconductor layer 106 are formed. Using the masks 710a to 710d, the first gate electrode layer 111, and the second electrode layer 115 as masks, doping with an n-type impurity element 709 is carried out to form second n-type impurity regions 711a, 711b, 712a, 712b, and 712c, and third n-type impurity regions 713a, 713b, 714a, 714b, 714c, and 714d. In this embodiment mode, phosphorus (P) is used as the impurity element 709. The doping is carried out so that the second n-type impurity regions 711a, 711b, 712a, 712b, and 712c contain the n-type impurity element at a concentration of about $5\times10^{19}$ to $5\times10^{20}/cm^3$. Further, a channel formation region 715 is formed in the semiconductor layer 104, and channel formation regions 716a and 716b are formed in the semiconductor layer 105 (see FIG. 6A).

The second n-type impurity regions 711a, 711b, 712a, 712b, and 712c are high-concentration n-type impurity regions and function as source and drain regions. Meanwhile, the third n-type impurity regions 713a, 713b, 714a, 714b, 714c, and 714d are low-concentration n-type impurity regions and function as LDD (lightly doped drain) regions. The third n-type impurity regions 713a, 713b, 714a, 714b, 714c, and 714d have an effect of lowering off-current because they are formed in the Loff regions which are not covered with the first gate electrode layers 111, 112a, and 112b, and the second gate electrode layers 115, 116a, and 116b. In this embodiment mode, the LDD regions of the thin film transistors in the drive circuit region 214 are formed in a self-aligned manner due to the insulating layers 708c and 708d with a sidewall structure, while the LDD regions of the thin film transistors in the pixel region 216, which is required to be resistant to a higher drive voltage, are formed using the masks 710b and 710c so as to be wider regions. Accordingly, a more highly reliable display device which consumes less electric power can be manufactured.

The insulating film 717 is formed over the gate insulating layers 108 and 109, the first gate electrode layers 110 to 113, and the second gate electrode layers 114 to 117, and the insulating layers 708a to 708j; and an insulating film 718 is formed over the insulating film 717 (see FIG. 6B). Openings that reach the source and drain regions of the semiconductor layers are provided in the gate insulating layers 108 and 109 and the insulating films 717 and 718, and source and drain electrode layers 719a, 719b, 720a, 720b, 721a, 721b, 722a, and 722b are formed in the openings. The insulating films 717 and 718, and the source and drain electrode layers 719a, 719b, 720a, 720b, 721a, 721b, 722a, and 722b can be formed using similar materials and through similar steps to those of the insulating films 167 and 168, and the source and drain electrode layers 169a, 169b, 170a, 170b, 171a, 171b, 172a, and 172b shown in Embodiment Mode 1, respectively.

In this embodiment mode, with regard to the thin film transistors provided in the drive circuit region 204, because the channel formation regions 705 and 715 are formed to be locally thin, the regions of the p-type impurity regions 703a and 703b, and the second n-type impurity regions 711a and 711b, which are the source and drain regions, in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

Through the above steps, an active matrix substrate that has a p-channel thin film transistor 724 having the p-type impurity regions and an n-channel thin film transistor 725 having the n-type impurity regions in the Loff regions in the drive circuit region 214, and a multi-channel type n-channel thin film transistor 726 having the n-type impurity regions in the Loff regions and a p-channel thin film transistor 727 having the p-type impurity regions in the pixel region 216 can be manufactured (see FIG. 6C). The active matrix substrate can be used for a display device having a display element (e.g., a liquid crystal display element, or a light-emitting element).

A display element that is electrically connected to the source or drain electrode layer 722b is formed and the display device of this embodiment mode can be completed. For example, as in Embodiment Mode 1, the first electrode layer is formed as a pixel electrode, and an EL layer containing a light-emitting material and the second electrode layer are stacked thereover to form the light-emitting element as the display element, whereby a light-emitting display device can be manufactured. Further, if a liquid crystal display element containing a liquid crystal material is provided over the pixel electrode layer, a liquid crystal display device can be manufactured.

The display device of this embodiment mode has thin film transistors in each of the pixel region 216 and the drive circuit region 214, and is characterized in that the thickness of the channel formation regions 705 and 715 of the semiconductor layers 103 and 104 in the thin film transistors 724 and 725 provided in the drive circuit region 214 are smaller than the thickness of the channel formation regions 716a, 716b, and 706 of the semiconductor layers 105 and 106 in the thin film transistors 726 and 727 provided in the pixel region 216. Further, in the semiconductor layers 103 and 104 of the thin film transistors 724 and 725 provided in the drive circuit region 214, the channel formation regions 705 and 715 are formed to be locally thin while the regions of the source and drain regions which are in contact with the source and drain electrode layers are not formed to be thin and thus have a larger thickness than the channel formation regions.

In this embodiment mode, the gate insulating layer of the thin film transistors 724 and 725 provided in the drive circuit region 214 is also thinner than the gate insulating layer of the thin film transistors 726 and 727 provided in the pixel region 216.

In the display device of the present invention, the thickness of the channel formation regions 705 and 715 of the semiconductor layers 103 and 104 in the thin film transistors 724 and 725 provided in the drive circuit region 214 may be 5 to 30 nm, inclusive, preferably, 10 to 20 nm, inclusive. Meanwhile, the thickness of the source and drain regions of the semiconductor layers 103 and 104 in the thin film transistors 724 and 725 provided in the drive circuit region 214 and the semiconductor layers 105 and 106 (including the source regions, drain regions, and channel formation regions) in the thin film transistors 726 and 727 provided in the pixel region 216 may be 25 to 100 nm, inclusive, preferably, 50 to 60 nm, inclusive.

In the display device of the present invention, the thickness of the gate insulating layer 108 of the thin film transistors 724 and 725 provided in the drive circuit region 214 may be 1 to 10 nm, inclusive, preferably, about 5 nm. Meanwhile, the thickness of the gate insulating layer 109 of the thin film transistor 726 and 727 provided in the pixel region 216 may be 50 to 150 nm, inclusive, preferably, 60 to 80 nm, inclusive.

When the thickness of the channel formation regions 705 and 715 is large, in the case of a short channel length, current flows on the lower side in the channel formation regions 705 and 715 in a subthreshold region, where the value of the gate voltage is less than or equal to the threshold voltage, by the influence of an electric field between the source and the drain. Therefore, the subthreshold value is increased, and the threshold voltage is reduced. When the channel formation regions 705 and 715 are formed to be thin, paths where current flows on the lower sides in the channel formation regions 705 and 715 are blocked, and leakage current can be suppressed. Therefore, increase in subthreshold value can be suppressed, and reduction in threshold voltage can be suppressed. Accordingly, when the channel formation regions 705 and 715 are formed to be thin, the amount of change in threshold voltage toward negative values can be suppressed in a region where the channel length is short, and a thin film transistor whose subthreshold value is small can be manufactured. Since the subthreshold value is small, current flowing between the source and the drain at a gate voltage of 0 V can be suppressed, and the threshold voltage can be reduced.

By forming the channel formation regions in the semiconductor layers 103 and 104 in the drive circuit region 214 to be locally thin, the entire channel formation regions 705 and 715 are depleted and the short channel effect can be suppressed. In addition, threshold voltage of the thin film transistors can be lowered. Accordingly, miniaturization and high performance can be realized in the thin film transistors provided in the drive circuit region. Consequently, the display device can be driven at a low voltage, and low power consumption can be realized. Further, because forming the channel formation regions in the semiconductor layers (or further, also the gate insulating layer) to be thin can miniaturize the thin film transistors, the area of the drive circuit region can be reduced, whereby the display device can have a narrower frame. Accordingly, the display device can be further downsized.

In this embodiment mode, it is preferable that the thin film transistor provided in the drive circuit region have shorter channel length than the thin film transistor provided in the pixel region. It is preferable that the thin film transistor provided in the drive circuit region in this embodiment mode have a channel length of 0.1 to 1 μm. Further, it is preferable that the thin film transistor provided in the pixel region have a channel length of 1 to 5 μm (more preferably, 1 to 3 μm).

On the other hand, in the thin film transistors 726 and 727 provided in the pixel region 216, the semiconductor layers (or further, also the gate insulating layers) are kept thicker than those in the drive circuit regions, and thus, resistance to driving voltage can be enhanced and high reliability can be achieved.

Consequently, the display device of the present invention can achieve low power consumption and high reliability.

Embodiment Mode 3

This embodiment mode illustrates another display device for achieving low power consumption and high reliability, and a manufacturing method thereof with reference to FIGS. 7A to 7D and 8A to 8C. This embodiment mode shows an example in which silicide is provided for the source and drain regions of the thin film transistors in the display devices manufactured in Embodiment Mode 1 and 2. Therefore, repeated explanations of the same parts or parts with similar functions are omitted.

FIG. 7A shows a display device in a manufacturing step and corresponds to the display device in FIG. 6A shown in Embodiment Mode 2. In FIGS. 7A to 7D, thin film transistors are manufactured in a drive circuit region 224 and a pixel region 226.

In this embodiment mode, as shown in FIGS. 7A to 7D, the shape of first gate electrode layers 750 to 753 is different from that of second gate electrode layers 754 to 757, and end portions of the first gate electrode layers 750 to 753 are not in alignment with those of the second gate electrode layers 754 to 757. The end portions of the first gate electrode layers 750 to 753 extend beyond those of the second gate electrode layers 754 to 757. Because the semiconductor layers are doped with an impurity element using the second gate electrode layers 754 to 757 as masks, impurity regions are formed in the semiconductor layers in regions over which the first gate electrode layers 750 to 753 do not overlap with the second gate electrode layers 754 to 757.

Accordingly, p-type impurity regions 758a and 758b are formed overlapping partly with the first gate electrode layer 750, second n-type impurity regions 759a and 759b are formed overlapping partly with the first gate electrode layer 751, second n-type impurity regions 760a and 760b are formed overlapping partly with the first gate electrode layer 752a, second n-type impurity regions 760c and 760d are formed overlapping partly with the first gate electrode layer 752b, and p-type impurity regions 761a and 761b are formed overlapping partly with the first gate electrode layer 753. The Lov region, which is the impurity region partially overlapping with the gate electrode layer in this manner with the gate insulating layer interposed therebetween, eases an electric field around the drain, whereby deterioration of on-current due to hot carriers can be suppressed. As a result, thin film transistors capable of high-speed operation can be formed.

Using the insulating layers 708a to 708j, the first gate electrode layers 750 to 753, and the second gate electrode layers 754 to 757 as masks, the gate insulating layers 108 and 109 are etched to expose the source and drain regions of the semiconductor layers 103 to 106. The gate insulating layers 108 and 109 are selectively etched to become gate insulating layers 762 to 765 (see FIG. 7B). Although in this embodiment mode, an example is shown in which the semiconductor layers are doped with the impurity element through the gate insulating layers, the gate insulating layers 108 and 109 may be etched to expose the semiconductor layers in forming the insulating layers 708a to 708j covering the side surfaces of the first gate electrode layers and the second gate electrode layers, and then the semiconductor layers may be doped with the impurity element.

A conductive film 766 is formed over the semiconductor layers 103 to 106, the insulating layers 708a to 709j, and the second gate electrode layers 754 to 757 (see FIG. 7C). As the conductive film 766, a film containing titanium (Ti), nickel (Ni), tungsten (W), molybdenum (Mo), cobalt (Co), zirconium (Zr), hafnium (Ha), tantalum (Ta), vanadium (V), neodymium (Nb), chromium (Cr), platinum (Pt), palladium (Pd), or the like is formed. Here, a nickel film is formed by a sputtering method.

Next, silicon contained in the semiconductor layers of the exposed source and drain regions is made to react with the conductive film 766 by heat treatment, a GRTA method, an LRTA method, or the like to form silicides 767a, 767h, 768a, 768b, 769a, 769b, 769c, 770a, 770b, 771a, 771b, 771c, and 771d. The silicide may be formed by laser irradiation or light irradiation with a lamp. After that, the conductive film 766 which has not reacted (is unreacted) with the semiconductor layer is removed (see FIG. 7D).

The unreacted conductive film can be removed by wet etching or dry etching. At this time, an etching gas or an etchant which has high etching selectivity of the unreacted conductive film with respect to that of other layers (e.g., the sidewall insulating layer, the gate electrode layer, the insulating layer, and the silicide) is used. That is, an etching gas or an etchant which has a high etching rate with respect to the conductive film and a low etching rate with respect to other layers may be used. For example, if the conductive film 766 is formed using nickel, the unreacted conductive film 766 can be removed by wet etching using a mixed solution of hydrochloric acid (HCl), nitric acid ($HNO_3$), and pure water ($H_2O$). The mixing ratio of the solutions can be $HCl:HNO_3:H_2O=3:2:1$, for example.

Next, an insulating film 772 containing hydrogen is formed as a passivation film. As the insulating film 772, an insulating film containing silicon may be formed by a plasma CVD method or a sputtering method to have a thickness of 100 to 200 nm, and can be formed using a similar material and through similar steps to those of the insulating film 167 shown in Embodiment Mode 1.

Further, heat treatment is carried out under a nitrogen atmosphere at 300 to 550° C. for 1 to 12 hours to hydrogenate the semiconductor layers. Preferably, this step is carried out at 400 to 500° C. Through this step, dangling bonds in the semiconductor layers are terminated by hydrogen contained in the insulating film 772.

Next, an insulating film 773 to function as an interlayer insulating film is formed (see FIG. 8A). In the present invention, it is preferable that the interlayer insulating film provided for planarization have high heat-resistance and high insulation, and have a high level of planarity. The insulating film 773 can be formed using a similar material and through similar steps to those of the insulating film 168 shown in Embodiment Mode 1.

Contact holes (Openings) that reach the semiconductor layers 103 to 106 are formed in the insulating films 772 and 773 using a resist mask. Etching may be carried out one time or a plurality of times depending on the selectivity of a material to be used. Through the etching, the openings that reach the silicides 767a, 767b, 768a, 768b, 769a, 769b, 770a, and 770b, which are source and drain regions, are formed.

A conductive film is formed and etched to form source and drain electrode layers 774a, 774b, 775a, 775b, 776a, 776b, 777a, and 777b that are electrically connected to the silicides 767a, 767b, 768a, 768b, 769a, 769b, 770a, and 770b, respectively. The source and drain electrode layers 774a, 774b, 775a, 775b, 776a, 776b, 777a, and 777b can be formed as follows: the conductive film is formed by a PVD method, a CVD method, an evaporation method, or the like and then etched into desired shapes. The conductive film can be formed selectively at given positions by a droplet discharging method, a printing method, an electrolytic plating method, or the like. A reflow method or a damascene method may also be used. The source and drain electrode layers 774a, 774b, 775a, 775b, 776a, 776b, 777a, and 777b may be formed using a metal such as Ag, Au, Cu, Ni, Pt, Pd, Ir, Rh, W, Al, Ta, Mo, Cd, Zn, Fe, Ti, Zr, or Ba; Si, or Ge; an alloy thereof, or metal nitride thereof. Further, a stacked structure thereof, such as Ti/Al/Ti, may be employed.

Although with regard to the display device shown in FIG. 8B, an example is shown in which the silicides 767a, 767h, 768a, 768b, 769a, 769b, 769c, 770a, and 770b are formed at surfaces of the impurity regions, which are source and drain regions, the silicide may be formed in the entire impurity regions, which function as source and drain regions. The silicide can be controlled by the thickness of the conductive films or heating conditions (e.g., temperature or time). An example in which the silicide is formed to be thicker and reaches the insulating layer 101 is shown in FIG. 8C.

In FIG. 8C, with regard to thin film transistors 790 and 791 in the drive circuit region 224, silicides 794a, 794b, 795a, and 795b are provided so as to be partly in contact with the insulating layer 101. With regard to thin film transistors 792 and 793 in the pixel region 226 as well, in the impurity regions that function as source and drain regions, silicides 796a, 796b, 796c, 797a, 797h, 797c, 797d, 798a, and 798b are formed to be thicker. In this embodiment mode, because the channel formation regions are formed to be locally thin and the source and drain regions are not formed to be thin in the semiconductor layers, the silicide can be sufficiently thick, whereby the resistance can be lowered.

Through the above steps, an active matrix substrate that has a p-channel thin film transistor 778 having the p-type impurity regions in the Lov region and an n-channel thin film transistor 779 having the n-type impurity regions in the Lov region in the drive circuit region 224, and a multi-channel type n-channel thin film transistor 780 having the n-type impurity regions in the Loff regions and the Lov regions and a p-channel thin film transistor 781 having the p-type impurity regions in the Lov region in the pixel region 226 can be manufactured (see FIG. 8B). The active matrix substrate can be used for a display device having a display element (e.g., a liquid crystal display element, or a light-emitting element). Because the thin film transistors 778 to 781 have silicide structures, they can have low resistance in the source and drain regions, whereby the display device can be operate at high speed. Further, the display device can reduce power consumption because it can operate at a low voltage.

In this embodiment mode, the side surfaces of the semiconductor layers are not in contact with the conductive film 766 for forming the silicide because the insulating layers (also referred to as the "sidewall insulating layers") are provided for the side surfaces of the semiconductor layers having a recessed shape. Therefore, etching of the side surfaces of the semiconductor layers in removing the unreacted conductive film can be prevented. Accordingly, a defect due to insufficient coverage at the end portion of the semiconductor layer with the gate insulating layer, e.g., a short circuit between the semiconductor layer and the gate electrode layer, occurrence of leakage current, or an electrostatic discharge, can be prevented.

In this embodiment mode, in the thin film transistors provided in the drive circuit region 224, because the channel formation regions are formed to be locally thin, the regions of the silicide and impurity regions, which are the source and drain regions, in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

A display element that is electrically connected to the source or drain electrode layer 777b is formed and the display device of this embodiment mode can be completed. For example, as in Embodiment Mode 1, the first electrode layer is formed as a pixel electrode, and an EL layer containing a light-emitting material and the second electrode layer are stacked thereover to form the light-emitting element as the display element, whereby a light-emitting display device can be manufactured. Further, if a liquid crystal display element containing a liquid crystal material is provided over the pixel electrode layer, a liquid crystal display device can be manufactured.

The display device of this embodiment mode has thin film transistors in each of the pixel region 226 and the drive circuit region 224, and is characterized in that the thickness of the channel formation regions 705 and 715 of the semiconductor layers 103 and 104 in the thin film transistors 778 and 779 provided in the drive circuit region 224 is smaller than the thickness of the channel formation regions in the semiconductor layers 105 and 106 in the thin film transistors 780 and 781 provided in the pixel region 226. Further, in the semiconductor layers 103 and 104 of the thin film transistors 778 and 779 provided in the drive circuit region 224, the channel formation regions 705 and 715 are formed to be locally thin while the regions of the source and drain regions which are in contact with the source and drain electrode layers are not formed to be thin and thus have a larger thickness than the channel formation regions.

In this embodiment mode, the gate insulating layer of the thin film transistors 778 and 779 provided in the drive circuit region 224 is also thinner than the gate insulating layer of the thin film transistors 780 and 781 provided in the pixel region 226.

In the display device of the present invention, the thickness of the channel formation regions 705 and 715 of the semiconductor layers 103 and 104 in the thin film transistors 778 and 779 provided in the drive circuit region 224 may be 5 to 30 nm, inclusive, preferably, 10 to 20 nm, inclusive. Meanwhile, the thickness of the source and drain regions of the semiconductor layers 103 and 104 in the thin film transistors 778 and 779 provided in the drive circuit region 224 and the semiconductor layers 105 and 106 (including the source regions, drain regions, and channel formation regions) in the thin film transistors 780 and 781 provided in the pixel region 226 may be 25 to 100 nm, inclusive, preferably, 50 to 60 nm, inclusive.

In the display device of this embodiment mode, the thickness of the gate insulating layer 108 of the thin film transistors 778 and 779 provided in the drive circuit region 224 may be 1 to 10 nm, inclusive, preferably, about 5 nm. Meanwhile, the thickness of the gate insulating layer 109 of the thin film transistor 780 and 781 provided in the pixel region 226 may be 50 to 150 nm, inclusive, preferably, 60 to 80 nm, inclusive.

When the thickness of the channel formation regions 705 and 715 is large, in the case of a short channel length, current flows on the lower side in the channel formation regions 705 and 715 in a subthreshold region, where the value of the gate voltage is less than or equal to the threshold voltage, by the influence of an electric field between the source and the drain. Therefore, the subthreshold value is increased, and the threshold voltage is reduced. When the channel formation regions 705 and 715 are formed to be thin, paths where current flows on the lower sides in the channel formation regions 705 and 715 are blocked, and leakage current can be suppressed. Therefore, increase in subthreshold value can be suppressed, and reduction in threshold voltage can be suppressed. Accordingly, when the channel formation regions 705 and 715 are formed to be thin, the amount of change in threshold voltage toward negative values can be suppressed in a region where the channel length is short, and a thin film transistor whose subthreshold value is small can be manufactured. Since the subthreshold value is small, current flowing between the source and the drain at a gate voltage of 0 V can be suppressed, and the threshold voltage can be reduced.

By forming the channel formation regions in the semiconductor layers 103 and 104 in the drive circuit region 224 to be locally thin, the entire channel formation regions 705 and 715 are depleted and the short channel effect can be suppressed. In addition, threshold voltage of the thin film transistors can be lowered. Accordingly, miniaturization and high performance can be realized in the thin film transistors provided in the drive circuit region. Consequently, the display device can be driven at a low voltage, and low power consumption can be realized. Further, because forming the channel formation regions in the semiconductor layers (or further, also the gate insulating layer) to be thin can miniaturize the thin film transistors, the area of the drive circuit region can be reduced, whereby the display device can have a narrower frame. Accordingly, the display device can be further downsized.

Further, in the thin film transistors provided in the drive circuit region 224, because the channel formation region is formed to be locally thin, the regions of the source and drain regions which are in contact with the source and drain electrode layers are not formed to be thin and thus are thicker than the channel formation region. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in the semiconductor device to be completed.

On the other hand, in the thin film transistors 780 and 781 provided in the pixel region 226, the semiconductor layers (or further, also the gate insulating layers) are kept thicker than those in the drive circuit regions, and thus, resistance to driving voltage can be enhanced and high reliability can be achieved.

In this embodiment mode, it is preferable that the thin film transistor provided in the drive circuit region have shorter channel length than the thin film transistor provided in the pixel region. It is preferable that the thin film transistor provided in the drive circuit region in this embodiment mode have a channel length of 0.1 to 1 μm. Further, it is preferable that the thin film transistor provided in the pixel region have a channel length of 1 to 5 μm (more preferably, 1 to 3 μm).

Consequently, the display device of the present invention can achieve low power consumption and high reliability.

Embodiment Mode 4

A display device having a light-emitting element can be formed by applying the present invention. Light is emitted from the light-emitting element by any of bottom emission, top emission, and dual emission. This embodiment mode will describe an example of a top emission or dual emission display device which is for achieving high reliability and has a high-quality display function with high contrast and excellent visibility with reference to FIGS. 11, 12, and 24.

Figure 12:
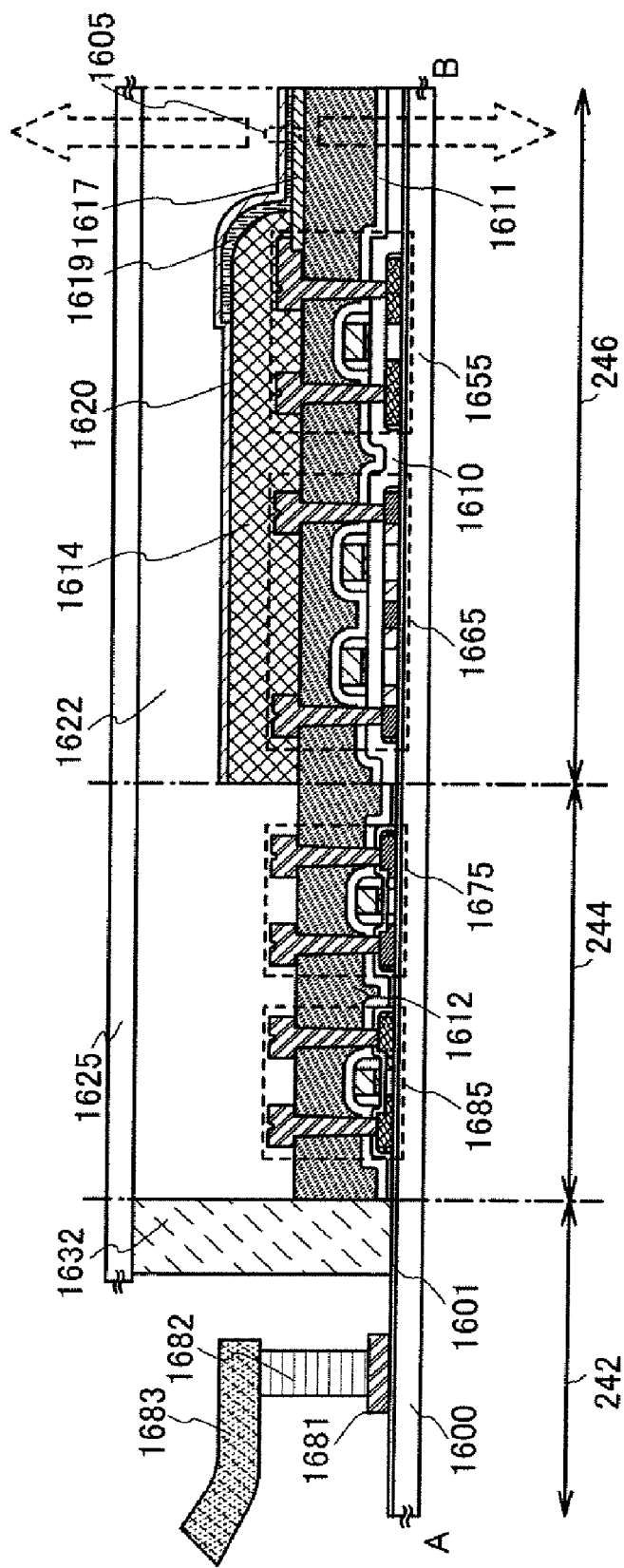
FIG. 12 is a diagram to illustrate a display device of the present invention.

A display device shown in FIG. 12 includes an element substrate 1600, thin film transistors 1655, 1665, 1675, and 1685, a first electrode layer 1617, a light-emitting layer 1619, a second electrode layer 1620, a filler 1622, a sealant 1632, an insulating film 1601, a gate insulating layer 1610, insulating films 1611 and 1612, an insulating layer 1614, a sealing substrate 1625, a terminal electrode layer 1681, an anisotropic conductive layer 1682, and an FPC 1683. The display device has an external terminal connecting region 242, a drive circuit region 244, and a pixel region 246. The filler 1622 is in a state of a liquid composition and can be formed by a dripping method. The element substrate 1600 over which the filler is formed by a dripping method and the sealing substrate 1625 are attached to each other, and thus, a light-emitting display device is sealed. Channel formation regions in semiconductor layers of the thin film transistors 1675 and 1685 in the drive circuit region 244 are formed to be locally thinner than those in semiconductor layers of the thin film transistors 1655 and 1665 in the pixel region 246. Further, the gate insulating layer 1610 in the drive circuit region is formed to be thinner than that in the pixel region.

The display device of FIG. 12 is a dual emission type, in which light is emitted from both the element substrate 1600 side and the sealing substrate 1625 side in directions indicated by arrows. Therefore, a light-transmitting electrode layer is used for each of the first electrode layer 1617 and the second electrode layer 1620.

In this embodiment mode, the first electrode layer 1617 and the second electrode layer 1620 that are light-transmitting electrode layers may be formed, specifically, using a transparent conductive film formed of a light-transmitting conductive material: for example, indium oxide containing tungsten oxide, indium zinc oxide containing tungsten oxide, indium oxide containing titanium oxide, or indium tin oxide containing titanium oxide can be used. It is needless to say that indium tin oxide (ITO), indium zinc oxide (IZO), indium tin oxide to which silicon oxide is added (ITSO), or the like can also be used.

Further, even if a material such as a metal which does not have a light-transmitting property is used, light can be emitted through the first electrode layer 1617 and the second electrode layer 1620 by forming the layer to be thin (about 5 to 30 nm is preferable) so as to transmit light. Examples of the thin metal film that can be used for the first electrode layer 1617 and the second electrode layer 1620 include a conductive film made of titanium, tungsten, nickel, gold, platinum, silver, aluminum, magnesium, calcium, lithium, or an alloy thereof.

As described above, in the display device of FIG. 12, light emitted from a light-emitting element 1605 passes through both the first electrode layer 1617 and the second electrode layer 1620, whereby light is emitted from both sides.

Figure 11:
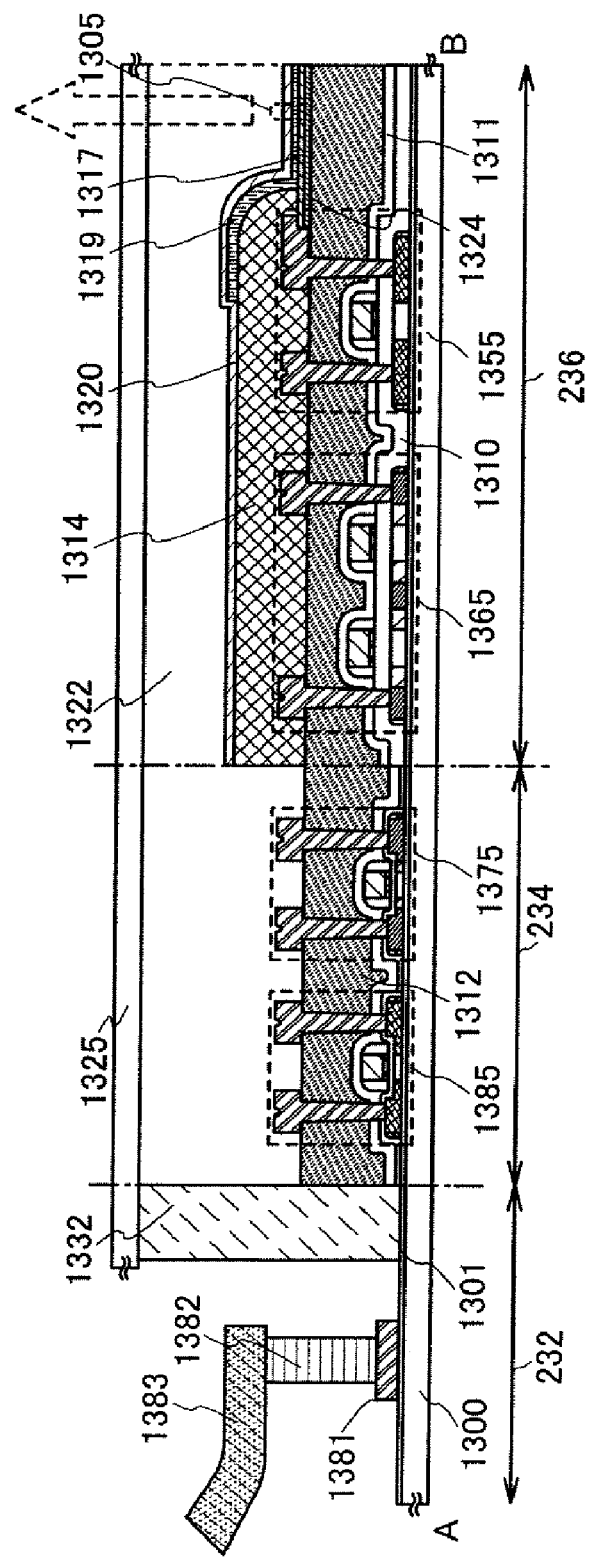
FIG. 11 is a diagram to illustrate a display device of the present invention.
Figure 24:
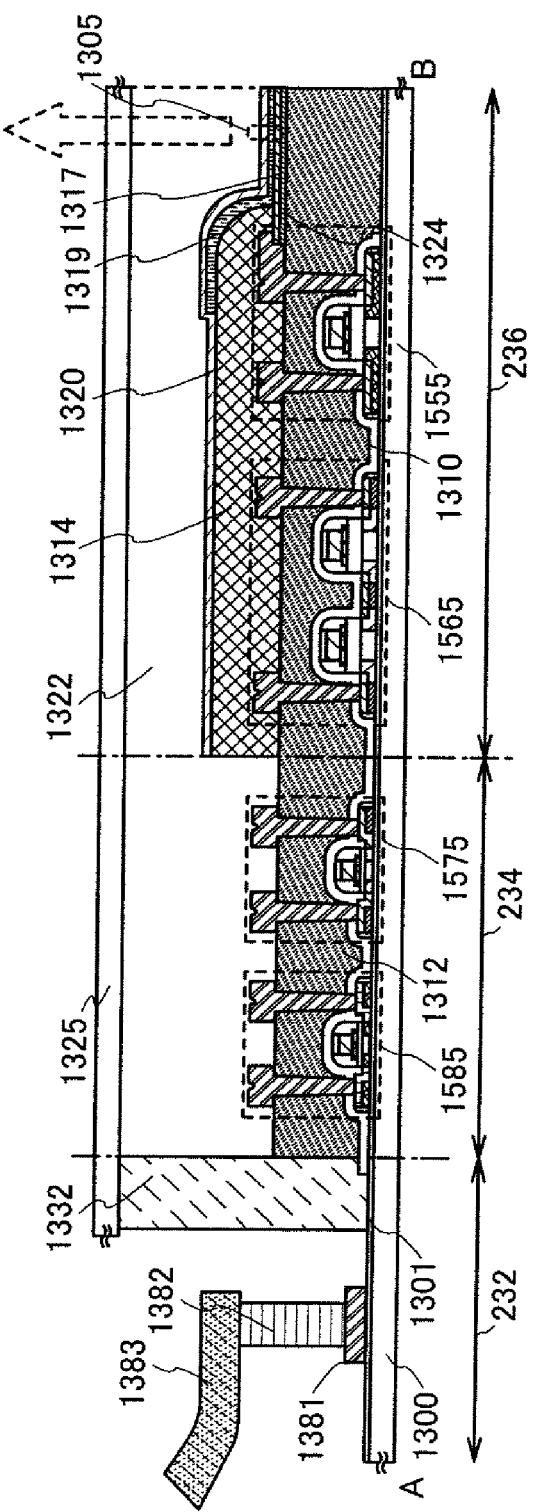
FIG. 24 is a diagram to illustrate a display device of the present invention.

Display devices shown in FIGS. 11 and 24 have a top emission structure, in which light is emitted in a direction indicated by an arrow. FIG. 11 shows a display device which includes an element substrate 1300, thin film transistors 1355, 1365, 1375, and 1385, a wiring layer 1324, a light-emitting element including a first electrode layer 1317, a light-emitting layer 1319 and a second electrode layer 1320, a filler 1322, a sealant 1332, an insulating film 1301, a gate insulating layer 1310, insulating films 1311 and 1312, an insulating layer 1314, a sealing substrate 1325, a terminal electrode layer 1381, an anisotropic conductive layer 1382, and an FPC 1383. Channel formation regions in semiconductor layers of the thin film transistors 1375 and 1385 in a drive circuit region 234 are formed to be locally thinner than those in semiconductor layers of the thin film transistors 1355 and 1365 in a pixel region 236. Further, the gate insulating layer 1310 in the drive circuit region may be formed to be thinner than that in the pixel region.

The display device shown in FIG. 24 is an example in which the structure of the thin film transistor is different from that in FIG. 11. Thin film transistors 1555 and 1565 are provided in the pixel region 236, and thin film transistors 1575 and 1585 are provided in the drive circuit region 234. Channel formation regions in semiconductor layers of the thin film transistors 1575 and 1585 in the drive circuit region 234 are formed to be locally thinner than those in semiconductor layers of the thin film transistors 1555 and 1565 in the pixel region 236. Further, a gate insulating layer in the drive circuit region may be formed to be thinner than that in the pixel region. The thin film transistors 1555, 1565, 1575, and 1585 each have silicide in source and drain regions. Silicide may be formed in the entire source and drain regions, or part of the source and drain regions. The thin film transistors 1555, 1565, 1575, and 1585 can be formed similarly to the thin film transistors described in Embodiment Mode 3.

In addition, the thin film transistors 1555, 1565, 1575, and 1585 each have insulating layers with a sidewall structure on side surfaces of gate electrode layers and another insulating layer over the gate electrode layers. By protection of the gate electrode layers with the insulating layers, when the insulating layers with a sidewall structure are formed by etching, the thickness of the gate electrode layers can be prevented from being reduced. Further, when silicide is formed in the source and drain regions, a metal film deposited in formation of silicide is not in contact with the gate electrode layers; therefore, even when the metal film and the gate electrode layers are formed of materials which easily react with each other, defects such as chemical reaction and diffusion can be prevented.

In each of the display devices shown in FIGS. 12 and 11, an insulating layer stacked over the terminal electrode layer is removed by etching. With a structure in which an insulating layer with moisture permeability is not provided in the periphery of the terminal electrode layer, reliability is further improved. The display device shown in FIG. 11 has an external terminal connecting region 232, the drive circuit region 234, and the pixel region 236. The display device of FIG. 11 has a structure in which the wiring layer 1324 that is a metal layer having reflectiveness is formed below the first electrode layer 1317 in the above-described dual emission display device shown in FIG. 12. The first electrode layer 1317 that is a transparent conductive film is formed over the wiring layer 1324. The wiring layer 1324 is to have reflectiveness; thus, a conductive film formed of titanium, tungsten, nickel, gold, platinum, silver, copper, tantalum, molybdenum, aluminum, magnesium, calcium, lithium, an alloy thereof, or the like may be used. Preferably, a substance having high reflectiveness in a visible light region is used, and a titanium nitride film is used in this embodiment mode. Further, the first electrode layer 1317 may also be formed of the conductive film having reflectiveness, and in that case, the wiring layer 1324 having reflectiveness is not required to be provided.

The first electrode layer 1317 and the second electrode layer 1320 may be formed, specifically, using a transparent conductive film formed of a light-transmitting conductive material: for example, indium oxide containing tungsten oxide, indium zinc oxide containing tungsten oxide, indium oxide containing titanium oxide, or indium tin oxide containing titanium oxide can be used. It is needless to say that indium tin oxide (ITO), indium zinc oxide (IZO), indium tin oxide to which silicon oxide is added (ITSO), or the like can also be used.

Further, even if a material such as a metal which does not have a light-transmitting property is used, light can be emitted through the second electrode layer 1320 by forming the layer to be thin (about 5 to 30 nm is preferable) so as to transmit light. Examples of the thin metal film that can be used for the second electrode layer 1320 include a conductive film made of titanium, tungsten, nickel, gold, platinum, silver, aluminum, magnesium, calcium, lithium, or an alloy thereof.

A pixel of a display device that is formed using a light-emitting element can be driven by a simple matrix mode or an active matrix mode. In addition, either digital driving or analog driving can be employed.

A color filter (colored layer) may be provided for the sealing substrate. The color filter (colored layer) can be formed by an evaporation method or a droplet discharging method. With the use of the color filter (colored layer), high-definition display can be performed. This is because a broad peak can be modified to be sharp in the light emission spectrum of each of R, G, and B by the color filter (colored layer).

Full color display can be performed by formation of a material to emit light of a single color and combination of the material with a color filter or a color conversion layer. The color filter (colored layer) or the color conversion layer may be provided for, for example, the sealing substrate, and the sealing substrate may be attached to the element substrate.

It is needless to say that display of single color light emission may also be performed. For example, an area color type display device may be formed by using single color light emission. The area color type is suitable for a passive matrix display portion, and can mainly display characters and symbols.

The thin film transistors provided in the display devices of this embodiment mode shown in FIGS. 11 and 12 can be formed similarly to the thin film transistors described in Embodiment Mode 2. The drive circuit region 214 in Embodiment Mode 2 corresponds to the drive circuit region 234 in FIG. 11 and the drive circuit region 244 in FIG. 12 in this embodiment mode. The pixel region 216 in Embodiment Mode 2 corresponds to the pixel region 236 in FIG. 11 and the pixel region 246 in FIG. 12 in this embodiment mode. However, this embodiment mode is not limited thereto, and the thin film transistors described in Embodiment Mode 1 or 3 and the active matrix substrate can be applied to forming a display device having a light-emitting element.

With the use of a crystalline semiconductor film, a pixel region and a drive circuit region can be formed over the same substrate. In that case, transistors in the pixel region and transistors in the drive circuit region are formed at the same time.

The display devices in this embodiment mode have the thin film transistors in the pixel regions 236 and 246 and the drive circuit regions 234 and 244, and are characterized in that the thicknesses of the channel formation regions in the semiconductor layers of the thin film transistors 1375, 1385, 1675, and 1685 provided in the drive circuit regions 234 and 244 are smaller than those of the channel formation regions in the semiconductor layers of the thin film transistors 1355, 1365, 1655, and 1665 provided in the pixel regions 236 and 246. Further, in the semiconductor layers of the thin film transistors 1375, 1385, 1675, and 1685 provided in the drive circuit regions 234 and 244, the channel formation regions are formed to be locally thin while the regions of the source and drain regions which are in contact with the source and drain electrode layers are not formed to be thin and thus have larger thicknesses than the channel formation regions.

Furthermore, in this embodiment mode, also the thicknesses of the gate insulating layers of the thin film transistors 1375, 1385, 1675, and 1685 provided in the drive circuit regions 234 and 244 are smaller than those in the thin film transistors 1355, 1365, 1655, and 1665 provided in the pixel regions 236 and 246.

In the display devices of the present invention, the thicknesses of the channel formation regions in the semiconductor layers of the thin film transistors 1375, 1385, 1675, and 1685 provided in the drive circuit regions 234 and 244 may be 5 to 30 nm, inclusive, preferably, 10 to 20 nm, inclusive. Meanwhile, the thicknesses of the source and drain regions in the semiconductor layers of the thin film transistors 1375, 1385, 1675, and 1685 provided in the drive circuit regions 234 and 244 and the semiconductor layers (including the source regions, the drain regions, and the channel formation regions) of the thin film transistors 1355, 1365, 1655, and 1665 provided in the pixel regions 236 and 246 may be 25 to 100 nm, inclusive, preferably, 50 to 60 nm, inclusive.

In the display devices of the present invention, the thicknesses of the gate insulating layers of the thin film transistors 1375, 1385, 1675, and 1685 provided in the drive circuit regions 234 and 244 may be 1 to 10 nm, inclusive, preferably, about 5 nm. Meanwhile, the thicknesses of the gate insulating layers of the thin film transistors 1355, 1365, 1655, and 1665 provided in the pixel regions 236 and 246 may be 50 to 150 nm, inclusive, preferably, 60 to 80 nm, inclusive.

When the thickness of the channel formation region is large, in the case of a short channel length, current flows on the lower side in the channel formation region in a subthreshold region, where the value of the gate voltage is less than or equal to the threshold voltage, by the influence of an electric field between the source and the drain. Therefore, the subthreshold value is increased, and the threshold voltage is reduced. When the channel formation region is formed to be thin, a path where current flows on the lower side in the channel formation region is blocked, and leakage current can be suppressed. Therefore, increase in subthreshold value can be suppressed, and reduction in threshold voltage can be suppressed. Accordingly, when the channel formation region is formed to be thin, the amount of change in threshold voltage toward negative values can be suppressed in a region where the channel length is short, and a thin film transistor whose subthreshold value is small can be manufactured. Since the subthreshold value is small, current flowing between the source and the drain at a gate voltage of 0 V can be suppressed, and the threshold voltage can be reduced.

By forming the channel formation regions in the semiconductor layers in the drive circuit regions 234 and 244 to be locally thin, the entire channel formation regions are depleted and the short channel effect can be suppressed. In addition, the threshold voltage of the thin film transistor can be lowered. Accordingly, miniaturization and high performance can be realized in the thin film transistors provided in the drive circuit regions. Consequently, the display device can be driven at a low voltage, and low power consumption can be realized. Further, because forming the channel formation region in the semiconductor layer (or further, also the gate insulating layer) to be thin can miniaturize the thin film transistors, the area of the drive circuit region can be reduced, whereby the display device can have a narrower frame. Accordingly, the display device can be further downsized.

On the other hand, in the thin film transistors 1355, 1365, 1655, and 1665 provided in the pixel regions 236 and 246, the semiconductor layers (or further, also the gate insulating layers) are kept thicker than those in the drive circuit regions, and thus, resistance to driving voltage can be enhanced and high reliability can be achieved.

With regard to the thin film transistors provided in the drive circuit region 234 and 244, because the channel formation regions are formed to be locally thin, the regions of the source and drain regions which are in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

Accordingly, the display device of the present invention can achieve low power consumption and high reliability.

This embodiment mode can be combined with Embodiment Modes 1 to 3 as appropriate.

Embodiment Mode 5

This embodiment mode will describe an example of a display device for achieving low power consumption and high reliability. Specifically, a light-emitting display device using a light-emitting element for a display element will be described.

This embodiment mode will describe structures of light-emitting elements that can be used for display elements in the display device of the present invention with reference to FIGS. 18A to 18D.

FIGS. 18A to 18D illustrate structures of a light-emitting element in which an EL layer 860 is sandwiched between a first electrode layer 870 and a second electrode layer 850. The EL layer 860 includes a first layer 840, a second layer 803, and a third layer 802 as shown in the drawings. In FIGS. 18A to 18D, the second layer 803 is a light-emitting layer, and the first layer 804 and the third layer 802 are functional layers.

The first layer 804 is a layer having a function of transporting holes to the second layer 803. In FIGS. 18A to 18D, a hole-injecting layer included in the first layer 804 includes a substance having a high hole-injecting property, and molybdenum oxide, vanadium oxide, ruthenium oxide, tungsten oxide, manganese oxide, or the like can be used. Further, the following can also be used: a phthalocyanine-based compound such as phthalocyanine (abbrev.: H$_2$Pc) or copper phthalocyanine (abbrev.: CuPc); an aromatic amine compound such as 4,4'-bis[N-(4-diphenylaminophenyl)-N-phenylamino]biphenyl (abbrev.: DPAB) or 4,4'-bis(N-{4-[N-(3-methylphenyl)-N-phenylamino]phenyl}-N-phenylamino) biphenyl (abbrev.: DNTPD); a high molecule such as poly (ethylene dioxythiophene)/poly(styrenesulfonic acid) (abbrev.: PEDOT/PSS); and the like.

Further, a composite material including an organic compound and an inorganic compound can be used as the hole-injecting layer. In particular, a composite material including an organic compound and an inorganic compound showing an electron-accepting property with respect to the organic compound is excellent in hole-injecting property and hole-transporting property since electrons are transferred between the organic compound and the inorganic compound and carrier density is increased.

Further, in the case where a composite material including an organic compound and an inorganic compound is used as the hole-injecting layer, the hole-injecting layer can form an ohmic contact with the electrode layer; therefore, a material of the electrode layer can be selected regardless of work function.

As the inorganic compound used for the composite material, an oxide of a transition metal is preferably used. In addition, an oxide of a metal in Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic amine hydrocarbon, or a high molecular compound (e.g., an oligomer, a dendrimer, or a polymer). Note that, as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property. Examples of the organic compound which can be used for the composite material are specifically listed below.

For example, as examples of the aromatic amine compound, the following can be given: N,N'-di(p-tolyl)-N,N'-diphenyl-p-phenylenediamine (abbrev.: DTDPPA); 4,4'-bis [N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl) amino]-9-phenylcarbazole (abbrev.: PCzPCN1); and the like.

Further, the following can also be used: 4,4'-di(N-carbazolyl)biphenyl (abbrev.: CBP); 1,3,5-tris[4-(N-carbazolyl) phenyl]benzene (abbrev.: TCPB); 9-[4-(N-carbazolyl)]phenyl-10-phenylanthracene (abbrev.: CzPA); 1,4-bis[4-(V-carbazolyl)phenyl]-2,3,5,6-tetraphenylbenzene; and the like.

Further, as examples of the aromatic hydrocarbon which can be used for the composite material, the following can be given: 2-tert-butyl-9,10-di(2-naphthyl)anthracene (abbrev.: t-BuDNA); 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl) anthracene (abbrev.: DMNA); 2-tert-butyl-9,10-bis[2-(1-naphthyl)phenyl]anthracene; 9,10-bis[2-(1-naphthyl) phenyl]anthracene; 2,3,6,7-tetramethyl-9,10-di(1-naphthyl) anthracene; 2,3,6,7-tetramethyl-9,10-di(2-naphthyl) anthracene; 9,9'-bianthryl; 10,10'-diphenyl-9,9-bianthryl; 10,10'-bis(2-phenylphenyl)-9,9'-bianthryl; 10,10'-bis[(2,3,4, 5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of greater than or equal to $1 \times 10^{-6}$ cm$^2$/Vs and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK) or poly(4-vinyltriphenylamine) (abbrev.: PVTPA) can also be used.

As a substance for forming a hole-transporting layer included in the first layer 804 in FIGS. 18A to 18D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4"-tris(N,N-diphenyl-amino)triphenylamine and 4,4',4"-tris[N-(3-methylphenyl)-N-phenylamino]triphenylamine. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. With reference to FIGS. 18A to 18D, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), or bis(2-methyl-8-quinolinolato)(4-phenylphenolato)aluminum (abbrev.: BAlq) can be used. Further, a metal complex or the like including an oxazole-based or thiazole-based ligand, such as bis[2-(2-hydroxyphenyl)benzoxazolato]zinc (abbrev.: Zn(BOX)$_2$) or bis[2-(2-hydroxyphenyl)benzothiazolato]zinc (abbrev.: Zn(BTZ)$_2$) can be used. Besides the above metal complexes, the following can be used: 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-triazole (abbrev.: TAZ), bathophenanthroline (abbrev.: BPhen); bathocuproine (abbrev.: BCP); and the like. These substances described here are mainly substances each having an electron mobility of greater than or equal to $10^{-6}$ cm$^2$/Vs. Further, other substances may also be used as the electron transporting layer as long as an electron transporting property thereof is higher than a hole transporting property. The electron transporting layer is not limited to a single layer and may be a stacked layer which includes two or more layers each containing the aforementioned substance.

With reference to FIGS. 18A to 18D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof (e.g., a layer of Alq containing magnesium (Mg)) or the like can be used. It is preferable to use the layer which is made of a substance having an electron-transporting property and contains an alkali metal or an alkaline earth metal as the electron-injecting layer since electron injection from the electrode layer is efficiently performed.

Then, the second layer 803 which is a light-emitting layer is described. The light-emitting layer has a function of emitting light and includes an organic compound having a light-emitting property. Further, the light-emitting layer may include an inorganic compound. The light-emitting layer may be formed using various light-emitting organic compounds and inorganic compounds. The thickness of the light-emitting layer is preferably about 10 to 100 nm.

There are no particular limitations on the organic compound used for the light-emitting layer as long as it is a light-emitting organic compound. The organic compounds include, for example, 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino)styryl]-4H-pyran (abbrev.: DCM1), 4-(dicyanomethylene)-2-methyl-6-[2-(joulolidin-9-yl)ethenyl]-4H-pyran (abbrev.: DCM2), and 4-(dicyanomethylene)-2,6-bis[p-(dimethylamino)styryl]-4H-pyran (abbrev.: BisDCM). Further, a compound capable of emitting phosphorescence such as bis[2-(4',6'-difluorophenyl)pyridinato-N,C$^{2'}$]iridium(picolinate) (abbrev.: FIrpic), bis{2-[3',5'-bis(trifluoromethyl)phenyl]pyridinato-N,C$^{2'}$}iridium(picolinate) (abbrev.: Ir(CF$_3$ppy)$_2$(pic)), tris(2-phenylpyridinato-N,C$^{2'}$)iridium (abbrev.: Ir(Ppy)$_3$), bis(2-phenylpyridinato-N,C$^{2'}$)iridium(acetylacetonate) (abbrev.: Ir(ppy)$_2$(acac)), bis[2-(2'-thienyl)pyridinato-N,C$^{3'}$]iridium (acetylacetonate) (abbrev.: Ir(thp)$_2$(acac)), bis(2-phenylquinolinato-N,C$^{2'}$)iridium(acetylacetonate) (abbrev.: Ir(pq)$_2$(acac)), or bis[2-(2'-benzothienyl)pyridinato-N,C$^{3'}$]iridium(acetylacetonate) (abbrev.: Ir(btp)$_2$(acac)) may be used.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, only a small amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element to emit light of green that has high visibility for human eyes with the use of a triplet excitation light-emitting material.

The light-emitting layer may be formed of not only the organic compound described above, which emits light, but another organic compound may also be added thereto. Examples of the organic compound that can be added include TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbrev.: CBP), and 1,3,5-tris[4-(N-carbazolyl)phenyl]benzene (abbrev.: TCPB). However, the present invention is not limited thereto. It is preferable that the organic compound which is added have larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, a light-emitting layer corresponding to each of R (red), G (green), and B (blue) is formed. Also in this case, color purity can be improved and a pixel region can be prevented from having a mirror surface (reflecting) by provision of a filter which transmits light of the emission wavelength range on the light-emission side of the pixel. By provision of the filter, a circularly polarizing plate or the like that has been considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has higher physical strength and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride may be used. In particular, a metal oxide having a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a display device which is formed using a light-emitting element can be driven by a simple matrix mode or an active matrix mode. In any case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a light-emitting display device can be improved. In addition, either digital driving or analog driving can be applied.

A color filter (colored layer) may be provided for a sealing substrate. The color filter (colored layer) can be formed by an evaporation method or a droplet discharging method. High-definition display can be performed with the use of the color filter (colored layer). This is because a broad peak can be modified to be sharp in a light emission spectrum of each of R, G, and B by the color filter (colored layer).

Full color display can be performed by formation of a material emitting light of a single color and combination of the material with a color filter or a color conversion layer. The color filter (colored layer) or the color conversion layer may be provided for, for example, the sealing substrate, and the sealing substrate may be attached to the element substrate.

It is needless to say that display of single color light emission may also be performed. For example, an area color type display device may be formed by using single color light emission. The area color type is suitable for a passive matrix display portion, and can mainly display characters and symbols.

Figure 18A:
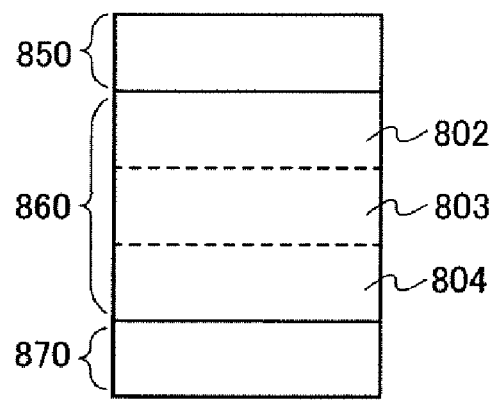
FIGS. 18A to 18D are diagrams to illustrate structures of light-emitting elements which can be applied to the present invention.
Figure 18B:
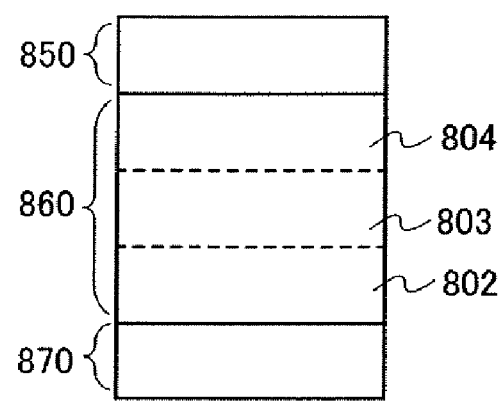

Materials for the first electrode layer 870 and the second electrode layer 850 are necessary to be selected considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as shown in FIG. 18A. In the case where the polarity of the driving thin film transistor is an n-channel type, the first electrode layer 870 may serve as a cathode and the second electrode layer 850 may serve as an anode as shown in FIG. 18B. Materials that can be used for the first electrode layer 870 and the second electrode layer 850 are described below. It is preferable to use a material having a high work function (specifically, a material having a work function of greater than or equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron transporting property, both the first electrode layer 870 and the second electrode layer 850 are scarcely restricted by a work function and various materials can be used.

The light-emitting elements in FIGS. 18A and 18B each have a structure in which light is extracted from the first electrode layer 870 and thus, the second electrode layer 850 is not necessary to have a light-transmitting property. The second electrode layer 850 may be formed of a film mainly containing an element selected from Ti, Ni, W, Cr, Pt, Zn, Sn, In, Ta, Al, Cu, Au, Ag, Mg, Ca, Li and Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing types of the first electrode layer 870 and the second electrode layer 850.

FIG. 18B shows the case where the EL layer 860 is formed by stacking the third layer 802, the second layer 803, and the first layer 804 in this order from the first electrode layer 870 side.

Figure 18C:
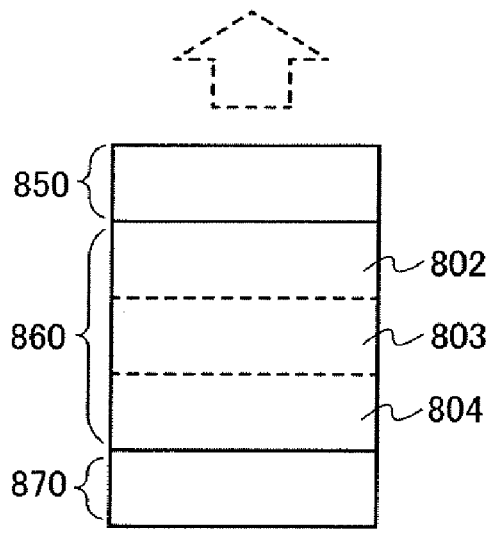
Figure 18D:
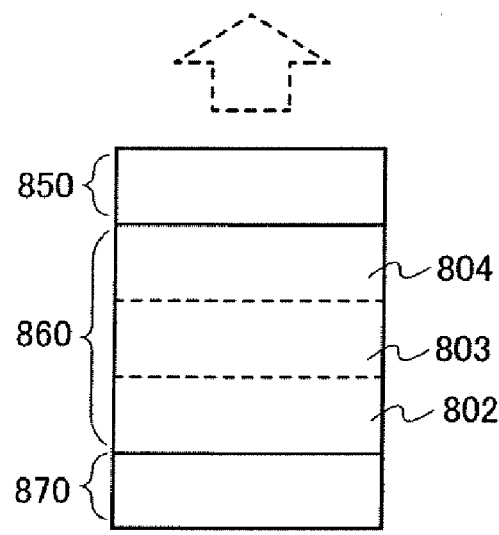

In FIG. 18C, an electrode layer having reflectiveness is used for the first electrode layer 870, and an electrode layer having a light-transmitting property is used for the second electrode layer 850 in the structure of FIG. 18A. Light emitted from the light-emitting element is reflected at the first electrode layer 870, transmitted through the second electrode layer 850, and emitted to the outside. Similarly, in FIG. 18D, an electrode layer having reflectiveness is used for the first electrode layer 870, and an electrode layer having a light-transmitting property is used for the second electrode layer 850 in the structure of FIG. 18B. Light emitted from the light-emitting element is reflected at the first electrode layer 870, transmitted through the second electrode layer 850, and emitted to the outside.

Further, various methods can be used as a method for forming the EL layer 860 if an organic compound and an inorganic compound are mixed therein. For example, the methods include a co-evaporation method for vaporizing both an organic compound and an inorganic compound by resistance heating. Further, for co-evaporation, an inorganic compound may be vaporized by an electron beam (EB) while an organic compound is vaporized by resistance heating. Furthermore, a method for sputtering an inorganic compound while vaporizing an organic compound by resistance heating to deposit the both at the same time may be used. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharging method, or the like can be used.

This embodiment mode can be combined with Embodiment Modes 1 to 4 as appropriate.

In this manner, with the use of the present invention, a display device having a light-emitting element, which consumes less power and has high reliability, can be provided.

Embodiment Mode 6

This embodiment mode will describe other examples of a display device having a light-emitting element for achieving low power consumption and high reliability. In this embodiment mode, other structures that can be applied to the light-emitting element in the display device of the present invention will be described with reference to FIGS. 16A to 16C and 17A to 17C.

Light-emitting elements using electroluminescence can be roughly classified into light-emitting elements that use an organic compound as a light-emitting material and light-emitting elements that use an inorganic compound as a light-emitting material. In general, the former is referred to as an organic EL element, while the latter is referred to as an inorganic EL element.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particulate light-emitting materials are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As types of light-emission mechanisms, there are luminescence obtained by donor-acceptor recombination which utilizes a donor level and an acceptor level, and local luminescence which utilizes inner-shell electron transition of metal ions. In general a dispersion-type inorganic EL element exhibits luminescence through donor-acceptor recombination, while a thin-film-type inorganic EL element exhibits local luminescence in many cases.

A light-emitting material that can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid-phase method includes the steps of weighing a base material and an impurity element or a compound containing an impurity element, mixing them in a mortar, and heating and baking them in an electric furnace, so that reaction occurs and the impurity element is contained in the base material. The baking temperature is preferably 700 to 1500° C. This is because the solid-phase reaction will not proceed at too low temperature, whereas the base material will be decomposed at too high temperature. The baking may be performed in a powder state; however, it is preferably performed in a pellet state. Although the solid-phase method requires baking at relatively high temperature, the solid-phase method is easy to perform and has high productivity. Thus, it is suitable for mass production.

A liquid-phase method (a coprecipitation method) includes the steps of reacting a base material or a compound containing a base material with an impurity element or a compound containing an impurity element in a solution, drying them, and baking them. Particles of a light-emitting material are uniformly diffused, whereby reaction can proceed even when the particle size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), or barium gallium sulfide ($BaGa_2S_4$), or the like.

For a luminescence center of an EL element which exhibits local luminescence, the following can be used: manganese (Mn), copper (Cu), samarium (Sm), terbium (Th), erbium (Er), thulium (Tm), europium (Eu), cerium (Ce), praseodymium (Pr), and the like. Note that a halogen element such as fluorine (F) or chlorine (Cl) may also be added. A halogen element can function to compensate electric charge.

Meanwhile, for a luminescence center of an EL element which exhibits luminescence through donor-acceptor recombination, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits luminescence through donor-acceptor recombination by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because the solid-phase reaction will not proceed at too low temperature, whereas the base material will be decomposed at too high temperature. The baking may be performed in a powder state; however, it is preferably performed in a pellet state.

In the case of performing solid-phase reaction, it is also possible to use a compound containing the first impurity element and the second impurity element as the impurity element. In that case, the impurity elements can be easily diffused, and solid-phase reaction can easily proceed; therefore, a uniform light-emitting material can be obtained. Further, since unnecessary impurity elements are not mixed, a light-emitting material with high purity can be obtained. Examples of the compound containing the first impurity element and the second impurity element include copper chloride (CuCl) and silver chloride (AgCl).

Note that the concentration of the impurity element with respect to the base material may be 0.01 to 10 at. %, preferably, 0.05 to 5 at. %.

With regard to a thin-film-type inorganic EL element, an electroluminescent layer contains the above-described light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 16A:
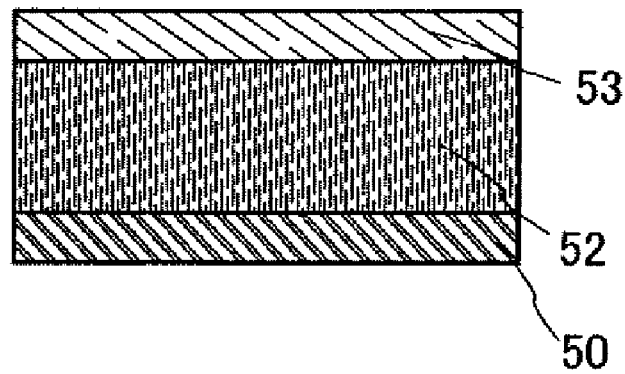
FIGS. 16A to 16C are diagrams to illustrate structures of light-emitting elements which can be applied to the present invention.
Figure 16B:
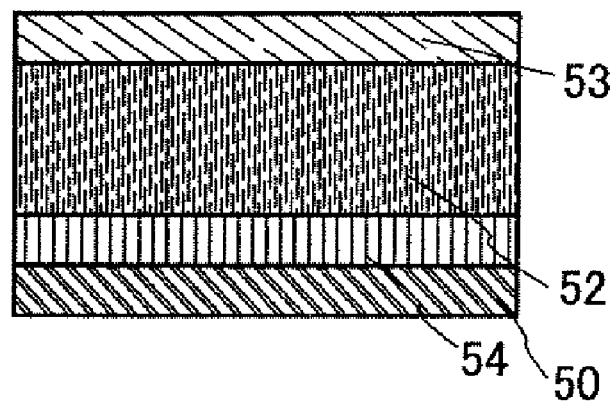
Figure 16C:
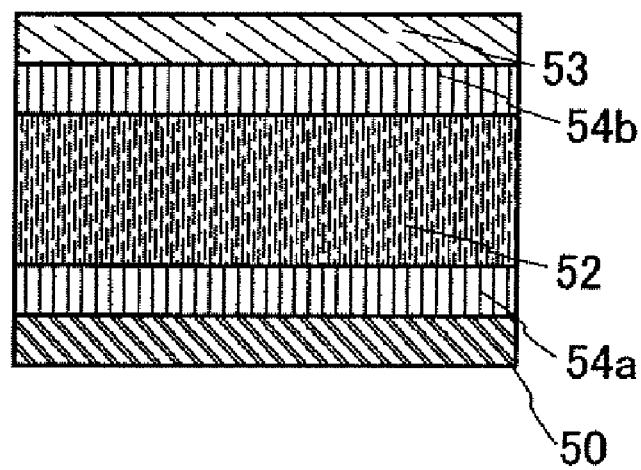

FIGS. 16A to 16C show examples of a thin-film-type inorganic EL element that can be used as a light-emitting element. Each of the light-emitting elements shown in FIGS. 16A to 16C includes a first electrode layer 50, an electroluminescent layer 52, and a second electrode layer 53.

The light-emitting elements shown in FIGS. 16B and 16C each have a structure in which an insulating layer is provided between the electrode layer and the electroluminescent layer of the light-emitting element shown in FIG. 16A. The light-emitting element shown in FIG. 16B has an insulating layer 54 between the first electrode layer 50 and the electroluminescent layer 52. The light-emitting element shown in FIG. 16C has an insulating layer 54a between the first electrode layer 50 and the electroluminescent layer 52, and an insulating layer 54b between the second electrode layer 53 and the electroluminescent layer 52. As described above, the insulating layer may be provided between one or each of the pair of electrode layers and the electroluminescent layer. In addition, the insulating layer can be either a single layer or a plurality of stacked layers.

Although the insulating layer 54 in FIG. 16B is provided to be in contact with the first electrode layer 50, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particulate light-emitting materials in a binder. The light-emitting material is processed into particulate forms. When particles with a desired size cannot be obtained due to a method of forming a light-emitting material, the material may be processed into particulate forms by being ground in a mortar or the like. A binder is a substance for fixing particulate light-emitting materials to be in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharging method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 to 1000 nm. In the electroluminescent layer which contains a light-emitting material and a binder, the percentage of the light-emitting material is preferably 50 to 80 wt %, inclusive.

Figure 17A:
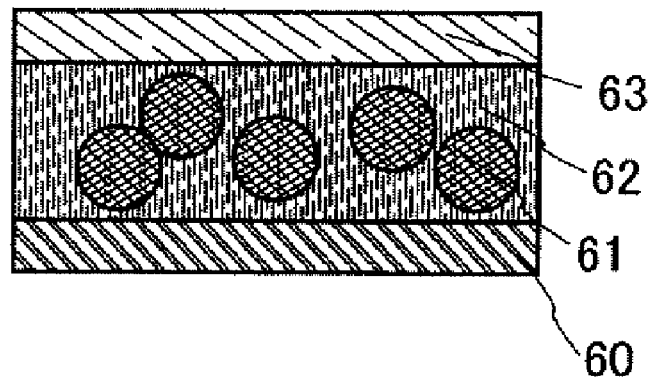
FIGS. 17A to 17C are diagrams to illustrate structures of light-emitting elements which can be applied to the present invention.
Figure 17B:
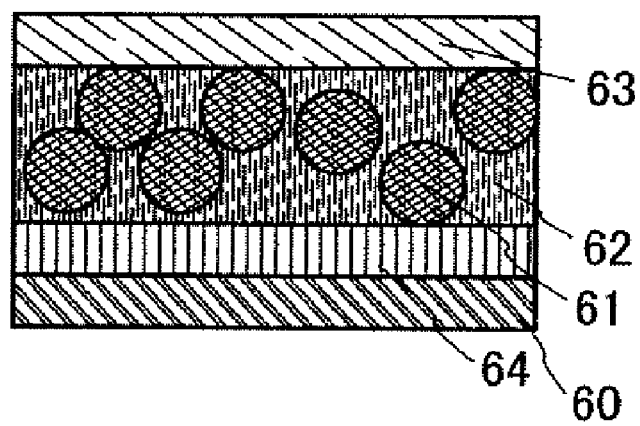
Figure 17C:
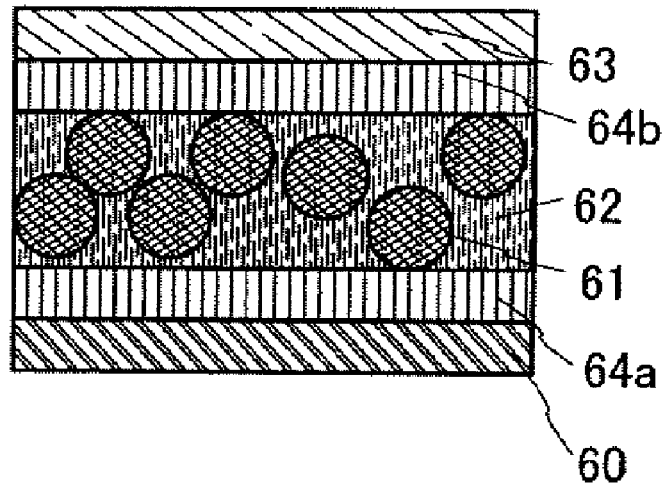

FIGS. 17A to 17C show examples of a dispersion-type inorganic EL element that can be used as a light-emitting element. The light-emitting element shown in FIG. 17A has a structure in which a first electrode layer 60, an electroluminescent layer 62, and a second electrode layer 63 are stacked, and the electroluminescent layer 62 contains a light-emitting material 61 fixed by a binder.

As a binder that can be used in this embodiment mode, an organic material, an inorganic material, or a mixed material of an organic material and an inorganic material can be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide and polybenzimidazole, or a siloxane resin. Note that a siloxane resin has the bond of Si—O—Si. Siloxane has a skeleton structure with the bond of silicon (Si) and oxygen (O). As a substituent, an organic group containing at least hydrogen (e.g., an alkyl group or aromatic hydrocarbon) is used. Further, a fluoro group may be used as the substituent, or both a fluoro group and an organic group containing at least hydrogen may be used as the substituent. Further, it is also possible to use a resin material such as a vinyl resin (e.g. polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles of, for example, barium titanate ($BaTiO_3$) or strontium titanate ($SrTiO_3$) are mixed as appropriate into the above-described resin, the dielectric constant of the material can be controlled.

As an inorganic material contained in the binder, the following materials can be used: silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic insulating material. When a high-dielectric-constant inorganic material is mixed into an organic material (by doping or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder that can be used in this embodiment mode, it is preferable to select a solvent appropriately in which a binder material can be dissolved and with which a solution having a viscosity suitable for a method for forming the electroluminescent layer (various wet processes) and a desired film thickness can be formed. An organic solvent or the like can be used. For example, when a siloxane resin is used as a binder, organic solvents of, for example, propylene glycolmonomethyl ether, propylene glycolmonomethyl ether acetate (also referred to as PGMEA), or 3-methoxy-3-methyl-1-butanol (also referred to as MMB) can be used.

The light-emitting elements shown in FIGS. 17B and 17C each have a structure in which an insulating layer is provided between the electrode layer and the electroluminescent layer of the light-emitting element shown in FIG. 17A. The light-emitting element shown in FIG. 17B has an insulating layer 64 between the first electrode layer 60 and the electroluminescent layer 62. The light-emitting element shown in FIG. 17C has an insulating layer 64a between the first electrode layer 60 and the electroluminescent layer 62, and an insulating layer 64b between the second electrode layer 63 and the electroluminescent layer 62. As described above, the insulating layer may be provided between one or each of the pair of electrode layers and the electroluminescent layer. In addition, the insulating layer can be either a single layer or a plurality of stacked layers.

In addition, although the insulating layer 64 is provided to be in contact with the first electrode layer 60 in FIG. 17B, the insulating layer 64 may also be provided to be in contact with the second electrode layer 63 by reversing the order of the insulating layer and the electroluminescent layer.

Although the insulating layers 54 and 64 shown in FIGS. 16B, 16C, 17B and 17C are not particularly limited to certain types, such insulating layers preferably have a high withstand voltage and dense film quality. Further, such insulating layers preferably have a high dielectric constant. For example, the following materials can be used: silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Further, a mixed film of such materials or a stacked film containing two or more of such materials can also be used. Such insulating films can be formed by sputtering, evaporation, CVD, or the like. Further, it is also possible to form an insulating layer by dispersing particulate insulating materials in a binder. The binder material may be formed using a material and method similar to those of the binder contained in the electroluminescent layer. Although the thickness of such an insulating layer is not particularly limited, it is preferably in the range of 10 to 1000 nm.

The light-emitting element shown in this embodiment mode emits light when a voltage is applied between the pair of electrode layers which sandwich the electroluminescent layer, and can be operated by either DC driving or AC driving.

This embodiment mode can be combined with Embodiment Modes 1 to 4 as appropriate.

With the use of the present invention, a display device which consumes less power and has high reliability can be provided.

Embodiment Mode 7

This embodiment mode will describe an example in which an impurity element is added to the semiconductor layer in a different way from those of the display devices shown in Embodiment Modes 1 to 6. Therefore, explanation of the same parts or parts having similar functions will be omitted. The manufacturing process of a display device of this embodiment mode will be described with reference to FIGS. 25A to 25F and FIG. 26.

Figure 25:
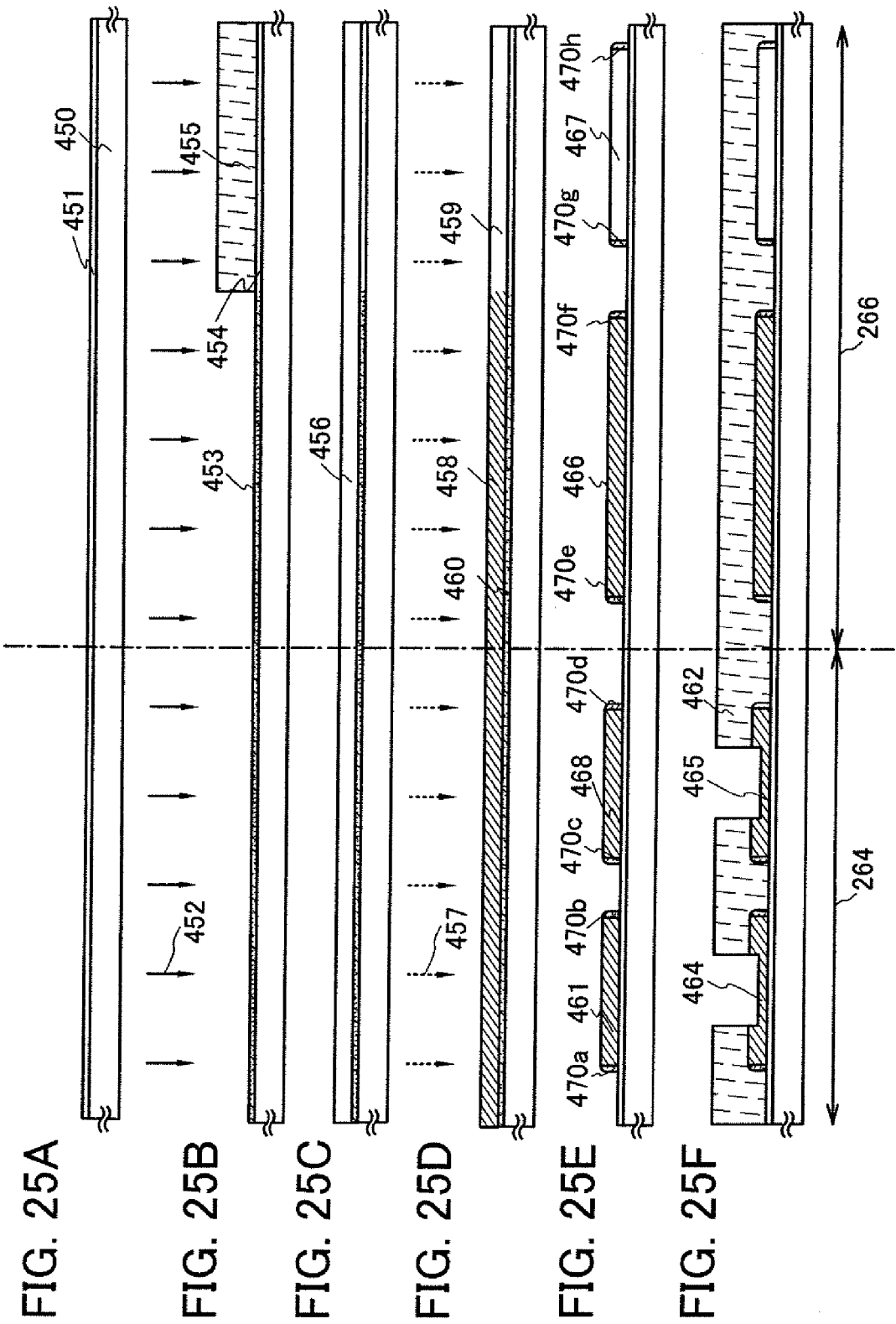
FIGS. 25A to 25F are diagrams to illustrate a method for manufacturing a display device of the present invention.

An insulating layer 451 is formed as a base film over a substrate 450 (see FIG. 25A).

As the substrate 450 that is a substrate having an insulating surface, a glass substrate, a quartz substrate, a sapphire substrate, a ceramic substrate, a metal substrate provided with an insulating layer on the surface or the like may be used. In addition, a plastic substrate having heat resistance sufficient to withstand processing temperature of this embodiment mode or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used.

The insulating layer 451 can be formed using silicon oxide, silicon nitride, silicon oxynitride, silicon nitride oxide, or the like and may have either a single-layer structure or a stacked structure of two layers.

In addition, the insulating layer 451 can also be formed using aluminum nitride, aluminum oxynitride, which contains more oxygen than nitrogen, aluminum nitride oxide having, which contains more nitrogen than oxygen, aluminum oxide, diamond-like carbon (DLC), carbon containing nitrogen, polysilazane, or other substances containing an inorganic insulating material. Further, a material containing siloxane may be used.

The insulating layer 451 can be formed by a sputtering method, a PVD (physical vapor deposition) method, a CVD (chemical vapor deposition) method such as a low pressure CVD (LPCVD) method or a plasma CVD method, a droplet discharging method by which a pattern can be selectively formed, a printing method by which a pattern can be transferred or drawn (a method for forming a pattern, such as screen printing or offset printing), a coating method such as a spin-coating method, a dipping method, a dispenser method, or the like.

A thin film transistor is a switching element that is turned on when a certain amount of voltage (referred to as a threshold value or a threshold voltage) is applied to a gate electrode and is turned off when a voltage of less than or equal to the certain amount is applied. Therefore, it is very important to control the threshold voltage precisely in terms of accurate operation of a circuit.

However, the threshold voltage of a TFT may be moved (shifted) toward the minus side or the plus side by an indefinite factor such as an effect of a movable ion due to contamination and an effect of difference in work function and interface electric charge in the periphery of a gate of the TFT.

As a technique proposed as a means for solving such a phenomenon, a channel doping method is given. The channel doping method is a technique in which an impurity element imparting one conductivity type (typically, P, As, B, or the like) is added to at least a channel formation region of a TFT and the threshold voltage is controlled by being shifted intentionally.

A mask 455 which selectively covers the insulating layer 451 is formed. The mask 455 covers a formation region of a semiconductor film where a channel formation region of a p-channel thin film transistor is formed. The p-channel thin film transistor is a driving thin film transistor of a light-emitting element and electrically connected to the light-emitting element later. With the use of the mask 455, an impurity element 452 that is p-type impurity element is selectively introduced to the insulating layer 451.

By adding the impurity element 452, a first insulating layer 453 that is a p-type impurity region and a second insulating layer 454 are formed in the insulating layer 451 (see FIG. 25B).

The impurity element 452 can be introduced (added) by an ion injecting method or an ion doping method. The impurity element 452 is a p-type impurity element, and boron (B), arsenic (As), or the like can be used. The dosage of the impurity element 452 may be about $1\times10^{13}$ atoms/cm$^2$ in the doping method.

A semiconductor film 456 is formed over the first insulating layer 453 that is a p-type impurity region and the second insulating layer 454 that is not doped with a p-type impurity element (see FIG. 25C). In this embodiment mode, an amorphous semiconductor film is formed as the semiconductor film 456. As a material of the semiconductor film, silicon is preferable. Further, a silicon germanium semiconductor can also be used. As a method, a sputtering method, a plasma CVD method, or a low pressure CVD method may be used.

Heat treatment is performed to the first insulating layer 453, the second insulating layer 454, and the semiconductor film 456, so that the semiconductor film 456 is crystallized. In this embodiment mode, the semiconductor film 456 is crystallized by irradiating the first insulating layer 453, the second insulating layer 454, and the semiconductor film 456 with a laser beam 457. By this laser irradiation treatment, the p-type impurity element contained in the first insulating layer 453 is selectively diffused into the semiconductor film 456. Thus, the insulating layer 453 becomes an insulating layer 460 having lower concentration of the p-type impurity element than the insulating layer 453, and a part of the semiconductor film 456 becomes a first semiconductor film 458 that contains the p-type impurity element and has crystallinity. Meanwhile, the semiconductor film 456 formed over the second insulating layer 454 not containing the p-type impurity element becomes a second semiconductor film 459 not containing the p-type impurity element but having crystallinity (see FIG. 25D).

The concentration of the p-type impurity element contained in the first semiconductor film 458 may be about $5\times10^{15}$ to $1\times10^{16}$ atoms/cm$^3$. The added impurity element controls the threshold voltage of a transistor and effectively functions by being added to a channel formation region.

In this manner, since the impurity element is added to the insulating layer that is a base film and indirectly added to the semiconductor film by heat treatment, the impurity element is not directly added to the semiconductor film by doping or the like; thus, defects and the like generated in doping can be prevented, and crystallinity of the semiconductor film is not adversely affected. Further, by the heat treatment for crystallization, the impurity element can be activated.

The first semiconductor film 458 and the second semiconductor film 459 are processed into a desired shape using a mask. In this embodiment mode, an oxide film formed over the first semiconductor film 458 and the second semiconductor film 459 is removed, and then, a new oxide film is formed. Then, a photomask is formed, and semiconductor layers 461, 468, 466, and 467 are formed by a photolithography method.

Insulating layers 470a to 470h which are in contact with the side surfaces of the semiconductor layers 461, 468, 466, and 467 are formed (see FIG. 25E). When the insulating layers 470a to 470h which are in contact with the side surfaces of the semiconductor layers 461, 468, 466, and 467 are formed, coverage with a gate insulating layer at the end portions of the semiconductor layers 461, 468, 466, and 467 can be favorable. Consequently, defects due to insufficient coverage with the gate insulating layer at the end portions of the semiconductor layers 461, 468, 466, and 467, such as short circuit between the semiconductor layer and the gate electrode layer, occurrence of a leakage current, and electrostatic discharge, can be prevented.

The insulating layers 470a to 470h can be formed in a self-aligned manner by the steps of forming the semiconductor layers 461, 468, 466, and 467, depositing a silicon oxide film or a silicon nitride film, and processing it by anisotropic etching.

The insulating layers 470a to 470h can also be formed by oxidizing the end portions of the semiconductor layers 461, 468, 466, and 467 to insulate them selectively. The oxidation can be performed by plasma treatment under an atmosphere containing oxygen. Further, the surface may be oxidized with an aqueous solution (also referred to as wet oxidation). The plasma treatment may also be performed after introducing halogen such as fluorine or chlorine to the side end portions of the semiconductor layers. Addition of halogen promotes preferential oxidation because of high oxidation rate, and enables formation of thick insulating layers on the side end portions of the semiconductor layers.

When the gate insulating layer sufficiently covers the end portions of the semiconductor layers 461, 468, 466, and 467 or preferably, is made thick in regions which are in contact with the side surfaces of the semiconductor layers 461, 468, 466, and 467, an electric field applied to the end portions of the semiconductor layers 461, 468, 466, and 467 can be eased, and occurrence of a leakage current and the like can be prevented.

A mask 462 is formed so as to cover the semiconductor layers 461, 468, 466, and 467 selectively. The mask 462 has openings over regions to be channel formation regions in the semiconductor layers 461 and 468 and covers regions to be source and drain regions in the semiconductor layers 461 and 468 and a pixel region 266 where a thin film transistor electrically connected to a display element is provided. With the use of the mask 462, the semiconductor layers 461 and 468 are selectively etched to be locally thin, so that semiconductor layers 464 and 465 are formed in a drive circuit region 264. Therefore, in the drive circuit region 264, the semiconductor layers 464 and 465, in which a thickness of the channel formation region is smaller than that of the semiconductor layers 466 and 467 in the pixel region 266, are formed (see FIG. 25F). After etching, the semiconductor layers 464 and 465 that are formed have recessed portions, and the recessed portions are regions which have been formed to be thin.

The semiconductor layers 461 and 468 can be formed to be thin by dry etching or wet etching. For example, in the case of dry etching, a chlorine-based gas such as $Cl_2$, $BCl_3$, or $SiCl_4$; a fluorine-based gas such as $CF_4$, $NF_3$, or $SF_6$; or a HBr gas can be used as an etching gas. An inert gas such as He, Ar, or Xe may be added thereto as appropriate. An $O_2$ gas may be added to the fluorine-based gas.

Note that when the semiconductor layers 461 and 468 are formed to be thin, preferably, the insulating layers 470*a* to 470*h* in regions which are not covered with the mask 462 are also etched to have almost the same height. Etching may be performed under conditions in which an etching rate of the semiconductor layers 461 and 468 is almost the same as that of the insulating layers 470*a* to 470*h*, that is, selectivity of the etching is close to 1. This condition can be set by, for example, adding an $O_2$ gas to a fluorine-based gas as appropriate. Further, instead of the etching gas obtained by adding an $O_2$ gas to a fluorine-based gas, a HBr gas or a mixed gas of HBr and $Cl_2$ may be used. At this time, an inert gas such as He or Ar may be added to the etching gas.

The semiconductor layer may be formed to be thin by one-time etching process or a plurality of etching processes. Further, the semiconductor layer may be directly etched by an etching gas (or an etchant), or the surface of the semiconductor layer may be partly modified and only a modified region may be selectively removed.

The thickness of the channel formation regions in the semiconductor layers 464 and 465 provided in the drive circuit region 264 may be 5 to 30 nm, inclusive, preferably, 10 to 20 nm, inclusive, to be smaller than that in the semiconductor layers 466 and 467 provided in the pixel region 266. Meanwhile, the thickness of the source and drain regions in the semiconductor layers 464 and 465 provided in the drive circuit region 264 and the semiconductor layers 466 and 467 (including the source regions, the drain regions, and the channel formation regions) provided in the pixel region 266 may be 25 to 100 nm, inclusive, preferably, 50 to 60 nm, inclusive, to be larger than that of the channel formation regions in the semiconductor layers 464 and 465 provided in the drive circuit region 264.

By forming the channel formation region in the semiconductor layer to be thin, the short channel effect can be suppressed. Further, the threshold voltage of the transistor can be reduced; therefore, the transistor can be operated at a low voltage.

The semiconductor layers 464, 465, and 466 are formed using the first semiconductor film 458 containing the p-type impurity element, and thus, the semiconductor layers 464, 465, and 466 also contain the p-type impurity element. On the other hand, the semiconductor layer 467 is formed using the second semiconductor film 459 which is not doped with the p-type impurity element, and thus, the semiconductor layer 467 is not doped with the p-type impurity element, either. Therefore, the concentration of the p-type impurity element contained in the semiconductor layer 467 is lower than that in the semiconductor layers 464, 465, and 466.

Figure 26:
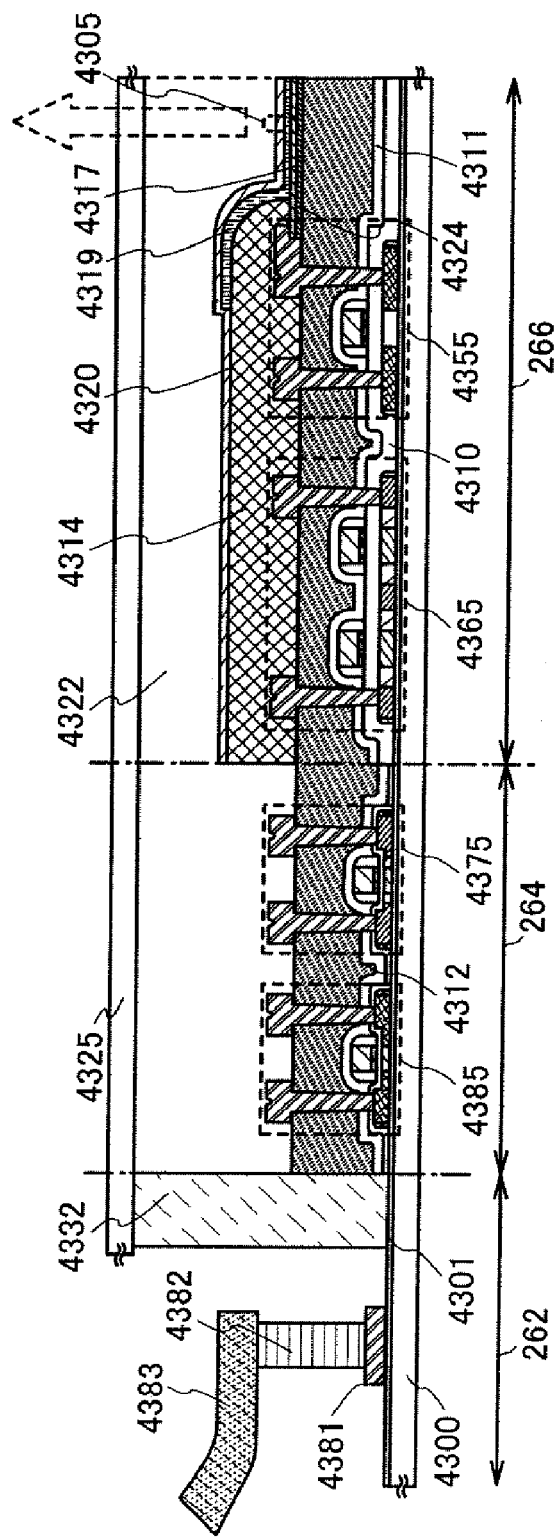
FIG. 26 is a diagram to illustrate a display device of the present invention.

FIG. 26 shows an example of a display device formed using the semiconductor layers obtained in FIGS. 25A to 25F Other structures of the display device of FIG. 26 can be formed similarly to FIG. 11 in Embodiment Mode 4.

The display device shown in FIG. 26 has a top emission structure, in which light is emitted in a direction indicated by an arrow. FIG. 26 shows a display device which includes a substrate 4300, thin film transistors 4355, 4365, 4375, and 4385, a wiring layer 4324, a light-emitting element including a first electrode layer 4317, a light-emitting layer 4319 and a second electrode layer 4320, a filler 4322, a sealant 4332, an insulating film 4301, a gate insulating layer 4310, an insulating layer 4311, insulating films 4312 and 4314, a sealing substrate 4325, a terminal electrode layer 4381, an anisotropic conductive layer 4382, and an FPC 4383. Channel formation regions in semiconductor layers of the thin film transistors 4375 and 4385 in a drive circuit region 264 are formed to be locally thinner than those in semiconductor layers of the thin film transistors 4355 and 4365 in a pixel region 266. Further, the gate insulating layer 4310 in the drive circuit region may be formed to be thinner than that in the pixel region.

In the display device of this embodiment mode, a p-channel thin film transistor and an n-channel thin film transistor are provided in each of the pixel region and the drive circuit region. In particular, in the pixel region, a p-channel thin film transistor is used as a driving thin film transistor which is electrically connected to a light-emitting element and drives the light-emitting element.

One feature of this embodiment mode is that a value of cutoff current (Icut), which is a value of drain current ID which flows when gate voltage VG is 0 V, is made different between the p-channel thin film transistor provided in the drive circuit region and the driving p-channel thin film transistor in the pixel region. Accordingly, a threshold value of the p-channel thin film transistor which is required to operate at high speed and provided in the drive circuit region is controlled to be higher (to be more on the plus side), and a threshold value of the driving p-channel thin film transistor is controlled to be lower (to be more on the minus side). In the case where the p-channel thin film transistor provided in the drive circuit region is turned on at $V_{gs}=0$, the driving p-channel thin film transistor is set so as not to be turned on at $V_{gs}=0$ but is turned on at a voltage lower than that (for example, $V_{gs}=-3.5$ V).

When the concentration of the p-type impurity element contained in the channel formation region in the p-channel thin film transistor is high, the threshold value of the thin film transistor is shifted to plus side. Therefore, in this embodiment mode, the concentration of the p-type impurity element contained in the channel formation region in the thin film transistor 4355 that is a driving p-channel thin film transistor provided in the pixel region is made lower than that in the channel formation regions of other thin film transistors which are n-channel or p-channel thin film transistors formed in the display device, such as the thin film transistor 4365 having a switching function provided in the pixel region and the thin film transistors 4375 and 4385 provided in the drive circuit region which drives the pixel region.

In this embodiment mode, in the case where a p-channel thin film transistor is used as a thin film transistor that is electrically connected to a light-emitting element and drives the light-emitting element, the concentration of the p-type impurity element intended to correct a threshold value may be made low in a channel formation region of the p-channel thin film transistor. Therefore, it is preferable not to introduce the p-type impurity element actively. That is, channel doping is selectively performed on the semiconductor layer of the thin film transistor included in the pixel.

Needless to say, also in the thin film transistor as described above other than the driving p-channel thin film transistor, the concentration of the p-type impurity element of the channel formation region may be made low. In that case, it is preferable not to add the p-type elements actively. For example, the p-type impurity element is not selectively added to a channel formation region of, for example, a thin film transistor or the like used for a scanning line drive circuit (also referred to as a gate driver), or a protective circuit provided between a pixel region and a peripheral drive circuit region or the like.

On the other hand, it is preferable that the p-type impurity element be added to a channel formation region of a thin film transistor which is used for a signal line drive circuit (also referred to as a source driver) and required to operate at high speed, or a thin film transistor with low anode voltage, and that the threshold voltage thereof be controlled to be higher (be in the plus direction).

When channel doping is performed, the threshold value of a thin film transistor is shifted to be higher (toward the plus side); thus, the threshold value of the p-channel thin film transistor to which channel doping is not performed is lower (on the minus side). Accordingly, a value of cutoff current (Icut), which is a value of drain current ID which flows when gate voltage VG is 0 V, becomes low. In the pixel, in the case where the light-emitting element is made in a non-light-emitting state and black display is performed, faint light emission caused by current which flows in the light-emitting element connected to the driving p-channel thin film transistor can be prevented. Further, as a value of cutoff current (Icut) is lower, lower power consumption can be realized.

The higher the temperature of usage environment of a thin film transistor is, the more the threshold value is shifted toward the direction of normally-ON. That is, the threshold value is shifted to be higher (in the plus direction) in the p-channel thin film transistor (shifted to be lower (in the minus direction) in an n-channel thin film transistor). Thus, a value of cutoff current (Icut) becomes high and further, a value of current flowing in a light-emitting element becomes high in black display accompanied with a change in threshold value. Accordingly, luminance of light emission from a light-emitting element generated in black display becomes high, and thus a problem of a display defect of a pixel becomes more prominent. However, as in this embodiment mode, with the use of a thin film transistor in which cutoff current is reduced without performing channel doping, performance of a display device is kept even when usage environment of the display device becomes worse, that is, the temperature becomes high to some extent. Thus, display with high image quality can be provided. Accordingly, a highly reliable display device can be obtained, and a choice of usage environment such as indoor or outdoor is widened, leading to high utility value.

As described above, by using a driving p-channel thin film transistor of a light-emitting element in which cutoff current is more reduced than in a p-channel thin film transistor in a drive circuit, the display device having improved contrast of pixels and high visibility can be obtained.

This embodiment mode can be freely applied to the semiconductor layers in the display devices in Embodiment Modes 1 to 6.

Accordingly, the display device of the present invention can achieve low power consumption and high reliability.

Embodiment Mode 8

This embodiment mode will describe an example in which an etched semiconductor layer has a different shape from those in the display devices shown in Embodiment Modes 1 to 7. Therefore, explanation of the same parts or parts having similar functions will be omitted. The manufacturing process of a display device of this embodiment mode will be described with reference to FIGS. 27A to 30D.

This embodiment mode will describe an example in which, in a semiconductor layer in a drive circuit region, only regions which are in contact with wiring layers such as source and drain electrode layers below openings (contact holes) are not formed to be selectively thin and other regions including channel formation regions are formed to be locally thin.

Figure 27A:
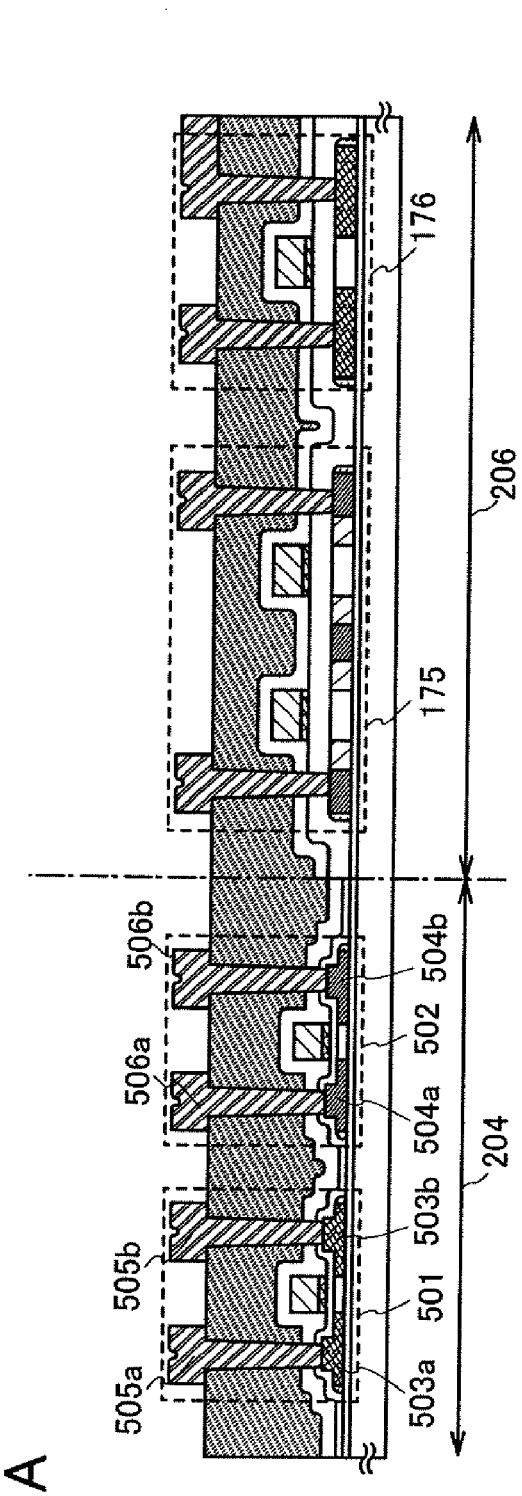
FIGS. 27A and 27B are diagrams to illustrate a method for manufacturing a display device of the present invention.
Figure 27B:
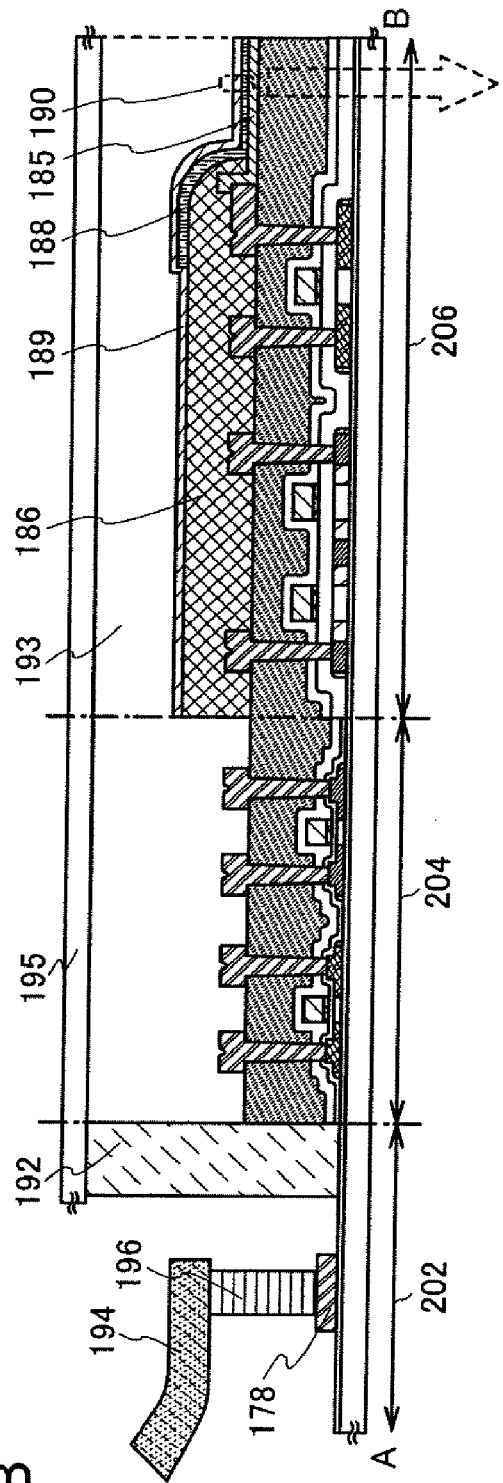

FIGS. 27A and 27B correspond to Embodiment Mode 1, and FIGS. 27A and 27B correspond to FIGS. 4C and 1B, respectively.

In FIG. 27A, channel formation regions of thin film transistors 501 and 502 provided in a drive circuit region 204 are formed to be locally thin, and end portions of impurity regions 503a, 503b, 504a, and 504b serving as source or drain regions in semiconductor layers are also formed to be thin. Therefore, in the semiconductor layers, only the impurity regions 503a, 503b, 504a, and 504b connected to source or drain electrode layers 505a, 505b, 506a, and 506b, respectively, (including the vicinity thereof) are not formed to be selectively thin, and have larger thickness than the channel formation regions and the like. FIG. 27B is an example in which a display device having a light-emitting element is formed using FIG. 27A.

FIGS. 28A and 28B correspond to Embodiment Mode 3, and FIG. 28A corresponds to FIG. 8B.

In FIG. 28A, channel formation regions of thin film transistors 511 and 512 provided in a drive circuit region 224 are formed to be locally thin, and end portions of impurity regions 513a, 513b, 514a, and 514b having silicide serving as source or drain regions in semiconductor layers are also formed to be thin. Therefore, in the semiconductor layers, only the impurity regions 513a, 513b, 514a, and 514b connected to source or drain electrode layers 515a, 515b, 516a, and 516b, respectively, (including the vicinity thereof) are not formed to be selectively thin, and have larger thickness than the channel formation regions and the like. FIG. 28B is an example in which a display device having a light-emitting element is formed using FIG. 28A.

FIGS. 29A and 29B also correspond to Embodiment Mode 3, and FIG. 29A corresponds to FIG. 8C.

In FIG. 29A, channel formation regions of thin film transistors 521 and 522 provided in a drive circuit region 224 are formed to be locally thin, and end portions of impurity regions 523*a*, 523*b*, 524*a*, and 524*b* having silicide serving as source or drain regions in semiconductor layers are also formed to be thin. Therefore, in the semiconductor layers, only the impurity regions 523*a*, 523*b*, 524*a*, and 524*b* connected to source or drain electrode layers 525*a*, 525*b*, 526*a*, and 526*b*, respectively, (including the vicinity thereof) are not formed to be selectively thin, and have larger thickness than the channel formation regions and the like. FIG. 29B is an example in which a display device having a light-emitting element is formed using FIG. 29A.

Silicide may be formed on the surfaces of the impurity regions serving as the source and drain regions, or may be entirely formed in the impurity regions serving as the source and drain regions. Silicide can be controlled by the thickness of a conductive film or heating conditions (e.g., temperature and time). FIGS. 29A and 29B show an example in which silicide is formed to be thicker and silicide regions reach an insulating layer serving as a base film. As shown in FIGS. 29A and 29B, silicide reflects the shape of the semiconductor layers and has such a shape that the impurity regions of the semiconductor layers which are not silicide are left below silicide only in the source and drain regions of the semiconductor layers where the source and drain electrode layers are formed.

Each of the display devices shown in FIGS. 28B and 29B includes a light-emitting element including a first electrode layer 1517, a light-emitting layer 1519 and a second electrode layer 1520, a filler 1522, a sealant 1532, an insulating layer 1514, a sealing substrate 1525, a terminal electrode layer 1581, an anisotropic conductive layer 1582, and an FPC 1583.

When the semiconductor layers shown in FIGS. 27A to 29B has the shapes as in this embodiment mode, insulating layers covering the side surfaces of the semiconductor layers are different between the drive circuit regions and pixel regions. A method for manufacturing semiconductor layers having the shapes as shown in FIGS. 27A to 29B will be described with reference to FIGS. 30A to 30D.

FIGS. 30A to 30D show a method for manufacturing a display device having a drive circuit region 274 and a pixel region 276 over a substrate 550 having an insulating surface.

An insulating layer 551 is formed over the substrate 550 as a base film. Similarly to FIG. 2C of Embodiment Mode 1, semiconductor layers 552, 553, 554, and 555 and insulating layers 561*a* to 561*h* covering the side surfaces of the semiconductor layers are formed (see FIG. 30A).

A mask 556 which covers the semiconductor layers 554 and 555 is formed, and the insulating layers 561*a* to 561*d* which cover the side surfaces of the semiconductor layers 552 and 553 are etched, whereby insulating layers 557*a* to 557*d* which have been formed to be thin in advance are formed (see FIG. 30B). In this case, etching is performed under a condition in which selectivity of an etching rate of the insulating layers 561*a* to 561*d* with respect to that of the semiconductor layers 552 and 553 is high. When selectivity of an etching rate of the insulating layers 561*a* to 561*d* with respect to that of the semiconductor layers 552 and 553 is not sufficiently high, a mask may be provided also over the semiconductor layers 552 and 553.

In the pixel region 276, the mask 556 is removed, and a mask 562 which covers the semiconductor layers 554 and 555 is formed. The mask 556 can also be used as the mask 562 without being removed. In the drive circuit region 274, masks 558*a* to 558*d* which selectively cover the semiconductor layers 552 and 553 are formed (see FIG. 30C). The masks 558*a* to 558*d* are formed to cover regions which are not formed to be thin in the semiconductor layers 552 and 553, that is, regions which are electrically connected to source and drain electrode layers. With the use of the masks 558*a* to 558*d*, the semiconductor layers 552 and 553 are selectively formed to be thin, whereby semiconductor layers 559 and 560 are formed (see FIG. 30D). In this case, etching is performed under a condition in which selectivity of an etching rate of the semiconductor layers 552 and 553 with respect to that of the insulating layers 557*a* to 557*d* is high. When selectivity of an etching rate of the semiconductor layers 552 and 553 with respect to that of the insulating layers 557*a* to 557*d* is not sufficiently high, a mask may be provided also over the insulating layers 557*a* to 557*d*.

This embodiment mode shows an example in which the insulating layers which are sidewall-insulating layers are formed to be thin and the semiconductor layers are formed to be locally thin by different etching processes; however, the sidewall-insulating layers and the semiconductor layers may be formed to be thin by the same etching process (for example, in the case of FIGS. 30A to 30D, the process proceeds from the step of FIG. 30A to the step of FIG. 30C without performing the step of FIG. 30B). In this case, etching may be performed under conditions in which an etching rate of the semiconductor layers is almost the same as that of the sidewall-insulating layers, that is, selectivity of the etching is close to 1. This condition can be set by, for example, adding an $O_2$ gas to a fluorine-based gas as appropriate. Further, instead of the etching gas obtained by adding an $O_2$ gas to a fluorine-based gas, a HBr gas or a mixed gas of HBr and $Cl_2$ may be used. At this time, an inert gas such as He or Ar may be added to the etching gas.

As described above, semiconductor layers which are formed to be locally thin can be formed.

In this embodiment mode, the display device has thin film transistors in each of the pixel region and the drive circuit region, and is characterized in that the thickness of the channel formation regions in the semiconductor layers of the thin film transistors provided in the drive circuit region is smaller than that in the pixel region. Further, the channel formation regions in the semiconductor layers of the thin film transistors provided in the drive circuit region are formed to be locally thin while the regions of the source and drain regions which are in contact with the source and drain electrode layers are not formed to be thin and thus have a larger thickness than the channel formation regions.

In this embodiment mode, the thickness of a gate insulating layer is also smaller in the thin film transistors provided in the drive circuit region than in the thin film transistor provided in the pixel region.

In the display device of the present invention, the thickness of the channel formation regions in the semiconductor layers of the thin film transistors provided in the drive circuit region may be 5 to 30 nm, inclusive, preferably, 10 to 20 nm, inclusive. Meanwhile, the thickness of the source and drain regions in the semiconductor layers of the thin film transistors provided in the drive circuit region and the semiconductor layers (including the source regions, the drain regions, and the channel formation regions) of the thin film transistors provided in the pixel region may be 25 to 100 nm, inclusive, preferably, 50 to 60 nm, inclusive.

In the display device of the present invention, the thickness of the gate insulating layer of the thin film transistors provided in the drive circuit region may be 1 to 10 nm, inclusive, preferably, about 5 nm. Meanwhile, the thickness of the gate insulating layer of the thin film transistors provided in the pixel region may be 50 to 150 nm, inclusive, preferably, 60 to 80 nm, inclusive.

When the thickness of the channel formation region is large, in the case of a short channel length, current flows on the lower side in the channel formation region in a subthreshold region, where the value of the gate voltage is less than or equal to the threshold voltage, by the influence of an electric field between the source and the drain. Therefore, the subthreshold value is increased, and the threshold voltage is reduced. When the channel formation region is formed to be thin, a path where current flows on the lower side in the channel formation region is blocked, and leakage current can be suppressed. Therefore, increase in subthreshold value can be suppressed, and reduction in threshold voltage can be suppressed. Accordingly, when the channel formation region is formed to be thin, the amount of change in threshold voltage toward negative values can be suppressed in a region where the channel length is short, and a thin film transistor whose subthreshold value is small can be manufactured. Since the subthreshold value is small, current flowing between the source and the drain at a gate voltage of 0 V can be suppressed, while the threshold voltage can be reduced.

By forming the channel formation regions in the semiconductor layers in the drive circuit region to be locally thin, the entire channel formation regions are depleted and the short channel effect can be suppressed. In addition, the threshold voltage of the thin film transistor can be lowered. Accordingly, miniaturization and high performance can be realized in the thin film transistors provided in the drive circuit region. Consequently, the display device can be driven at a low voltage, and low power consumption can be realized. Further, because forming the channel formation region in the semiconductor layer (or further, also the gate insulating layer) to be thin can miniaturize the thin film transistors, the area of the drive circuit region can be reduced, whereby the display device can have a narrower frame. Accordingly, the display device can be further downsized.

On the other hand, in the thin film transistors provided in the pixel region, the semiconductor layers (or further, also the gate insulating layer) are kept thicker than those in the drive circuit region, and thus, resistance to driving voltage can be enhanced and high reliability can be achieved.

With regard to the thin film transistors provided in the drive circuit region, because the channel formation regions are formed to be locally thin, the regions of the source and drain regions which are in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

Accordingly, the display device of the present invention can achieve low power consumption and high reliability.

This embodiment mode can be combined with Embodiment Modes 1 to 7 as appropriate.

Embodiment Mode 9

This embodiment mode will describe an example of a display device for achieving low power consumption and high reliability. Specifically, a liquid crystal display device using a liquid crystal display element as a display element will be described.

Figure 9A:
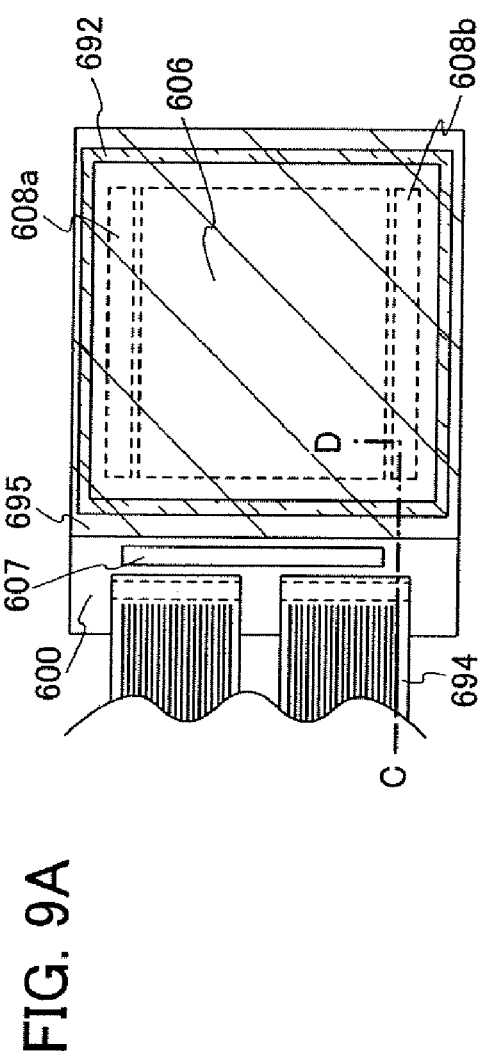
FIGS. 9A and 9B are diagrams to illustrate a display device of the present invention.
Figure 9B:
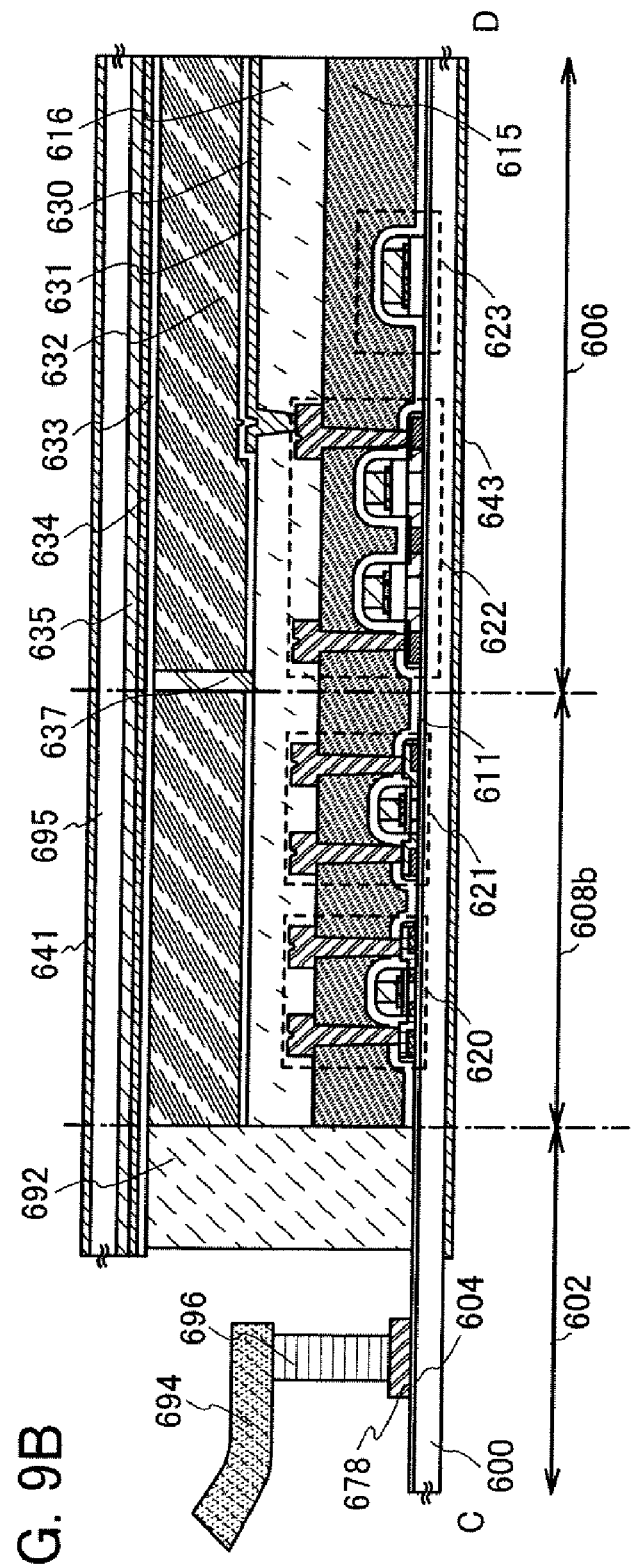

FIG. 9A is a top view of a liquid crystal display device, and FIG. 9B is a cross-sectional view of FIG. 9A taken along a line C-D.

As shown in FIG. 9A, a pixel region 606, a drive circuit region 608a that is a scanning line drive circuit region, and a drive circuit region 608b that is a scanning line drive circuit region are sealed between a substrate 600 and a counter substrate 695 with a sealant 692. A drive circuit region 607 that is a signal line drive circuit formed using an IC driver is provided over the substrate 600. In the pixel region 606, a thin film transistor 622 and a capacitor 623 are provided, and in the drive circuit region 608b, a drive circuit including a thin film transistor 620 and a thin film transistor 621 is provided. An insulating substrate similar to that in the above embodiment modes can be used as the substrate 600. There is a concern that a substrate made of a synthetic resin generally has lower allowable temperature limit than other substrates; however, the substrate made of a synthetic resin can be employed when a manufacturing process is carried out with a substrate with high heat resistance and then the substrate formed of a synthetic resin is replaced with the substrate with high heat resistance.

In the pixel region 606, the thin film transistor 622 functioning as a switching element is provided over the substrate 600 with a base film 604 interposed therebetween. In this embodiment mode, the thin film transistor 622 is a multi-gate thin film transistor (TFT) and includes a semiconductor layer including impurity regions that serve as source and drain regions, a gate insulating layer, a gate electrode layer having a stacked structure of two layers, and source and drain electrode layers. The source or drain electrode layer is in contact with and is electrically connected to the impurity region (silicide) of the semiconductor layer and a pixel electrode layer 630.

The transistors provided in the display device in this embodiment mode shown in FIGS. 9A and 9B can be formed similarly to the transistors shown in Embodiment Mode 3. The drive circuit region 224 in Embodiment Mode 3 corresponds to the drive circuit regions 608a and 608b in this embodiment mode, and the pixel region 226 in Embodiment Mode 3 corresponds to the pixel region 606 in this embodiment mode. However, this embodiment mode is not limited to the above, and the thin film transistor shown in Embodiment Mode 1 or 2 and the active matrix substrate can be employed to form a liquid crystal display device.

The pixel region and the drive circuit region can be formed over the same substrate when a crystalline semiconductor film is used. In that case, the transistor in the pixel region 606 and the transistors in the drive circuit region 608b are formed at the same time. The transistors used in the drive circuit region 608b forms a CMOS circuit.

In this embodiment mode, the display device has the thin film transistors in each of the pixel region 606 and the drive circuit regions 608a and 608h, and is characterized in that the thickness of the channel formation regions in the semiconductor layers of the thin film transistors 620 and 621 provided in the drive circuit regions 608a and 608b is smaller than that of the thin film transistor 622 provided in the pixel region 606. Further, the channel formation regions in the semiconductor layers of the thin film transistors 620 and 621 provided in the drive circuit regions 608a and 608b are formed to be locally thin while the regions of the source and drain regions which are in contact with the source and drain electrode layers are not formed to be thin and thus have a larger thickness than the channel formation regions.

In this embodiment mode, the thickness of the gate insulating layer is also smaller in the thin film transistors 620 and 621 provided in the drive circuit region 608b than in the thin film transistor 622 provided in the pixel region 606.

In the display device of the present invention, the thickness of the channel formation regions in the semiconductor layers of the thin film transistors 620 and 621 provided in the drive circuit region 608b may be 5 to 30 nm, inclusive, preferably, 10 to 20 nm, inclusive. Meanwhile, the thickness of the source and drain regions in the semiconductor layers of the thin film transistors 620 and 621 provided in the drive circuit region 608b and the semiconductor layer (including the source region, the drain region, and the channel formation region) of the thin film transistor 622 provided in the pixel region 606 may be 25 to 100 nm, inclusive, preferably, 50 to 60 nm, inclusive.

In the display device of the present invention, the thickness of the gate insulating layer of the thin film transistors 620 and 621 provided in the drive circuit region 608b may be 1 to 10 nm, inclusive, preferably, about 5 nm. Meanwhile, the thickness of the gate insulating layer of the thin film transistor 622 provided in the pixel region 606 may be 50 to 150 nm, inclusive, preferably, 60 to 80 nm, inclusive.

When the thickness of the channel formation region is large, in the case of a short channel length, current flows on the lower side in the channel formation region in a subthreshold region, where the value of the gate voltage is less than or equal to the threshold voltage, by the influence of an electric field between the source and the drain. Therefore, the subthreshold value is increased, and the threshold voltage is reduced. When the channel formation region is formed to be thin, a path where current flows on the lower side in the channel formation region is blocked, and leakage current can be suppressed. Therefore, increase in subthreshold value can be suppressed, and reduction in threshold voltage can be suppressed. Accordingly, when the channel formation region is formed to be thin, the amount of change in threshold voltage toward negative values can be suppressed in a region where the channel length is short, and a thin film transistor whose subthreshold value is small can be manufactured. Since the subthreshold value is small, current flowing, between the source and the drain at a gate voltage of 0 V can be suppressed, while the threshold voltage can be reduced.

By forming the channel formation regions in the semiconductor layers in the drive circuit region 608b to be thin, the entire channel formation regions are depleted and the short channel effect can be suppressed. In addition, the threshold voltage of the thin film transistor can be lowered. Accordingly, miniaturization and high performance can be realized in the thin film transistors provided in the drive circuit region. Consequently, the display device can be driven at a low voltage, and low power consumption can be realized. Further, because forming the channel formation region in the semiconductor layer (or further, also the gate insulating layer) to be thin can miniaturize the thin film transistor, the area of the drive circuit region can be reduced, whereby the display device can have a narrower frame. Accordingly, the display device can be further downsized.

With regard to the thin film transistors provided in the drive circuit region 608b, because the channel formation regions are formed to be locally thin, the regions of the source and drain regions which are in contact with the source and drain electrode layers are not formed to be thin and thus are thicker than the channel formation regions. Accordingly, in forming openings (contact holes) which expose the source and drain regions, entire removal of the semiconductor layers around the openings can be prevented, and increase in contact resistance (between the semiconductor layers and electrode layers) can also be prevented. Consequently, decrease in yield can be prevented in a manufacturing process, and high performance can be realized in a semiconductor device to be completed.

On the other hand, in the thin film transistor 622 provided in the pixel region 606, the semiconductor layer (or further, also the gate insulating layer) is kept thicker than those in the drive circuit region, and thus, resistance to driving voltage can be enhanced and high reliability can be achieved.

An insulating film 611 is formed over the thin film transistors 620 to 622. Further, in order to enhance a level of planarity, insulating films 615 and 616 may be formed as interlayer insulating films. The insulating films 615 and 616 can be formed using an organic material, an inorganic material, or a stacked structure thereof. For example, the insulating films 615 and 616 can be formed of a material such as silicon oxide, silicon nitride, silicon oxynitride, silicon nitride oxide, aluminum nitride, aluminum oxynitride, aluminum nitride oxide, which contains more nitrogen than oxygen, aluminum oxide, diamond-like carbon (DLC), polysilazane, carbon containing nitrogen (CN), phosphosilicate glass (PSG), borophosphosilicate glass (BPSG), alumina, or other substances including an inorganic insulating material. Further, an organic insulating material may be used; an organic material may be either photosensitive or non-photosensitive; and polyimide, acrylic, polyamide, polyimide amide, resist, benzocyclobutene, a siloxane resin, or the like can be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may be used as the substituent. Further, an organic group containing at least hydrogen and a fluoro group may be used as the substituent.

Without limitation to this embodiment mode, the thin film transistor in the pixel region 606 may have a single-gate structure in which one channel formation region is formed, a double-gate structure in which two channel formation regions are formed, or a triple-gate structure in which three channel formation regions are formed. In addition, the thin film transistor in the drive circuit region may also have a single-gate structure, a double-gate structure, or a triple-gate structure.

Note that the present invention can be used in a top-gate structure (such as a staggered structure), a bottom-gate structure (such as an inverted staggered structure), a dual-gate structure including two gate electrode layers provided above and below a channel formation region each with a gate insulating film interposed therebetween, or another structure, without limitation to the formation method of a thin film transistor described in this embodiment mode.

Next, an insulating layer 631 referred to as an alignment film is formed by a printing method or a droplet discharging method to cover the pixel electrode layer 630 and the insulating film 616. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 functioning as an alignment film is formed similarly to the insulating layer 631. Then, the sealant 692 is formed by a droplet discharging method in a peripheral region of the pixel.

After that, the counter substrate 695 provided with the insulating layer 633 functioning as an alignment film, a conductive layer 634 functioning as a counter electrode, a colored layer 635 functioning as a color filter, and a polarizer 641 (also referred to as a polarizing plate) is attached to the substrate 600 that is a TFT substrate with a spacer 637 interposed therebetween, and a liquid crystal layer 632 is provided in a gap therebetween. Since the liquid crystal display device of this embodiment mode is a transmissive type, a polarizer (polarizing plate) 643 is provided on a surface opposite to the side having elements of the substrate 600. The polarizer can be provided for the substrate using an adhesive layer. The sealant may be mixed with a filler, and further, the counter substrate 695 may be provided with a shielding film (black matrix) or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap with a transistor and a CMOS circuit for the sake of reducing reflection of external light by wirings of the transistor and the CMOS circuit. Note that the black matrix may be provided so as to overlap with the capacitor. This is because reflection by a metal film forming the capacitor can be prevented.

The liquid crystal layer can be formed by a dispenser method (dripping method), or an injecting method by which liquid crystal is injected using a capillary phenomenon after attaching the substrate 600 including the elements to the counter substrate 695. A dripping method is preferably employed when using a large substrate to which an injecting method is not easily applied.

The spacer may be provided in such a way that particles each having a size of several μm are dispersed, or the spacer may be formed by a method in which a resin film is formed over the entire surface of the substrate and then etched. A material of the spacer is applied by a spinner and then subjected to light exposure and development to form a predetermined pattern. Further, the material is heated at 150 to 200° C. in a clean oven or the like so as to be hardened. The spacer manufactured thus can have various shapes depending on the conditions of the light exposure and development. It is preferable that the spacer have a columnar shape with a flat top so that mechanical strength of the liquid crystal display device can be secured when the counter substrate is attached. The shape can be conical, pyramidal, or the like, and there is no particular limitation on the shape.

Then, in an external terminal connecting region 602, a terminal electrode layer 678 electrically connected to the pixel region is provided with an FPC 694 that is a wiring board for connection with an anisotropic conductive layer 696 interposed therebetween. The FPC 694 transmits external signals or potential from the outside. Through the above steps, a liquid crystal display device having a display function can be manufactured.

The wiring and the gate electrode layer which are included in the transistor, the pixel electrode layer 630, and the conductive layer 634 that is a counter electrode layer can be formed using a material such as indium tin oxide (ITO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy thereof; or a metal nitride thereof.

A retardation plate may be sandwiched between the polarizing plate and the liquid crystal layer. Further, an antireflection film which prevents reflection of external light to the viewing side may be provided on the most viewing side.

Accordingly, the display device of the present invention can achieve low power consumption and high reliability.

This embodiment mode can be combined with Embodiment Modes 1 to 3 as appropriate.

Embodiment Mode 10

This embodiment mode describes structures of a backlight. A backlight is provided in a display device having a liquid crystal element as shown in Embodiment Mode 9 as a backlight unit having a light source. In the backlight unit, the light source is surrounded by a reflector plate so that light is scattered efficiently.

Figure 13A:
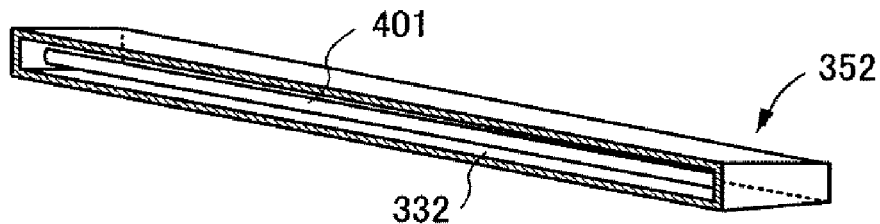
FIGS. 13A to 13D are diagrams to illustrate lighting devices which can be applied to the present invention.

As shown in FIG. 13A, a cold cathode tube 401 can be used as a light source in a backlight unit 352. In order to reflect light from the cold cathode tube 401 efficiently, a lamp reflector 332 can be provided. In many cases, the cold cathode tube 401 is used for a large-sized display device because of the intensity of the luminance. Therefore, the backlight unit having a cold cathode tube can be used for a display of a personal computer.

Figure 13B:
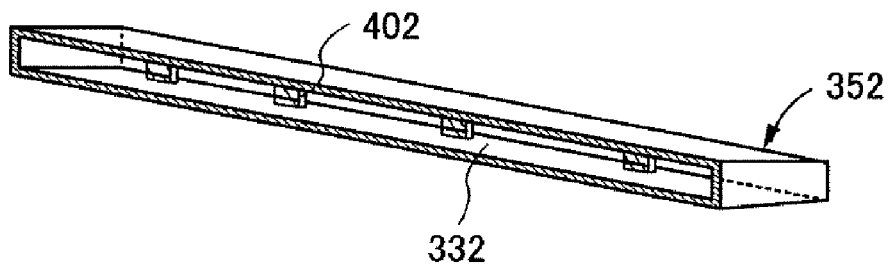

As shown in FIG. 13B, light-emitting diodes (LEDs) 402 can be used as a light source in the backlight unit 352. For example, light-emitting diodes (LEDs) 402 emitting light of a white color are arranged at predetermined intervals. In order to reflect light from the light-emitting diodes (LEDs) 402 efficiently, the lamp reflector 332 can be provided.

Figure 13C:
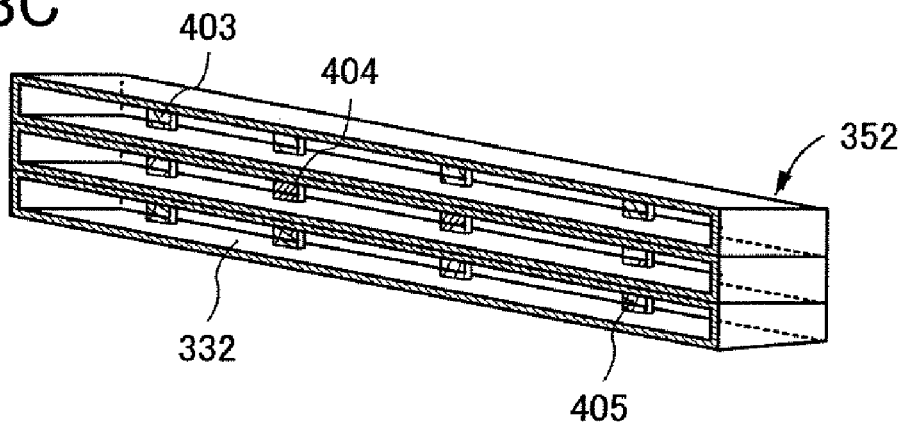

As shown in FIG. 13C, light-emitting diodes (LEDs) 403, 404, and 405 emitting light of colors of R, G, and B can be used as a light source in the backlight unit 352. When the light-emitting diodes (LEDs) 403, 404, and 405 emitting light of colors of R, G, and B are used, color reproducibility can be enhanced compared to the case where only the light-emitting diodes (LEDs) 402 emitting light of a white color are used. In order to reflect light from the light-emitting diodes efficiently, the lamp reflector 332 can be provided.

Figure 13D:
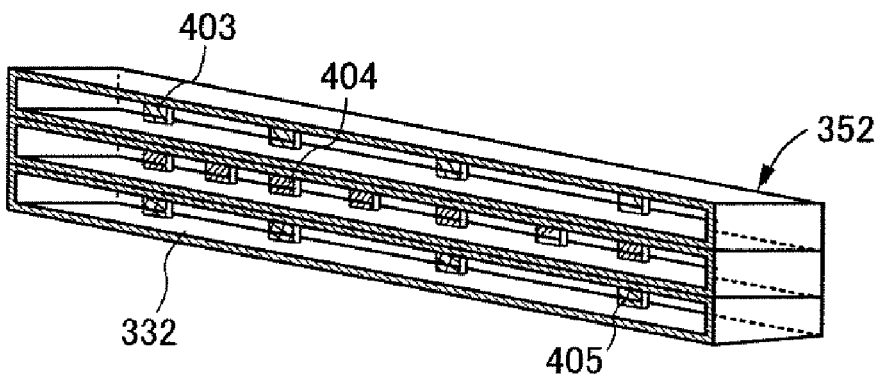

As shown in FIG. 13D, when the light-emitting diodes (LEDs) 403, 404, and 405 emitting light of colors of R, G, and B are used as a light source, it is not necessary that the number and arrangement thereof are the same. For example, more light-emitting diodes emitting light of a color that has low light-emitting intensity (such as green) may be arranged than light-emitting diodes emitting light of other colors.

Furthermore, the light-emitting diodes 402 emitting light of a white color and the light-emitting diodes (LEDs) 403, 404, and 405 emitting light of colors of R, G, and B may be combined.

When a field sequential mode is applied in a case of using the light-emitting diodes of R, G, and B, color display can be performed by sequentially lighting the light-emitting diodes of R, G, and B in accordance with the time.

The light-emitting diode is suitable for a large-sized display device because the luminance thereof is high. In addition, color reproducibility of the light-emitting diode is superior to that of a cold cathode tube because the color purity of each color of R, G, and B is favorable, and an area required for arrangement can be reduced. Therefore, a narrower frame can be achieved when the light-emitting diode is applied to a small-sized display device.

Further, a light source does not need to be provided as the backlight units as shown in FIGS. 13A to 13D. For example, when a backlight having a light-emitting diode is mounted on a large-sized display device, the light-emitting diode can be arranged on the back side of a substrate. In this case, the light-emitting diodes of each color can be arranged in order at predetermined intervals. Color reproducibility can be enhanced in accordance with the arrangement of the light-emitting diodes.

A display device using such a backlight is provided with a plurality of hexagonal pyramidal projections on its surface, so that a display device can be provided which has a high anti-reflection function capable of further reducing reflection of external light and is excellent in visibility. Accordingly, the present invention makes it possible to manufacture a display device with higher image quality and performance. A backlight having a light-emitting diode is particularly suitable for a large-sized display device, and a high-quality image can be provided even in a dark place by enhancement of the contrast ratio of the large-sized display device.

This embodiment mode can be combined with Embodiment Mode 9 as appropriate.

Embodiment Mode 11

A television device can be completed using a display device formed by the present invention. An example of a television device for achieving low power consumption and high reliability will be described.

Figure 23:
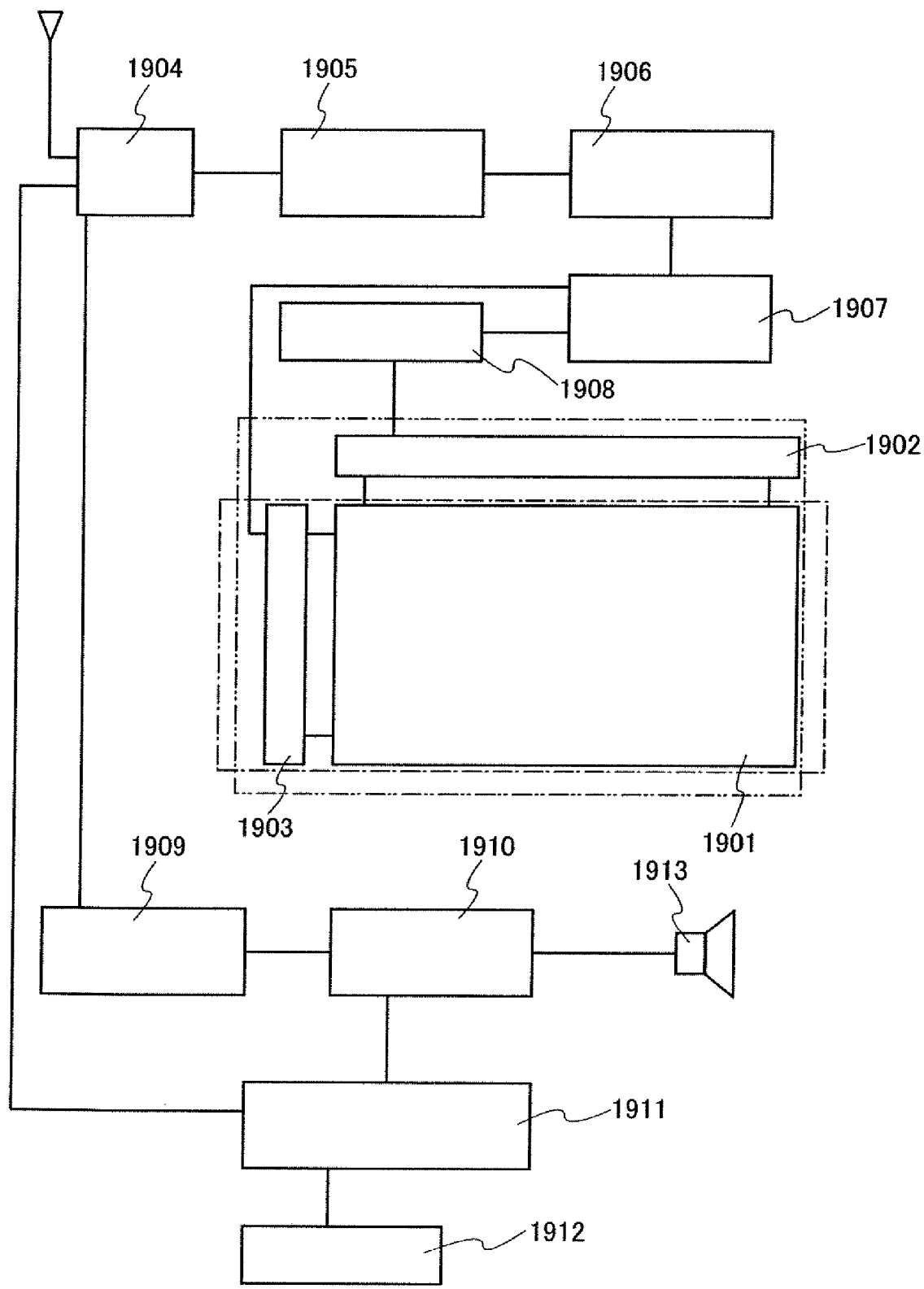
FIG. 23 is a block diagram to illustrate a main configuration of an electronic device to which the present invention is applied.

FIG. 23 is a block diagram showing a main configuration of a television device (a liquid crystal television device or an EL television device). A display panel can have various structures: a structure like FIG. 15A in which TFTs are formed, a pixel region 1901 and a scanning line drive circuit 1903 are formed over the same substrate and a signal line drive circuit 1902 is formed as a driver IC; a structure like FIG. 15B in which the pixel region 1901, the signal line drive circuit 1902, and the scanning line drive circuit 1903 are formed over the same substrate; and the like.

As for the structures of other external circuits, a video signal amplifier circuit 1905 for amplifying video signals among signals received at a tuner 1904, a video signal processing circuit 1906 for converting signals output from the video signal amplifier circuit 1905 into color signals corresponding to red, green, and blue, a control circuit 1907 for converting the video signals so as to be input to the driver ICs, and the like are provided on the input side of the video signals. The control circuit 1907 outputs signals to each of the scanning line side and the signal line side. In the case of digitally driving the display panel, a signal divider circuit 1908 may be provided on the signal line side so that input digital signals can be divided into m number of signals before supplied.

Audio signals among the signals received at the tuner 1904 are transmitted to an audio signal amplifier circuit 1909, and an output thereof is supplied to a speaker 1913 through an audio signal processing circuit 1910. A control circuit 191 receives control data on the receiving station (reception frequency) or sound volume from an input portion 1912, and transmits signals to the tuner 1904 and the audio signal processing circuit 1910.

Figure 20A:
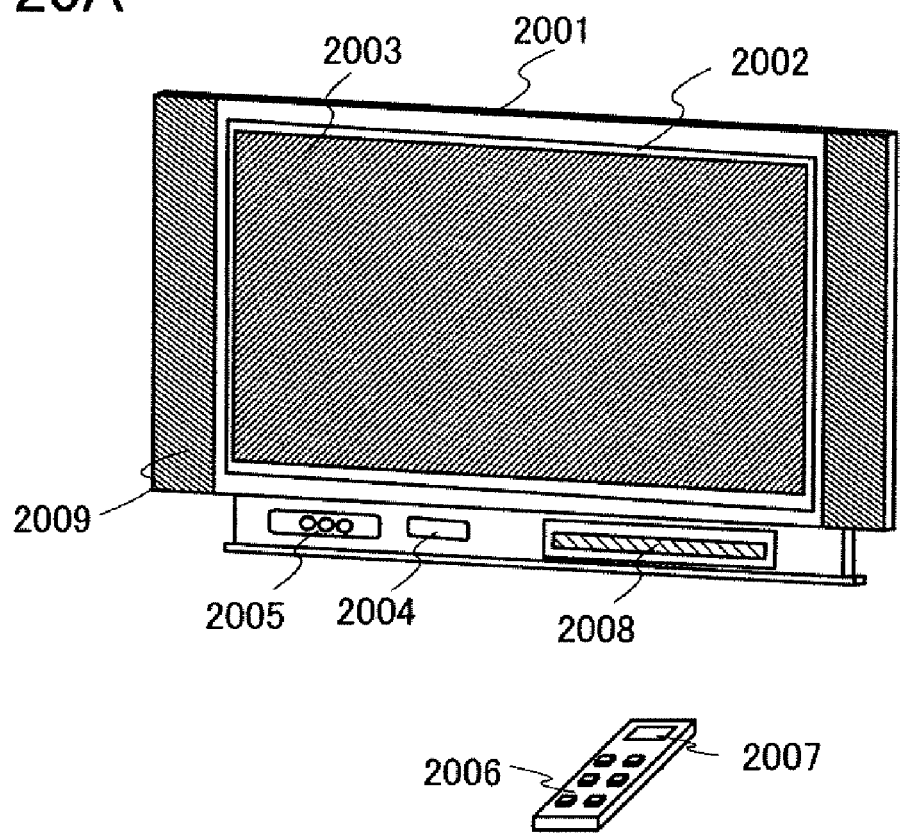
FIGS. 20A and 20B are diagrams to illustrate electronic devices to which the present invention is applied.
Figure 20B:
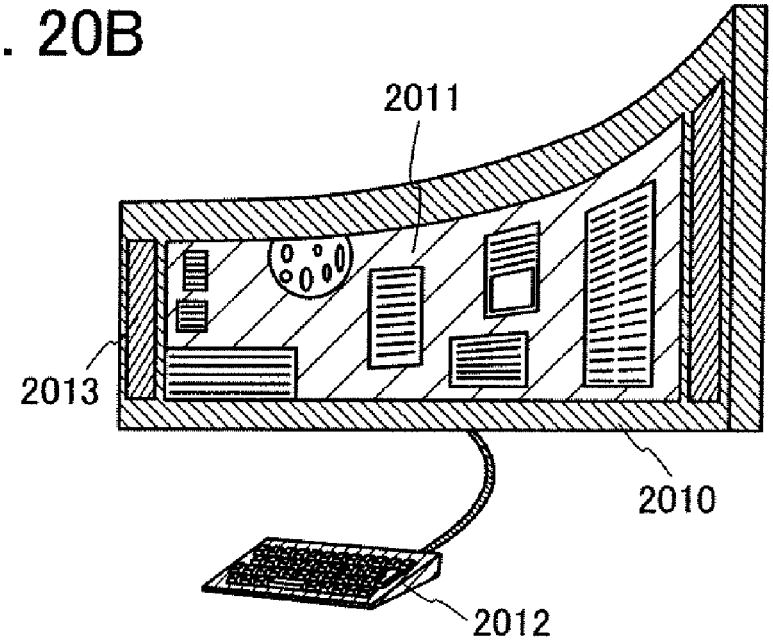

By incorporating a display module into a housing as shown in FIGS. 20A and 20B, a television device can be completed. A display panel in which components up to an FPC are set as shown in FIGS. 1A and 1B is generally called an EL display module. When an EL display module as shown in FIGS. 1A and 1B is used, an EL television device can be completed, and when a liquid crystal display module as shown in FIGS. 9A and 9B is used, a liquid crystal television device can be completed. In FIG. 20A, a display module constitutes a main display screen 2003, and other accessories such as speaker portions 2009 and operation switches are provided. As described above, a television device can be completed according to the present invention.

In addition, reflected light of light entering from outside may be blocked with the use of a retardation plate or a polarizing plate. In a top-emission display device, an insulating layer serving as a partition wall may be colored to be used as a black matrix. This partition wall can also be formed by a droplet discharging method or the like. Carbon black or the like may be mixed into a black resin of a pigment material or a resin material such as polyimide, or a stacked layer thereof may be used. By a droplet discharging method, different materials may be discharged to the same region plural times to form the partition wall. A quarter wave plate or a half wave plate may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in order, and light emitted from the light-emitting element is transmitted therethrough and is emitted to outside from the polarizing plate side. The retardation plate or polarizing plate may be provided on a side to which light is emitted or may be provided on both sides in the case of a dual-emission display device in which light is emitted from the both sides. In addition, an anti-reflective film may be provided on the outer side of the polarizing plate. Accordingly, high-definition and precise images can be displayed.

A display panel 2002 using a display element is incorporated into a housing 2001 as shown in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 that displays information to be output may also be provided for this remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel superior in viewing angle, and the sub-screen 2008 may be formed using a liquid crystal display panel capable of displaying with low power consumption. In order to prioritize low power consumption, a structure in which the main screen 2003 is formed using a liquid crystal display panel, the sub-screen 2008 is formed using an EL display panel, and the sub-screen is able to flash on and off may be employed. By the present invention, such a highly reliable display device which consumes less power can be manufactured even with the use of a large substrate, and many TFTs and electronic components.

FIG. 20B shows a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 20B is formed using a bendable material; therefore, the television device includes the bent display portion. Since the shape of the display portion can be freely set, a television device having a desired shape can be manufactured.

In accordance with the present invention, a highly reliable display device which has a function of displaying high quality images with excellent visibility can be manufactured without a complicated process. Therefore, a high performance and highly reliable television device can be manufactured with high productivity.

The present invention is not limited to the television device and is also applicable to various uses such as a monitor of a personal computer and a display medium with a large area, for example, an information display board at a train station, an airport, or the like, or an advertisement display board on the street.

Embodiment Mode 12

This embodiment mode will be described with reference to FIGS. 21A and 2113. This embodiment mode shows an example of a module using a panel including the display device manufactured in Embodiment Modes 1 to 10. In this embodiment mode, an example of a module including a display device for achieving low power consumption and high reliability will be described.

Figure 21A:
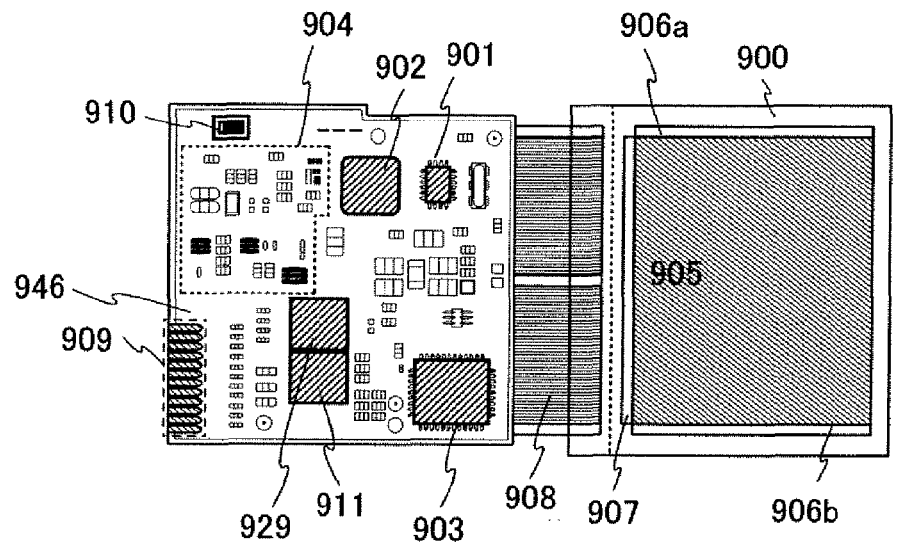
FIGS. 21A and 21B are diagrams to illustrate electronic devices to which the present invention is applied.

A module of an information terminal shown in FIG. 21A includes a printed wiring board 946 on which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scanning line drive circuit 906a and a second scanning line drive circuit 906b which select a pixel included in the pixel region 905, and a signal line drive circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power source circuit 903 may be directly mounted on the panel 900 by a COG (chip on glass) method. Moreover, various elements such as a capacitor and a buffer provided over the printed wiring board 946 prevent a noise in power source voltage or a signal and a rounded rise of a signal.

FIG. 21 is a block diagram of the module shown in FIG. 21A. A module 999 includes a VRAM 932, a DRAM 925, a flash memory 926, and the like as the memory 911. The VRAM 932 stores image data to be displayed on the panel, the DRAM 925 stores image data or audio data, and the flash memory stores various programs.

The power source circuit 903 generates power source voltage applied to the panel 900, the controller 901, the CPU 902, the audio processing circuit 929, the memory 911, and the transmission/reception circuit 904. Moreover, depending on the specifications of the panel, a current source is provided in the power source circuit 903 in some cases.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are input to the arithmetic circuit 923, the decoder 921, and the like after once being held in the register 922. The arithmetic circuit 923 operates based on the input signal and specifies an address to which various instructions are sent. On the other hand, the signal input to the decoder 921 is decoded and input to the control signal generating circuit 920. The control signal generating circuit 920 generates a signal including various instructions based on the input signal and sends it to the address specified by the arithmetic circuit 923, specifically, the memory 911, the transmission/reception circuit 904, the audio processing circuit 929, the controller 901, and the like.

The memory 911, the transmission/reception circuit 904, the audio processing circuit 929, and the controller 901 operate in accordance with respective received instructions. The operations will be briefly explained below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, alternating voltage (AC Cont), and a switching signal L/R and supplies them to the panel 900 based on the power source voltage input from the power source circuit 903 and various signals input from the CPU 902.

In the transmission/reception circuit 904, a signal transmitted and received as an electric wave at the antenna 933 is processed. Specifically, high frequency circuits such as an isolator, a band path filter, a VCO (voltage controlled oscillator), an LPF (low pass filter), coupler, and balan are included. Among the signals transmitted and received at the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode is applicable to any circuit other than high frequency circuits such as an isolator, a band path filter, a VCO (voltage controlled oscillator), an LPF (low pass filter), coupler, and balan.

Embodiment Mode 13

Figure 21B:
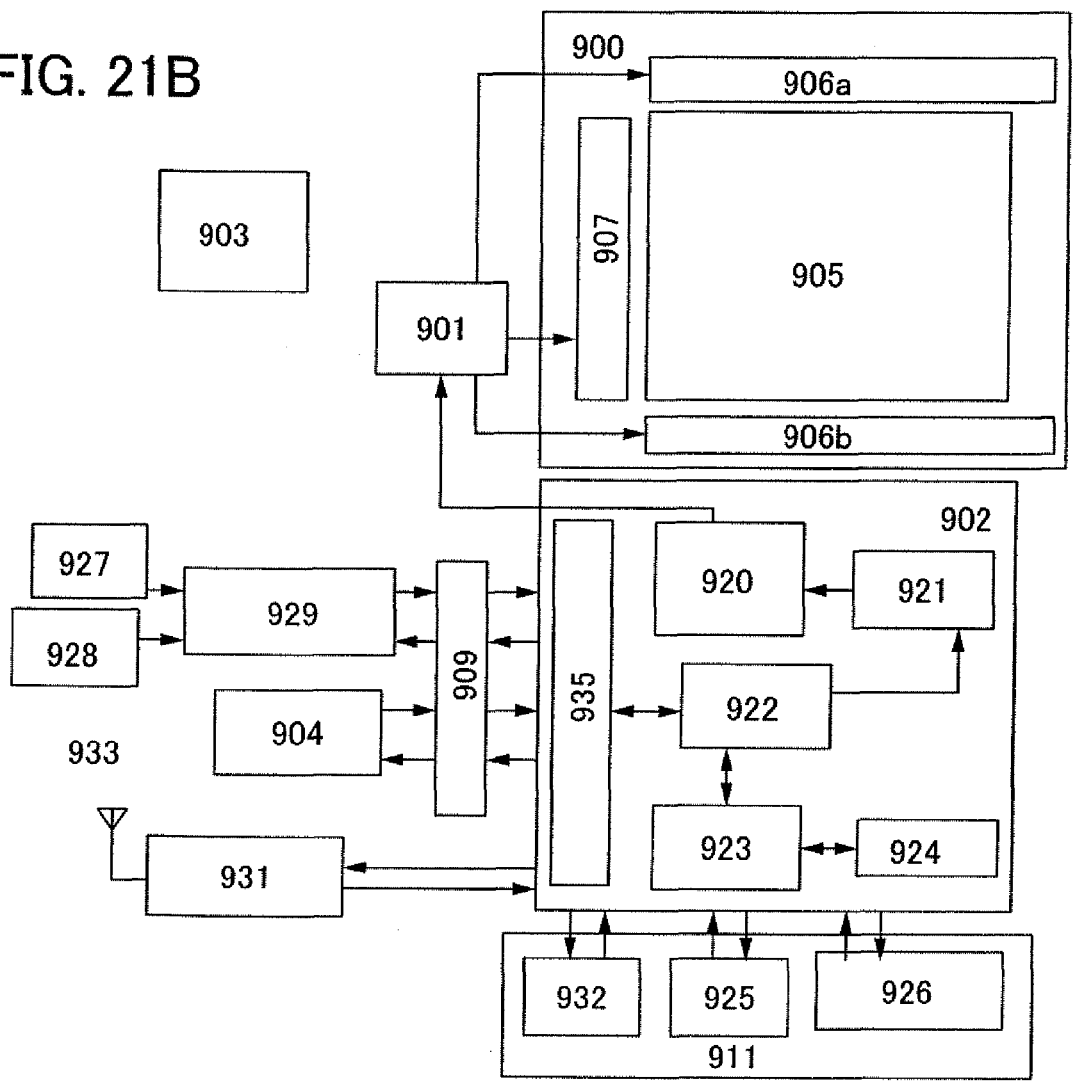
Figure 22:
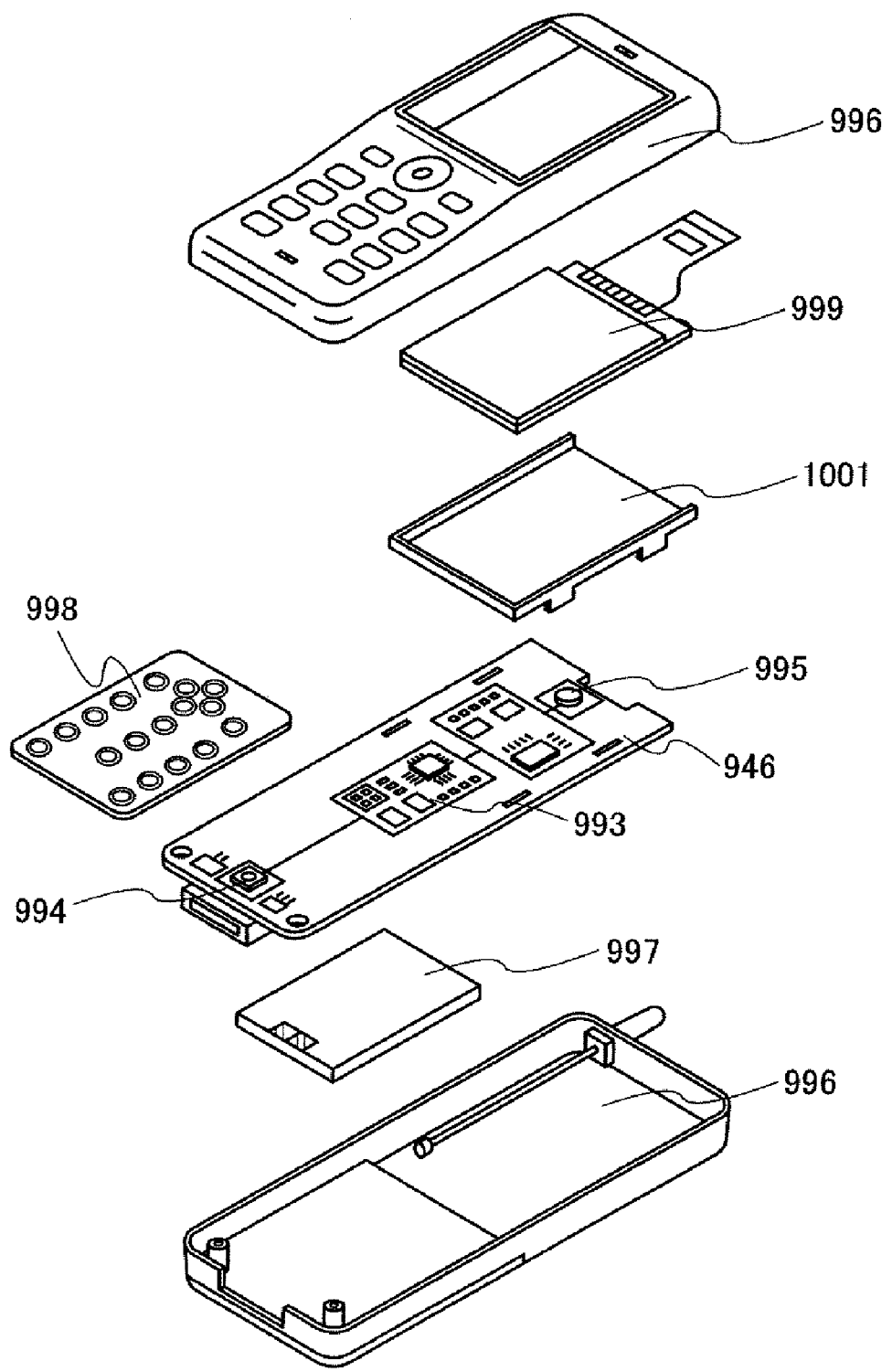
FIG. 22 is a diagram to illustrate an electronic device to which the present invention is applied.

This embodiment mode will be described with reference to FIGS. 21A and 21B and 22. FIG. 22 shows one mode of a compact phone (mobile phone) including the module manufactured in Embodiment Mode 12, which operates wirelessly and is portable. The panel 900 is detachably incorporated into a housing 1001 so as to be easily combined with the module 999. The shape and the size of the housing 1001 can be appropriately changed in accordance with an electronic device into which the module is incorporated.

The housing 1001 in which the panel 900 is fixed is fitted to the printed wiring board 946 and set up as a module. A controller, a CPU, a memory, a power source circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through the FPC 908.

The module 999, an input unit 998, and a battery 997 are stored in a housing 996. The pixel region of the panel 900 is arranged so that it can be seen through a window formed in the housing 996.

The housing 996 shown in FIG. 22 is an example of an exterior shape of a telephone. However, an electronic device of this embodiment mode can be changed into various modes in accordance with functions and intended purpose. In the following embodiment mode, examples of the modes will be explained.

Embodiment Mode 14

By applying the present invention, various display devices can be manufactured. In other words, the present invention is applicable to various electronic devices in which these display devices are incorporated into display portions. In this embodiment mode, examples of electronic devices including a display device for achieving low power consumption and high reliability will be described.

As electronic devices of the present invention, television devices (also referred to simply as televisions or television receivers), cameras such as digital cameras or digital video cameras, mobile phone sets (also referred to simply as mobile phones or cell-phones), portable information terminals such as PDAs, portable game machines, monitors for computers, computers, audio reproducing devices such as car audio systems, image reproducing devices provided with a recording medium such as home game machines (typically, a digital versatile disc (DVD)), and the like can be given. Specific examples thereof will be explained with reference to FIGS. 19A to 19E.

Figure 19A:
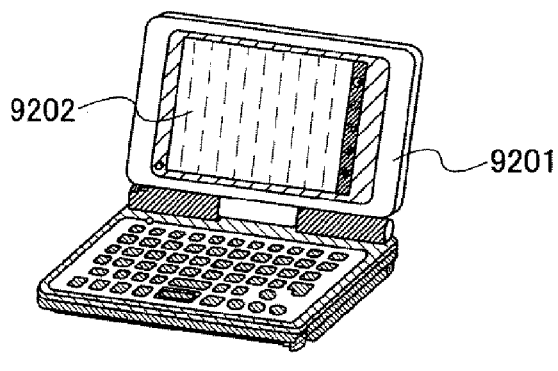
FIGS. 19A to 19E are diagrams to illustrate electronic devices to which the present invention is applied.

A portable information terminal shown in FIG. 19A includes a main body 9201, a display portion 9202, and the like. The display device of the present invention is applicable to the display portion 9202. Accordingly, a highly reliable portable information terminal which consumes less power can be provided.

Figure 19B:
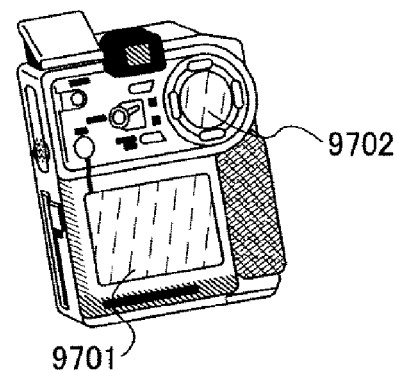

A digital video camera shown in FIG. 19B includes display portions 9701 and 9702, and the like. The display device of the present invention is applicable to the display portion 9701. Accordingly, a highly reliable digital video camera which consumes less power can be provided.

Figure 19C:
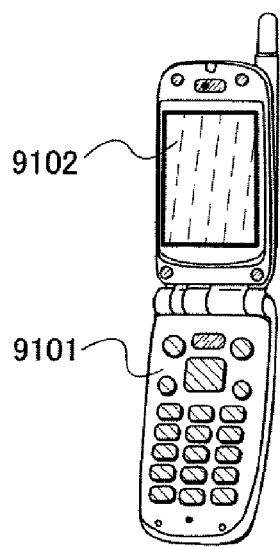

A mobile phone shown in FIG. 19C includes a main body 9101, a display portion 9102, and the like. The display device of the present invention is applicable to the display portion 9102. Accordingly, a highly reliable mobile phone which consumes less power can be provided.

Figure 19D:
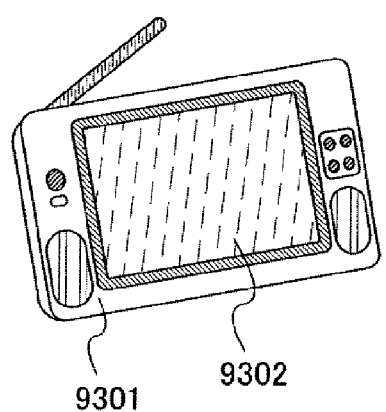

A portable television device shown in FIG. 19D includes a main body 9301, a display portion 9302, and the like. The display device of the present invention is applicable to the display portion 9302. Accordingly, a highly reliable portable television device which consumes less power can be provided. The display device of the present invention is applicable to various types of television devices including a small-sized television incorporated in a portable terminal such as a mobile phone set, a medium-sized television that is portable, and a large-sized television (e.g., 40 inches or more in size).

Figure 19E:
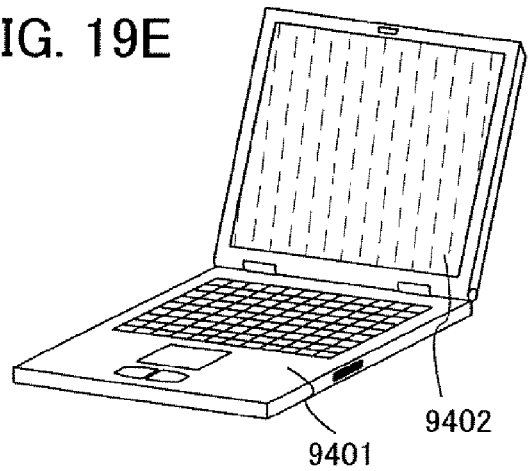

A portable computer shown in FIG. 19E includes a main body 9401, a display portion 9402, and the like. The display device of the present invention is applicable to the display portion 9402. Accordingly, a highly reliable portable computer which consumes less power can be provided.

In this manner, by using the display device of the present invention, highly reliable electronic devices which consume less power can be provided.

This application is based on Japanese Patent Application serial No. 2007-019344 filed with Japan Patent Office on Jan. 30, 2007, the entire contents of which are hereby incorporated by reference.

What is claimed is:

1. A display device comprising:
   a pixel region and a drive circuit region over a substrate having an insulating surface;
   a first thin film transistor comprising a first gate electrode layer, a first semiconductor layer comprising a first source region, a first drain region, and a first channel formation region, and a first gate insulating layer in the pixel region; and
   a second thin film transistor comprising a second gate electrode layer, a second semiconductor layer comprising a second source region, a second drain region, and a second channel formation region having a smaller thickness than that of the first channel formation region, and a second gate insulating layer in the drive circuit region,
   wherein the second channel formation region has a smaller thickness than thicknesses of the second source region and the second drain region which are respectively in contact with a source electrode and a drain electrode.

2. A display device according to claim 1, wherein insulating layers with a sidewall structure are provided for side surfaces of the first and second gate electrode layers.

3. A display device according to claim 1, wherein silicide is provided for surfaces of the first and second source regions and first and second drain regions.

4. A display device according to claim 1, wherein insulating layers with a sidewall structure are provided for side surfaces of the first and second semiconductor layers.

5. A display device according to claim 1, wherein the first semiconductor layer comprises the first source region, the first drain region, and an impurity region containing an impurity element imparting one conductivity type at a lower concentration than the first source region and the first drain region.

6. A display device according to claim 1,
   wherein a display element is provided in the pixel region; and
   wherein the first thin film transistor is electrically connected to the display element.

7. A display device according to claim 6, wherein the display element is a liquid crystal display element.

8. A display device according to claim 6, wherein the display element is a light-emitting element.

9. A display device according to claim 1, wherein the thickness of the second channel formation region is 5 to 30 nm, inclusive.

10. A display device according to claim 1, wherein the thicknesses of the second source region and the second drain region which are respectively in contact with the source electrode and the drain electrode are 25 to 100 nm, inclusive.

11. A display device comprising:
    a pixel region and a drive circuit region over a substrate having an insulating surface;

a first thin film transistor comprising a first gate electrode layer, a first semiconductor layer comprising a first source region, a first drain region, and a first channel formation region, and a first gate insulating layer in the pixel region; and a second thin film transistor comprising a second gate electrode layer, a second semiconductor layer comprising a second source region, a second drain region, and a second channel formation region having a smaller thickness than that of the first channel formation region, and a second gate insulating layer in the drive circuit region;

wherein the second channel formation region is a region which is locally thin in the second semiconductor layer.

12. A display device according to claim 11, wherein insulating layers with a sidewall structure are provided for side surfaces of the first and second semiconductor layers.

13. A display device according to claim 11, wherein silicide is provided for surfaces of the first and second source regions and first and second drain regions.

14. A display device according to claim 11, wherein insulating layers with a sidewall structure are provided for side surfaces of the first and second semiconductor layers.

15. A display device according to claim 11, wherein the first semiconductor layer comprises the first source region, the first drain region, and an impurity region containing an impurity element imparting one conductivity type at a lower concentration than the first source region and the first drain region.

16. A display device according to claim 11,
wherein a display element is provided in the pixel region; and
wherein the first thin film transistor is electrically connected to the display element.

17. A display device according to claim 16, wherein the display element is a liquid crystal display element.

18. A display device according to claim 16, wherein the display element is a light-emitting element.

19. A display device according to claim 11, wherein the thickness of the second channel formation region is 5 to 30 nm, inclusive.

20. A display device according to claim 11, wherein the thicknesses of the second source region and the second drain region which are respectively in contact with the source electrode and the drain electrode are 25 to 100 nm, inclusive.

21. A display device comprising:
a pixel region and a drive circuit region over a substrate having an insulating surface;
a first thin film transistor comprising a first gate electrode layer, a first semiconductor layer comprising a first source region, a first drain region, and a first channel formation region, and a first gate insulating layer in the pixel region; and
a second thin film transistor comprising a second gate electrode layer, a second semiconductor layer comprising a second source region, a second drain region, and a second channel formation region having a smaller thickness than that of the first channel formation region, and a second gate insulating layer having a smaller thickness than that of the first gate insulating layer in the drive circuit region,
wherein the second channel formation region has a smaller thickness than thicknesses of the second source region and the second drain region which are respectively in contact with a source electrode and a drain electrode.

22. A display device according to claim 21, wherein insulating layers with a sidewall structure are provided for side surfaces of the first and second gate electrode layers.

23. A display device according to claim 21, wherein silicide is provided for surfaces of the first and second source regions and first and second drain regions.

24. A display device according to claim 21, wherein insulating layers with a sidewall structure are provided for side surfaces of the first and second semiconductor layers.

25. A display device according to claim 21, wherein the first semiconductor layer comprises the first source region, the first drain region, and an impurity region containing an impurity element imparting one conductivity type at a lower concentration than the first source region and the first drain region.

26. A display device according to claim 21,
wherein a display element is provided in the pixel region; and
wherein the first thin film transistor is electrically connected to the display element.

27. A display device according to claim 26, wherein the display element is a liquid crystal display element.

28. A display device according to claim 26, wherein the display element is a light-emitting element.

29. A display device according to claim 21, wherein the thickness of the second channel formation region is 5 to 30 nm, inclusive.

30. A display device according to claim 21, wherein the thicknesses of the second source region and the second drain region which are respectively in contact with the source electrode and the drain electrode are 25 to 100 nm, inclusive.

31. A display device comprising:
a pixel region and a drive circuit region over a substrate having an insulating surface;
a first thin film transistor comprising a first gate electrode layer, a first semiconductor layer comprising a first source region, a first drain region, and a first channel formation region, and a first gate insulating layer in the pixel region; and
a second thin film transistor comprising a second gate electrode layer, a second semiconductor layer comprising a second source region, a second drain region, and a second channel formation region having a smaller thickness than that of the first channel formation region, and a second gate insulating layer having a smaller thickness than that of the first gate insulating layer in the drive circuit region;
wherein the second channel formation region is a region which is locally thin in the second semiconductor layer.

32. A display device according to claim 31, wherein insulating layers with a sidewall structure are provided for side surfaces of the first and second gate electrode layers.

33. A display device according to claim 31, wherein silicide is provided for surfaces of the first and second source regions and first and second drain regions.

34. A display device according to claim 31, wherein insulating layers with a sidewall structure are provided for side surfaces of the first and second semiconductor layers.

35. A display device according to claim 31, wherein the first semiconductor layer comprises the first source region, the first drain region, and an impurity region containing an impurity element imparting one conductivity type at a lower concentration than the first source region and the first drain region.

36. A display device according to claim 31,
wherein a display element is provided in the pixel region; and
wherein the first thin film transistor is electrically connected to the display element.

37. A display device according to claim 36, wherein the display element is a liquid crystal display element.

38. A display device according to claim 36, wherein the display element is a light-emitting element.

39. A display device according to claim 31, wherein the thickness of the second channel formation region is 5 to 30 nm, inclusive.

40. A display device according to claim 31, wherein the thicknesses of the second source region and the second drain region which are respectively in contact with the source electrode and the drain electrode are 25 to 100 nm, inclusive.

* * * * *

UNITED STATES PATENT AND TRADEMARK OFFICE
CERTIFICATE OF CORRECTION

PATENT NO. : 7,947,981 B2
APPLICATION NO. : 12/013796
DATED : May 24, 2011
INVENTOR(S) : Shunpei Yamazaki et al It is certified that error appears in the above-identified patent and that said Letters Patent is hereby corrected as shown below:

Column 1, line 58, "mm" should read --nm--.

Column 6, line 24, "5A" should read --8A--.

Column 34, lines 62, "767*h*" should read --767*b*--.

Column 35, line 62, "767*h*" should read --767*b*--.

Column 36, line 10, "797*h*" should read --797*b*--.

Column 44, lines, 28-29, "V-carbazolyl" should read --N-carbazolyl--.

Column 46, line 15, "joulolidin" should read --julolidin--.

Column 51, line 26, "Th" should read --Tb--.

Column 64, line 54, "608*h*" should read --608*b*--.

Column 69, line 56, "191" should read --1911--.

Column 71, line 54, "21" should read --21B--.

Claim 12, line 3 (column 75, line 16), "semiconductor" should read --gate electrode--.

Signed and Sealed this
Fifteenth Day of November, 2011

David J. Kappos
*Director of the United States Patent and Trademark Office*